United States Patent
Kim et al.

(10) Patent No.: US 11,925,110 B2
(45) Date of Patent: Mar. 5, 2024

(54) POLYCYCLIC AROMATIC COMPOUND AND ORGANOELECTROLUMINESCENT DEVICE USING THE SAME

(71) Applicant: SFC CO., LTD., Cheongju-si (KR)

(72) Inventors: Kyeong-hyeon Kim, Cheongju-si (KR); Se-jin Lee, Cheongju-si (KR); Yeong-tae Choi, Cheongju-si (KR); Ji-yung Kim, Cheongju-si (KR); Kyung-tae Kim, Cheongju-si (KR); Myeong-jun Kim, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 554 days.

(21) Appl. No.: 17/206,270

(22) Filed: Mar. 19, 2021

(65) Prior Publication Data
US 2021/0305514 A1  Sep. 30, 2021

(30) Foreign Application Priority Data

Mar. 19, 2020  (KR) .................. 10-2020-0033903

(51) Int. Cl.
| | | |
|---|---|---|
| H01L 51/00 | (2006.01) | |
| C07F 5/02 | (2006.01) | |
| C09K 11/06 | (2006.01) | |
| H10K 85/60 | (2023.01) | |
| H10K 50/11 | (2023.01) | |
| H10K 50/15 | (2023.01) | |
| H10K 50/16 | (2023.01) | |
| H10K 50/17 | (2023.01) | |
| H10K 50/18 | (2023.01) | |

(52) U.S. Cl.
CPC .......... *H10K 85/636* (2023.02); *C07F 5/027* (2013.01); *C09K 11/06* (2013.01); *H10K 85/615* (2023.02); *C09K 2211/1007* (2013.01); *C09K 2211/1018* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 85/6572* (2023.02); *H10K 85/6574* (2023.02)

(58) Field of Classification Search
None
See application file for complete search history.

(56) References Cited

FOREIGN PATENT DOCUMENTS

WO  WO-2019240464 A1 * 12/2019 .......... H01L 51/0071

* cited by examiner

*Primary Examiner* — Robert S Loewe
(74) *Attorney, Agent, or Firm* — NSIP Law

(57) ABSTRACT

Disclosed is a polycyclic aromatic compound that can be employed in an organic layer of an organic electroluminescent device. Also disclosed is a highly efficient organic electroluminescent device including the polycyclic aromatic compound. The use of the polycyclic aromatic compound significantly improves the luminous efficiency of the device.

13 Claims, No Drawings

POLYCYCLIC AROMATIC COMPOUND AND ORGANOELECTROLUMINESCENT DEVICE USING THE SAME

CROSS REFERENCE TO RELATED APPLICATIONS

This application claims the benefit under 35 U.S.C. § 119(a) of Korean Patent Application No. 10-2020-0033903 filed on Mar. 19, 2020 in the Korean Intellectual Property Office, the entire disclosure of which is incorporated herein by reference for all purposes.

BACKGROUND OF THE INVENTION

1. Field of the Invention

The present invention relates to a polycyclic aromatic compound and a highly efficient organic electroluminescent device with significantly improved luminous efficiency using the polycyclic aromatic compound.

2. Description of the Related Art

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized structures of organic layers for organic electroluminescent devices and stable and efficient materials for organic layers of organic electroluminescent devices.

Thus, there is a continued need to develop structures of organic electroluminescent devices optimized to improve their luminescent properties and new materials capable of supporting the optimized structures of organic electroluminescent devices.

SUMMARY OF THE INVENTION

The present invention intends to provide an organic electroluminescent compound that is employed as a material for an organic layer of an organic electroluminescent device, achieving high efficiency of the device, and an organic electroluminescent device including the organic electroluminescent compound.

One aspect of the present invention provides an organic electroluminescent compound represented by Formula A:

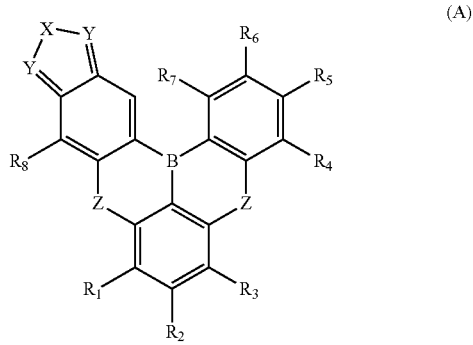

(A)

A detailed description will be given concerning the structure of the compound represented by Formula A and the definitions of X, Y, Z, and $R_1$ to $R_8$ in the compound.

A detailed description will also be given concerning exemplary polycyclic aromatic compounds that can be represented by Formula A.

A further aspect of the present invention provides an organic electroluminescent device including a first electrode, a second electrode opposite to the first electrode, and one or more organic layers interposed between the first and second electrodes wherein one of the organic layers includes one or more polycyclic aromatic compounds that can be represented by Formula A.

The polycyclic aromatic compound of the present invention can be employed as a material for an organic layer of an organic electroluminescent device, achieving high efficiency of the device.

DETAILED DESCRIPTION OF THE INVENTION

The present invention will now be described in more detail.

The present invention is directed to a polycyclic aromatic compound represented by Formula A:

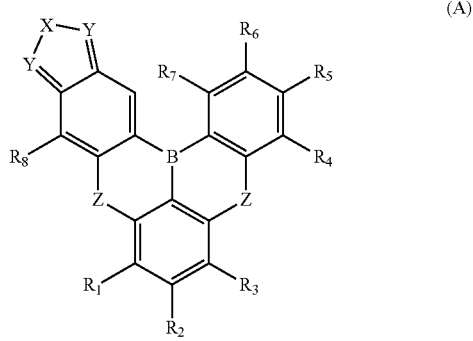

(A)

wherein X is O, S or $NR_9$, each Y is $CR_{10}$ or N, each Z is independently $CR_{11}R_{12}$, $NR_{13}$, O or S, $R_1$ to $R_{13}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylsilyl, substituted or unsubstituted $C_6$-$C_{30}$ arylsilyl, nitro, cyano, halogen, and —$N(R_{14})(R_{15})$, with the proviso that $R_1$ to $R_{13}$ are each independently optionally bonded to $R_1$ and $R_8$ or $R_3$ and $R_4$ to form an alicyclic or aromatic monocyclic or polycyclic ring and that $R_{11}$ and $R_{12}$ are optionally linked to each other to form an alicyclic or aromatic monocyclic or polycyclic ring, and $R_{14}$ and $R_{15}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, and substituted or unsubstituted $C_2$-$C_{50}$ heteroaryl, with the proviso that $R_{14}$ and $R_{15}$ are optionally linked to each other to form an alicyclic or aromatic monocyclic or polycyclic ring.

The presence of boron (B) in the structure of the polycyclic aromatic compound ensures high efficiency of an organic electroluminescent device including the polycyclic aromatic compound.

According to one embodiment of the present invention, Z may be $NR_{13}$.

According to one embodiment of the present invention, at least one of $R_1$ to $R_8$ may be —$N(R_{14})(R_{15})$ represented by Structure A:

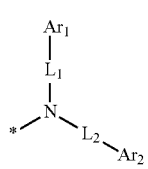

(Structure A)

wherein $L_1$ and $L_2$ are identical to or different from each other and are each independently a single bond or substituted or unsubstituted $C_6$-$C_{18}$ arylene and $Ar_1$ and $Ar_2$ are identical to or different from each other and are each independently selected from substituted or unsubstituted $C_1$-$C_{15}$ alkyl, substituted or unsubstituted $C_6$-$C_{18}$ aryl, substituted or unsubstituted $C_3$-$C_{15}$ cycloalkyl, and substituted or unsubstituted $C_2$-$C_{18}$ heteroaryl, with the proviso that $Ar_1$ and $Ar_2$ are optionally linked to each other to form an alicyclic or aromatic monocyclic or polycyclic ring.

According to one embodiment of the present invention, at least one of $R_1$ to $R_8$ may be substituted or unsubstituted $C_1$-$C_{30}$ alkyl or substituted or unsubstituted $C_3$-$C_{30}$ cycloalkyl.

As used herein, the term "substituted" in the definition of X, Y, Z, and $R_1$ to $R_{13}$ in Formula A indicates substitution with one or more substituents selected from the group consisting of deuterium, cyano, halogen, hydroxyl, nitro, $C_1$-$C_{24}$ alkyl, $C_1$-$C_{24}$ haloalkyl, $C_2$-$C_{24}$ alkenyl, $C_2$-$C_{24}$ alkynyl, $C_1$-$C_{24}$ heteroalkyl, $C_3$-$C_{24}$ cycloalkyl, $C_6$-$C_{24}$ aryl, $C_7$-$C_{24}$ arylalkyl, $C_7$-$C_{24}$ alkylaryl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_6$-$C_{24}$ arylamino, $C_1$-$C_{24}$ heteroarylamino, $C_1$-$C_{24}$ alkylsilyl, $C_6$-$C_{24}$ arylsilyl, and $C_6$-$C_{24}$ aryloxy. The term "unsubstituted" in the same definition indicates having no substituent.

In the "substituted or unsubstituted $C_1$-$C_{10}$ alkyl", "substituted or unsubstituted $C_6$-$C_{30}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent is bonded to an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

In the present invention, the alkyl groups may be straight or branched. The number of carbon atoms in the alkyl groups is not particularly limited but is preferably from 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphthacenyl, triphenylene, and fluoranthene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The alkoxy group may be specifically a methoxy, ethoxy, propoxy, isobutyloxy, sec-butyloxy, pentyloxy, iso-amyloxy or hexyloxy group, but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —NH$_2$, alkylamine groups, and arylamine groups. The arylamine groups are aryl-substituted amine groups and the alkylamine groups are alkyl-substituted amine groups. Examples of the arylamine groups include substituted or unsubstituted monoarylamine groups, substituted or unsubstituted diarylamine groups, and substituted or unsubstituted triarylamine groups.

The aryl groups in the arylamine groups may be monocyclic or polycyclic ones. The arylamine groups may include two or more aryl groups. In this case, the aryl groups may be monocyclic aryl groups or polycyclic aryl groups. Alternatively, the aryl groups may consist of a monocyclic aryl group and a polycyclic aryl group. The aryl groups in the arylamine groups may be selected from those exemplified above.

The aryl groups in the aryloxy group and the arylthioxy group are the same as those described above. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

More specifically, the polycyclic aromatic compound represented by Formula A can be selected from the following compounds:

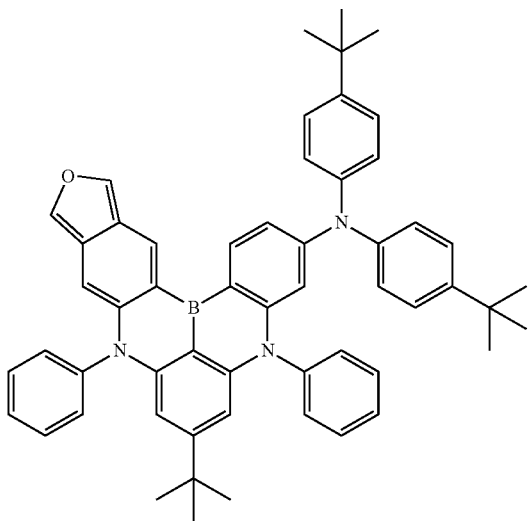

1

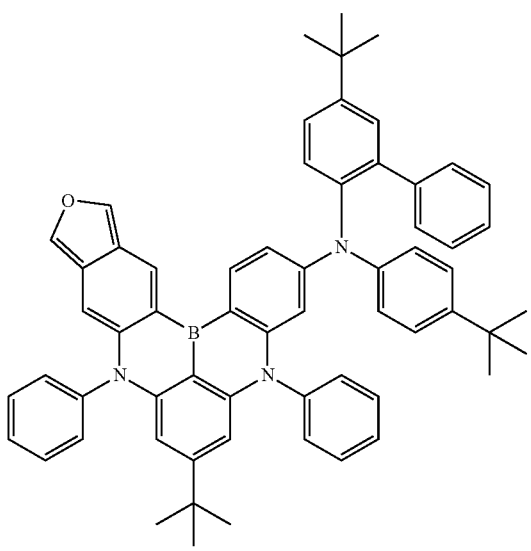

2

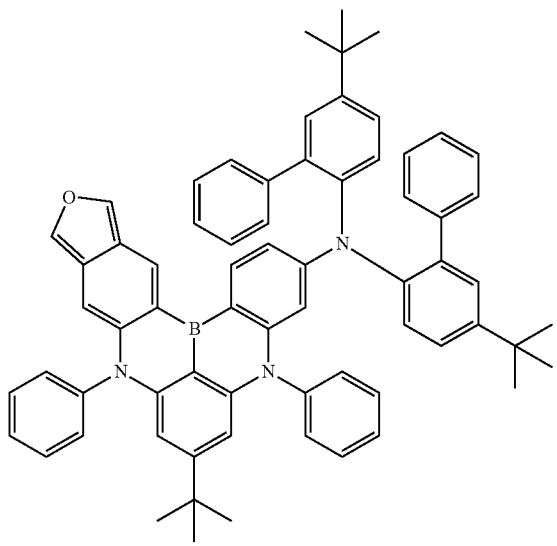

3

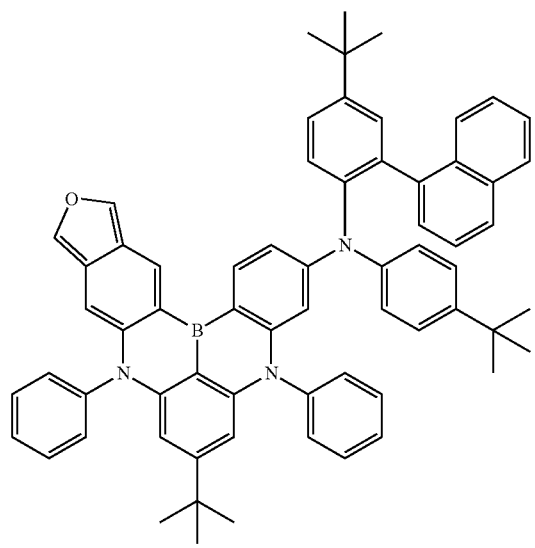
4
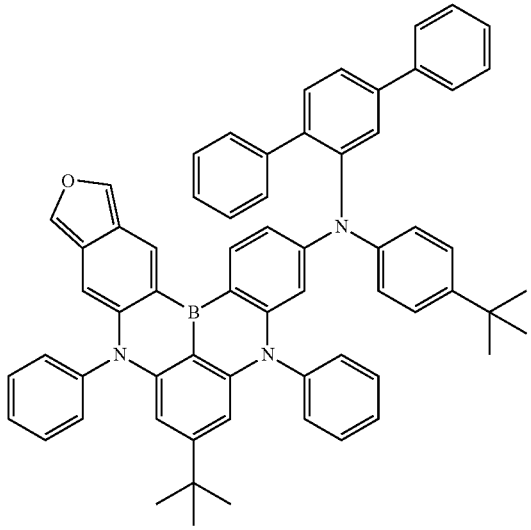
5
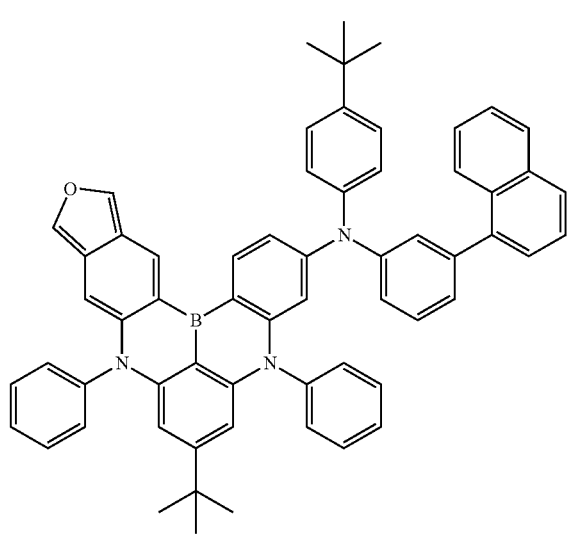
5
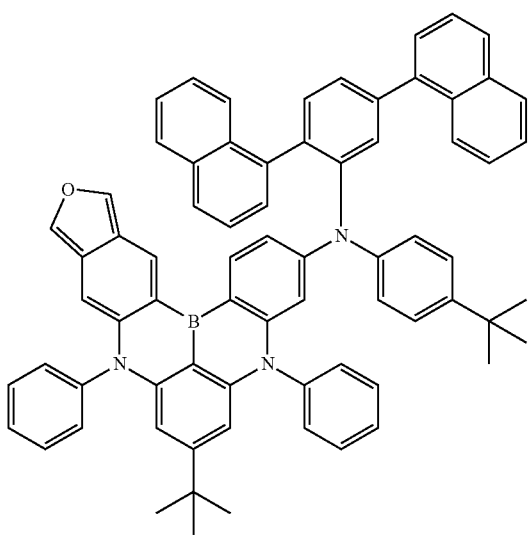
8
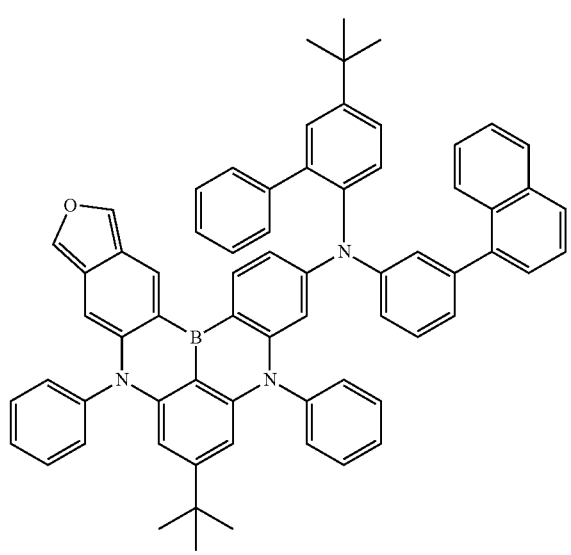
6
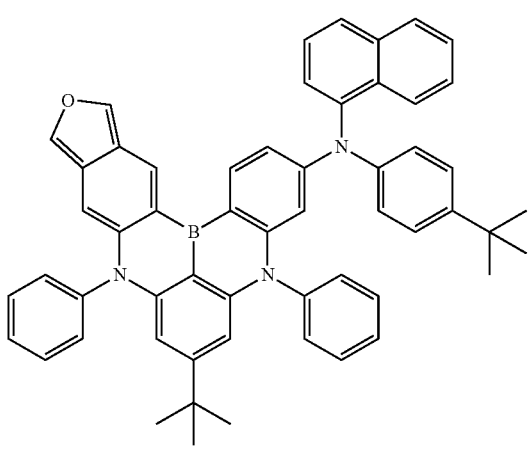
9

10
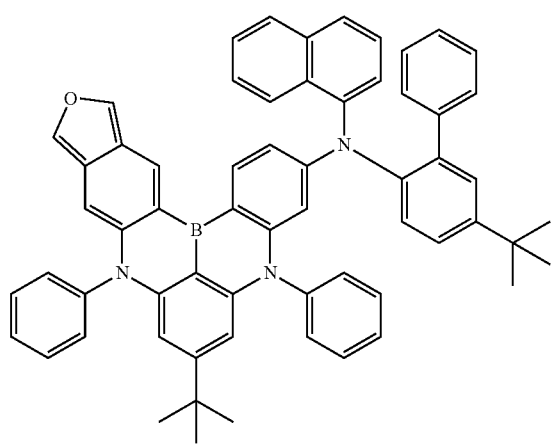
11
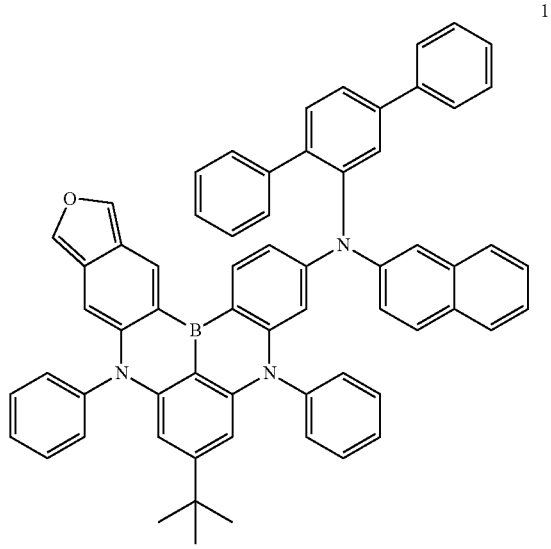
13
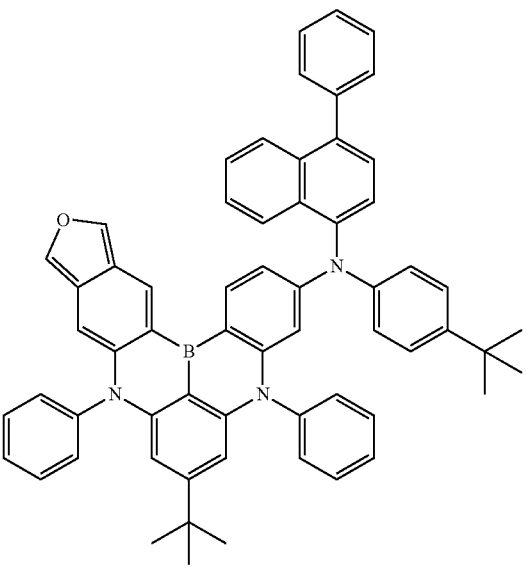
12
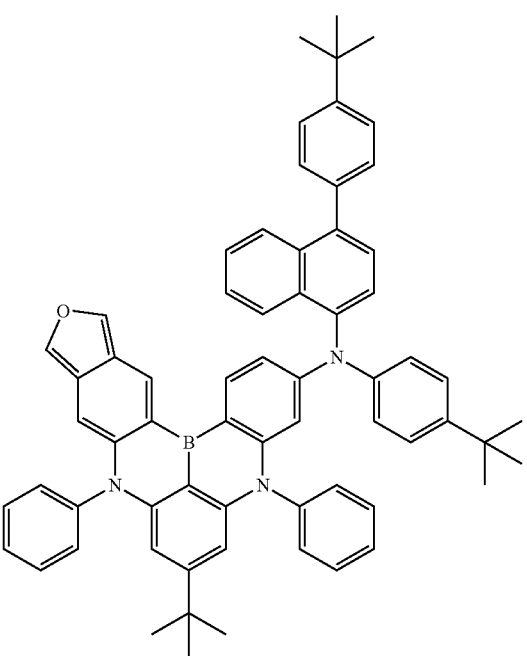
14

15
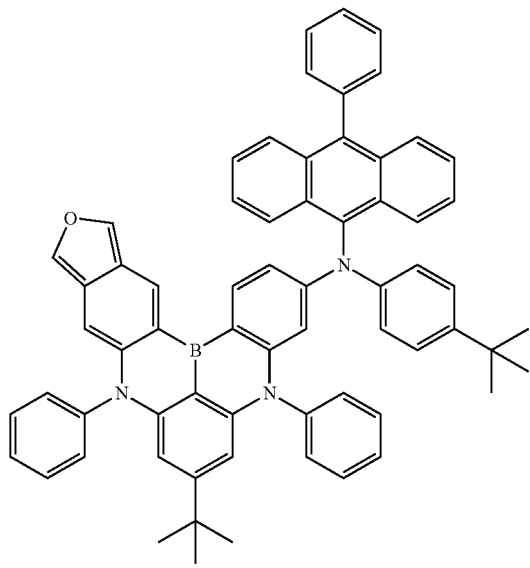
16
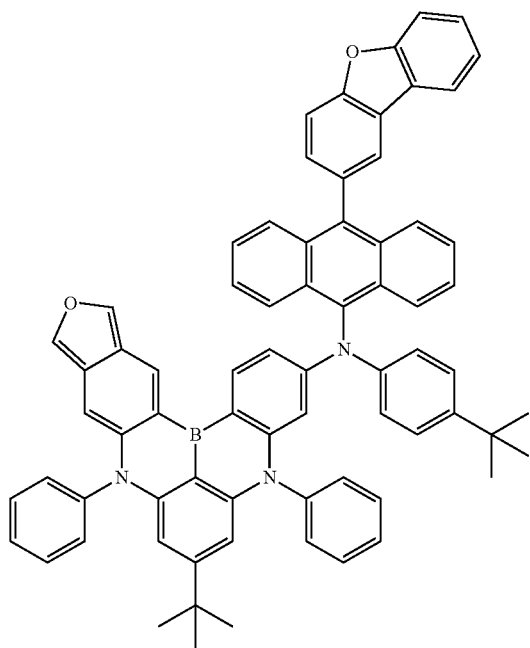
17
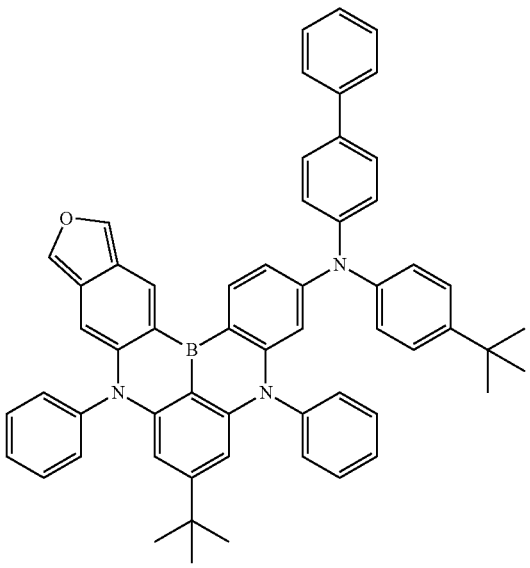
18
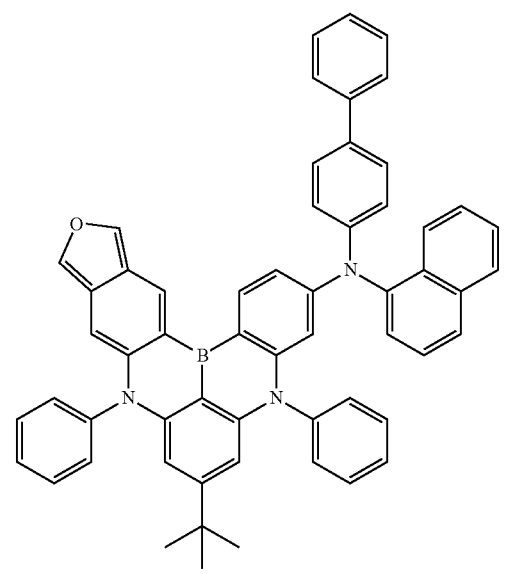

19
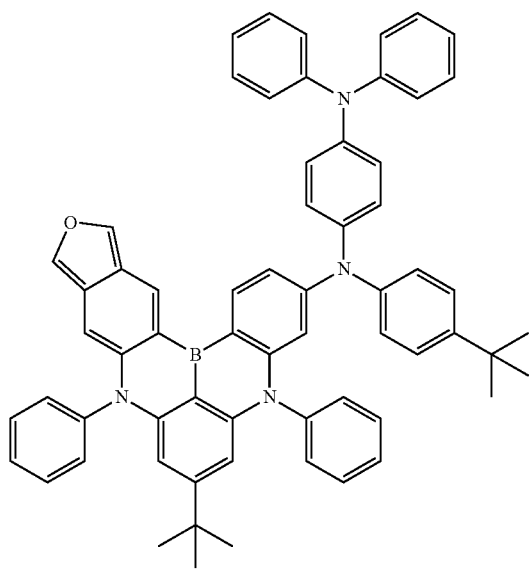
21
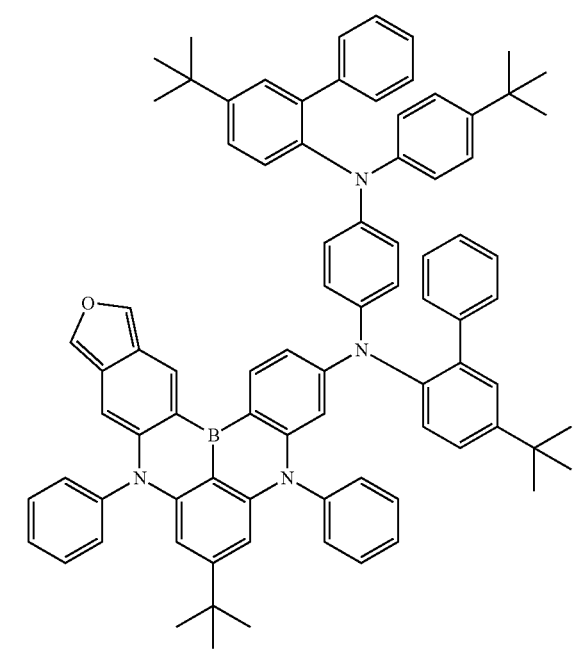
20
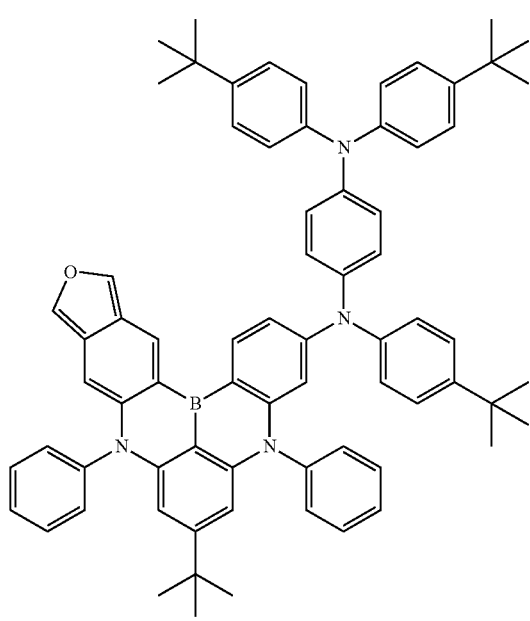
22
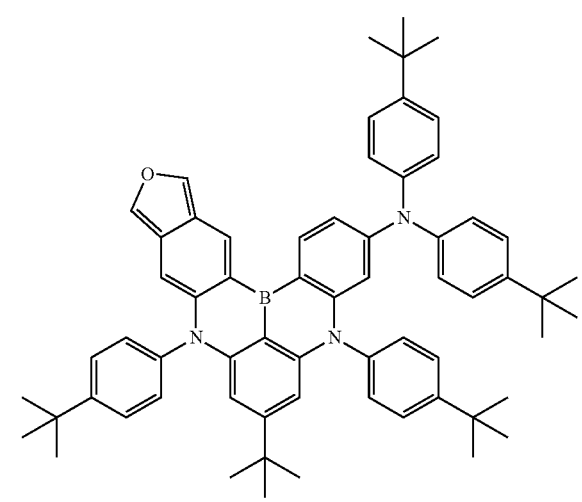

23
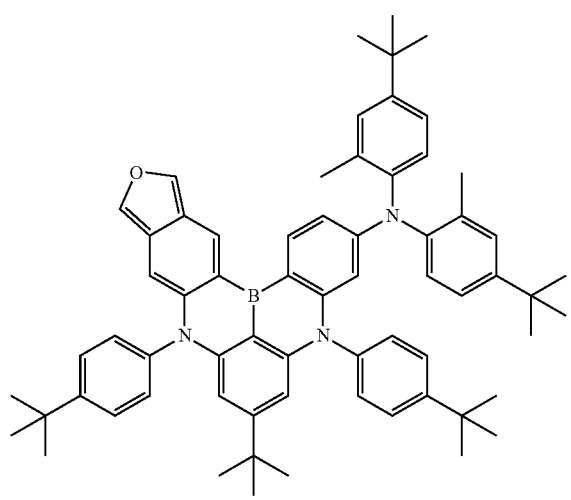
26
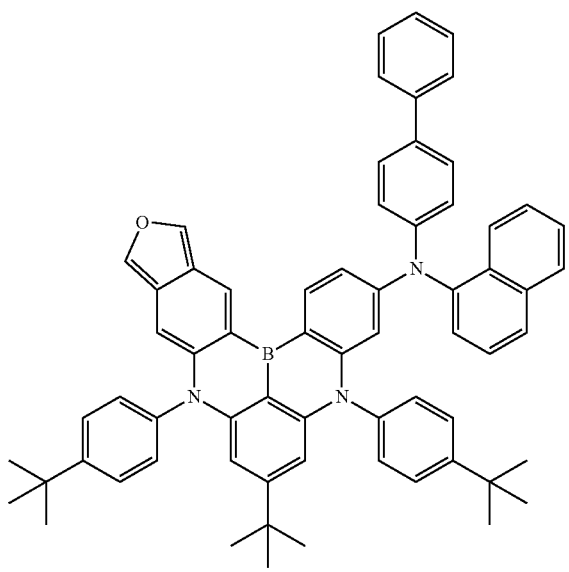
24
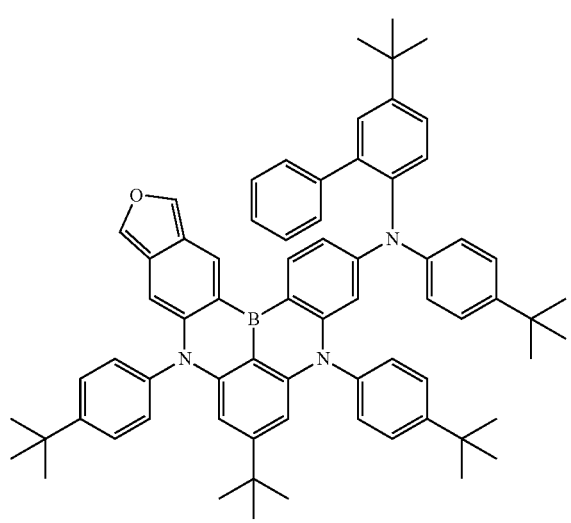
27
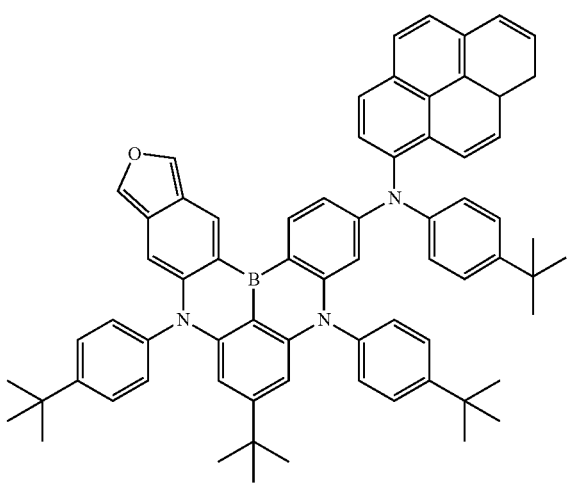
25
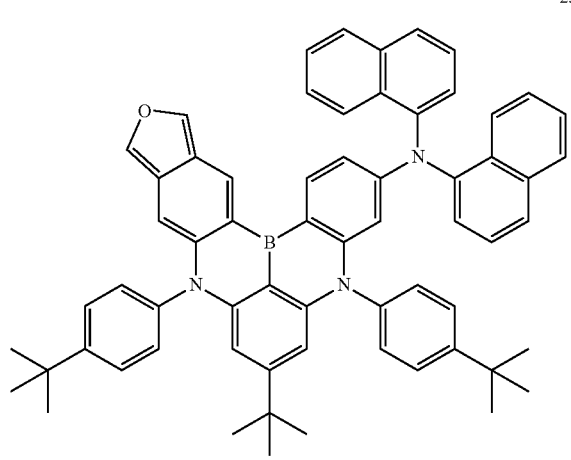
28
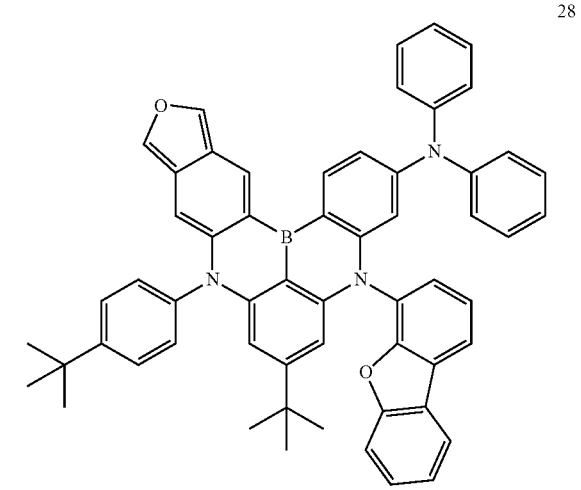

-continued
29
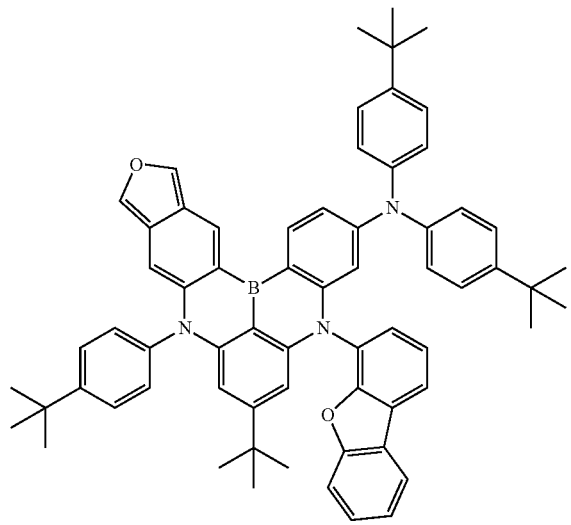
30
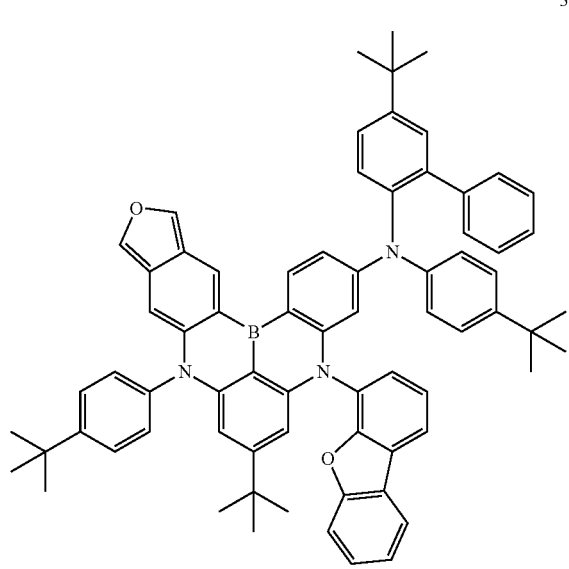
31
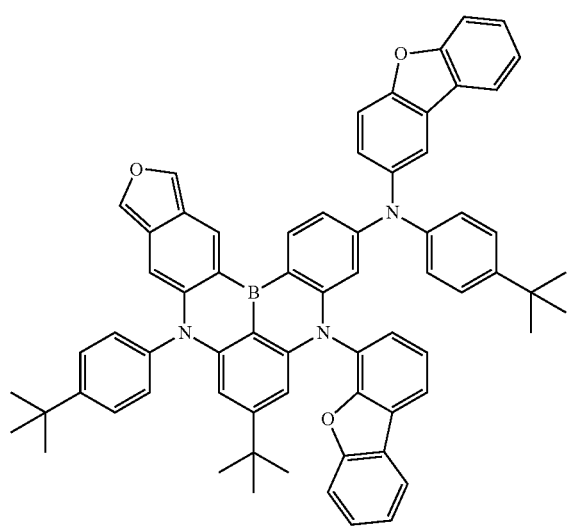
-continued
32
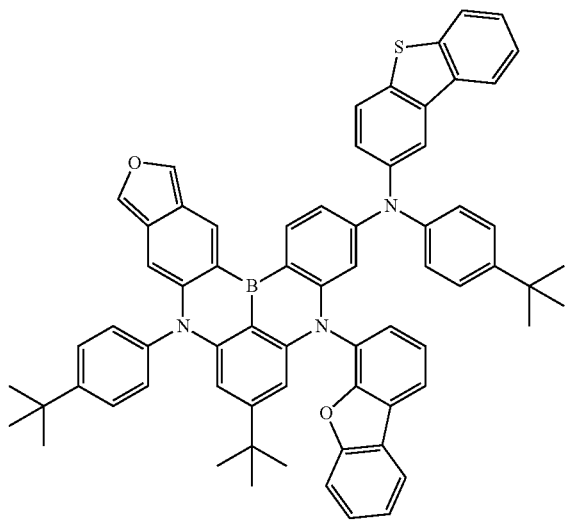
33
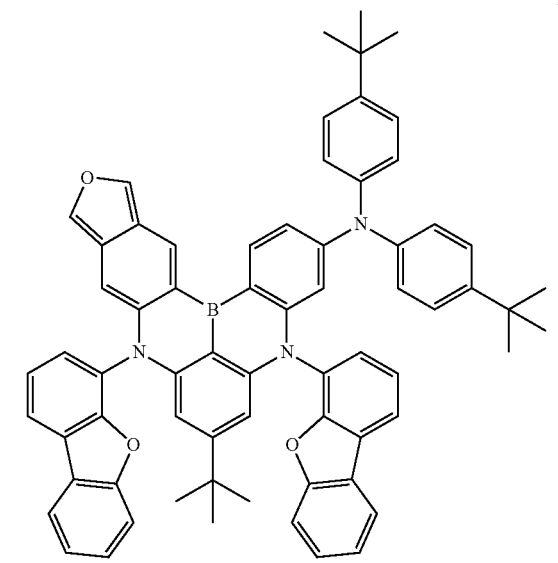
34
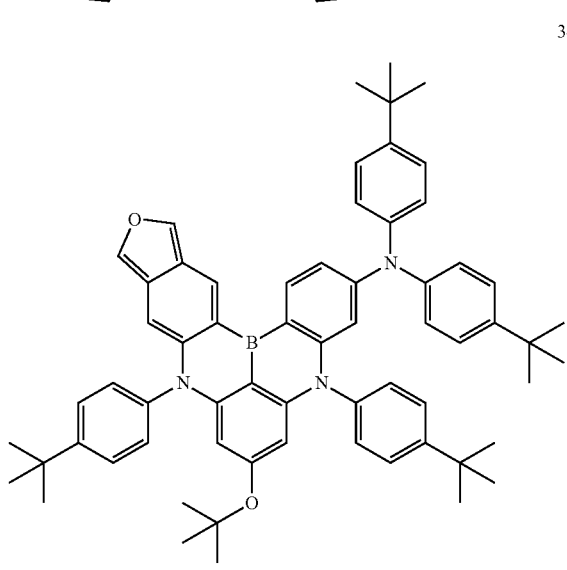

35
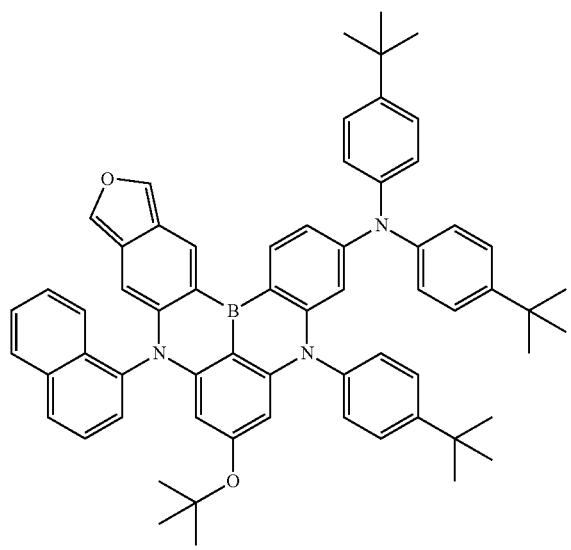
36
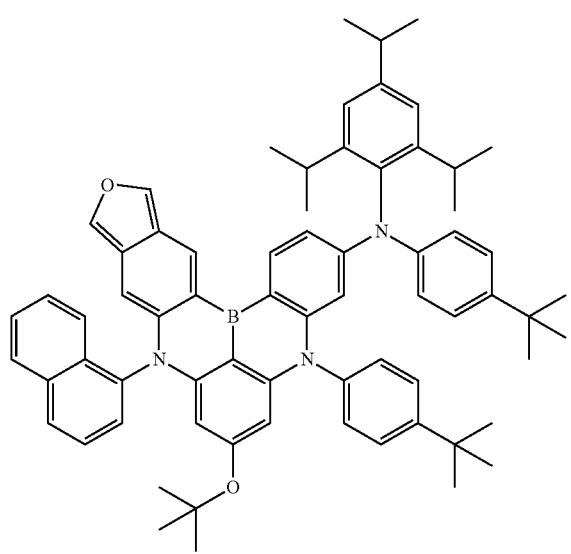
37
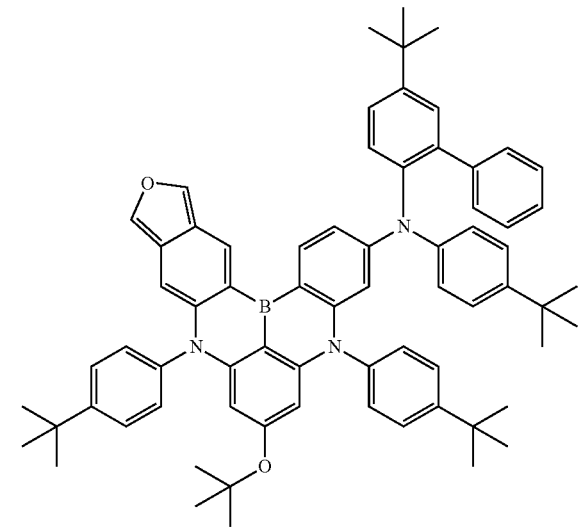
38
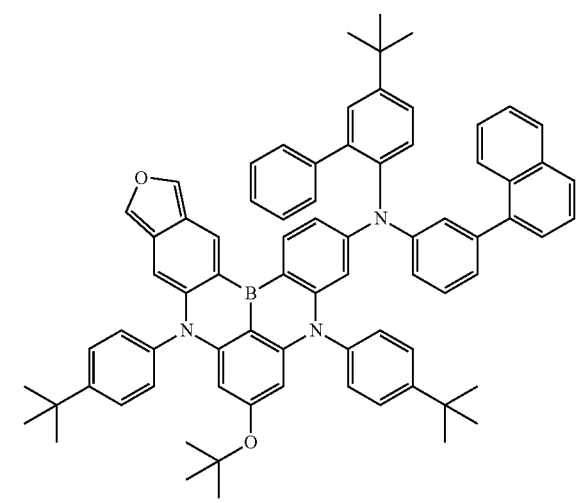
39
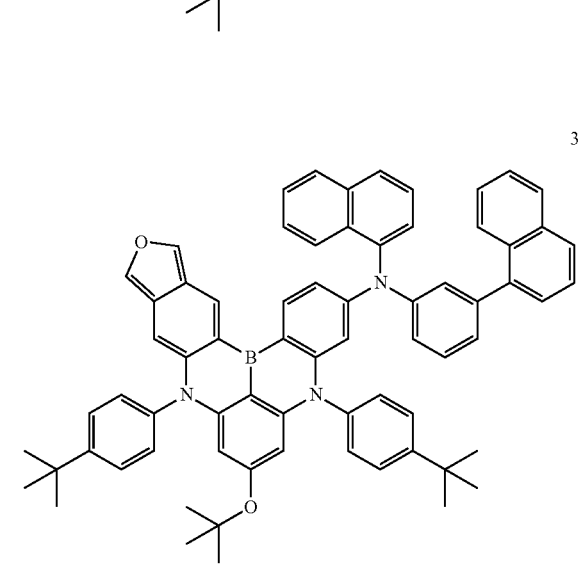

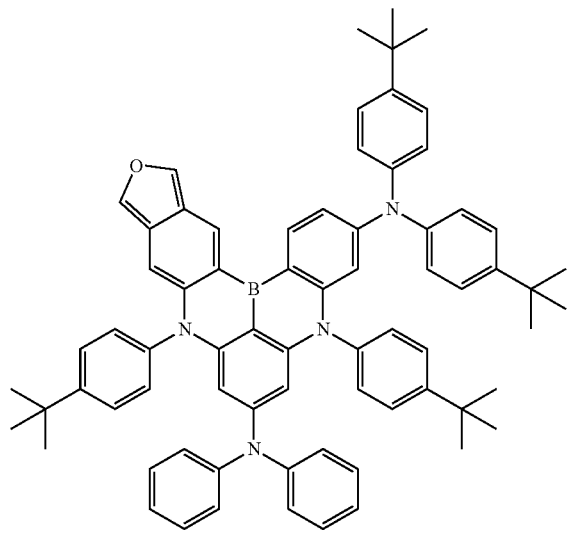
40
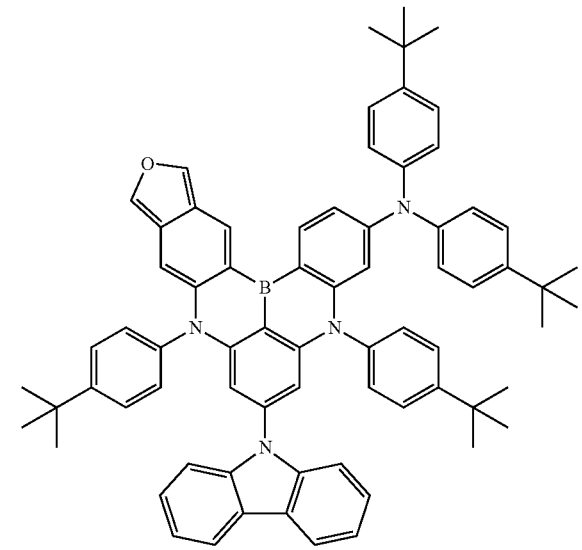
42
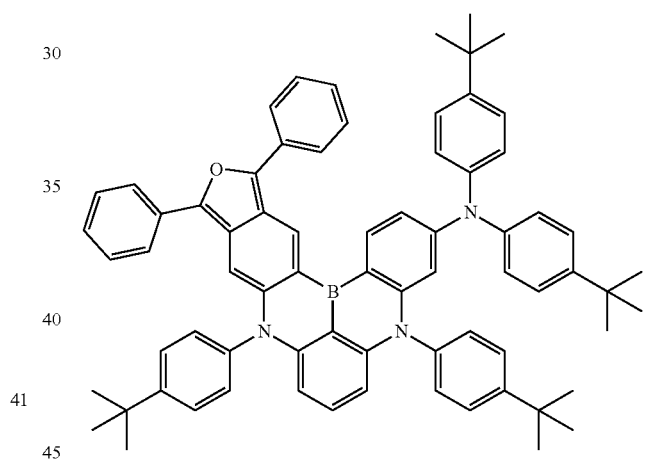
43
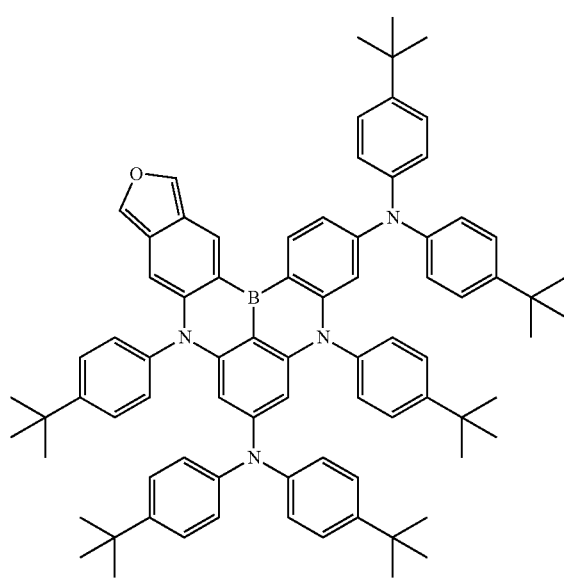
41
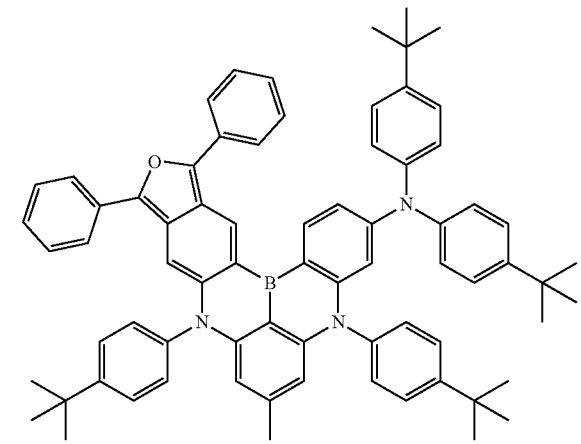
44

45
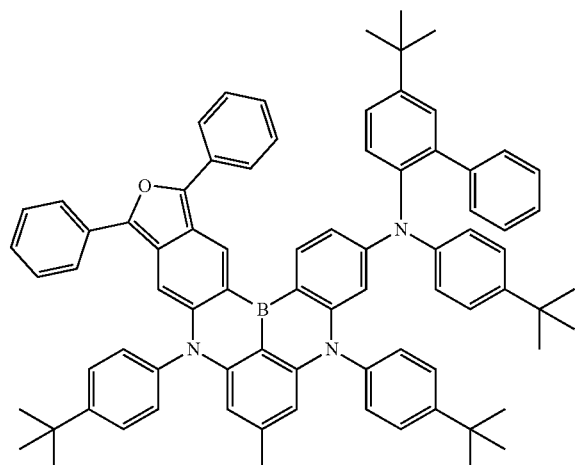
46
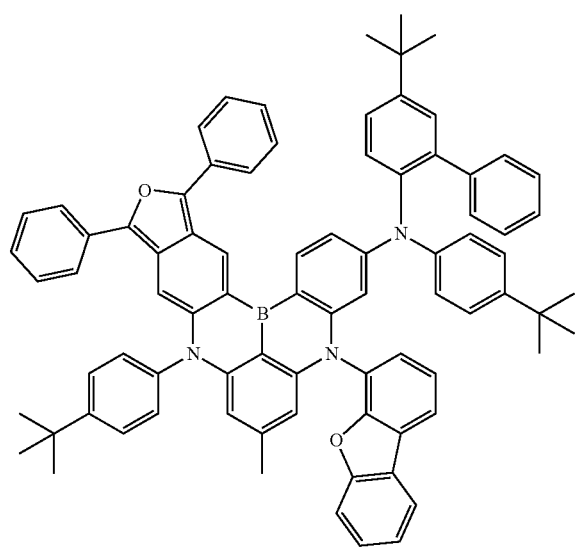
47
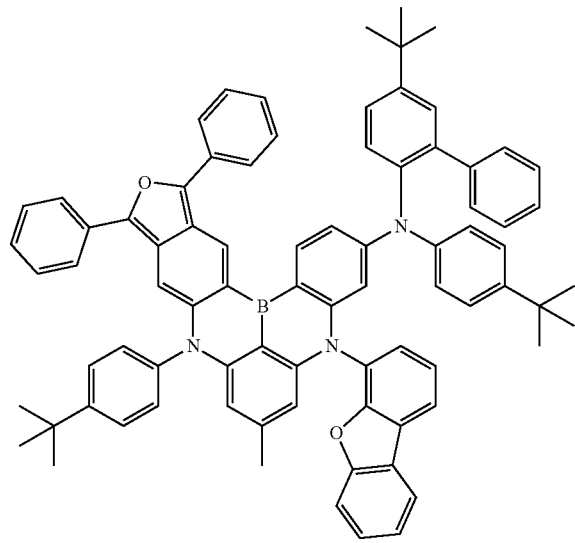
48
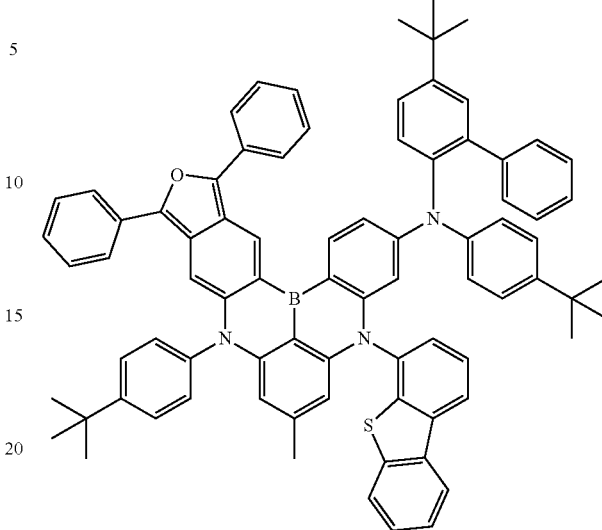
49
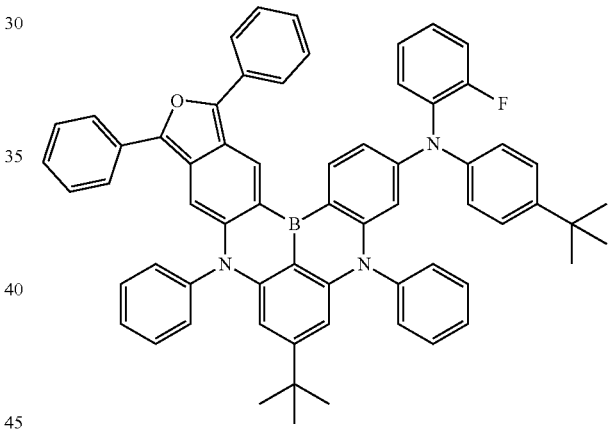
50
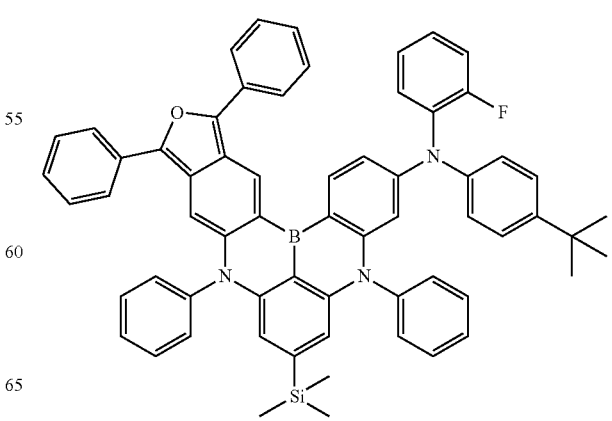

51
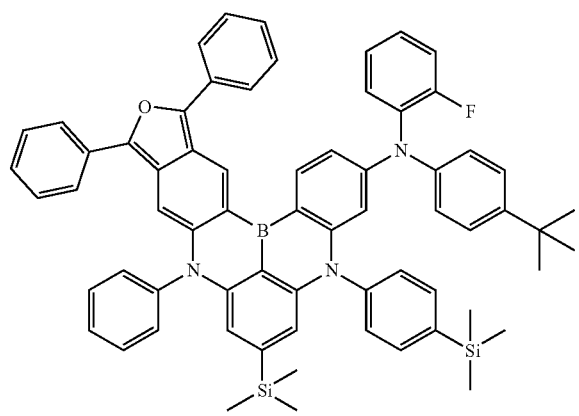
52
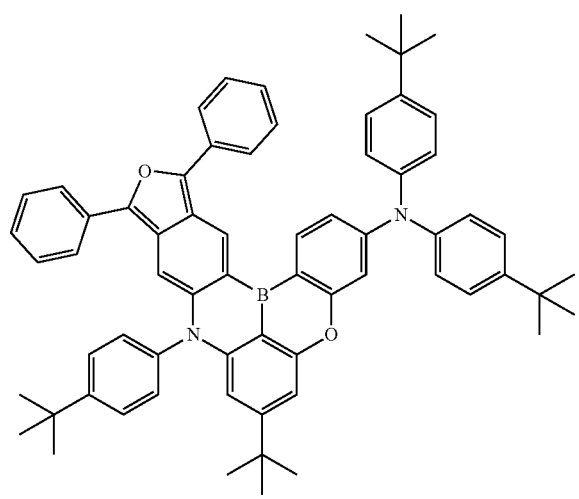
53
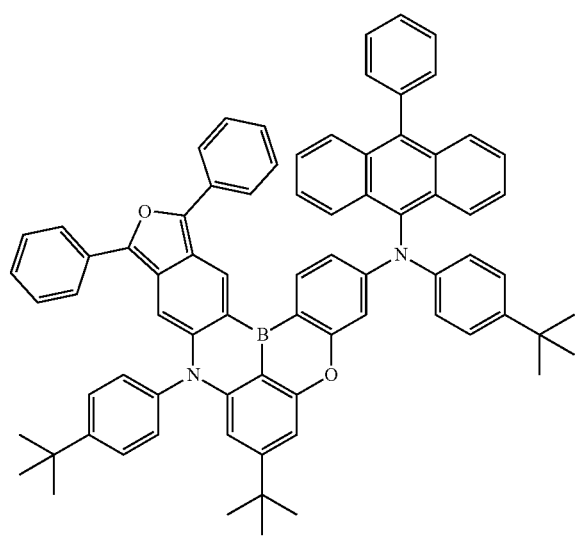
54
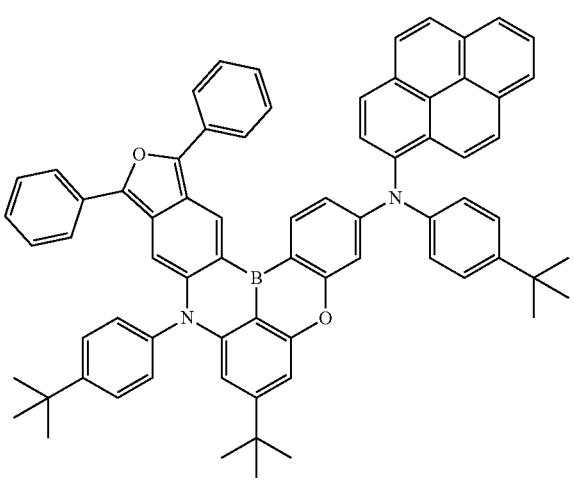
55
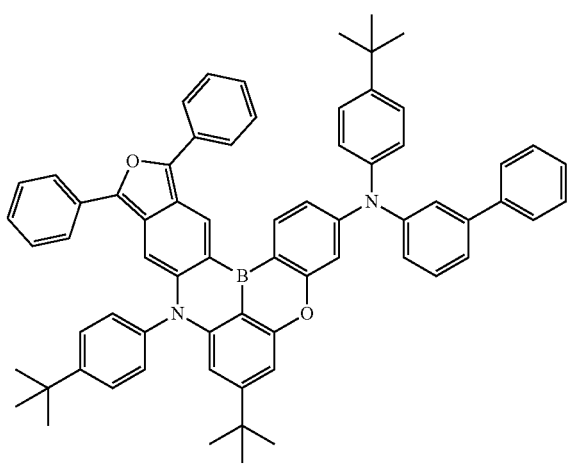
56
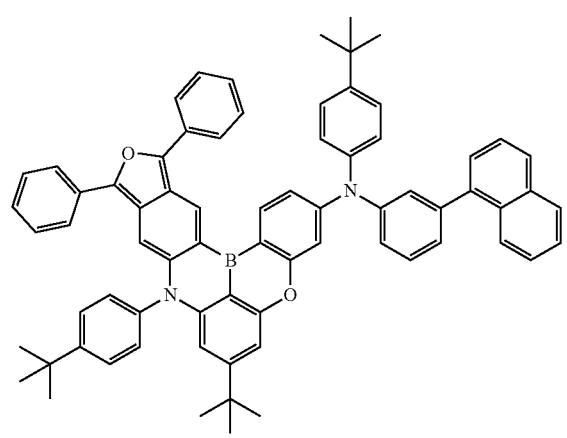

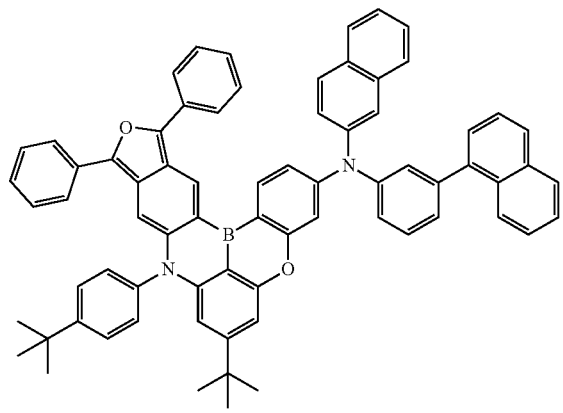
57
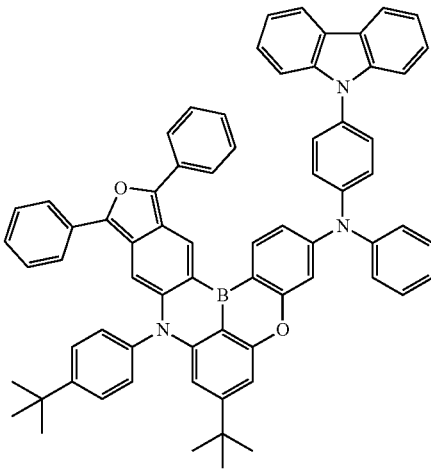
60
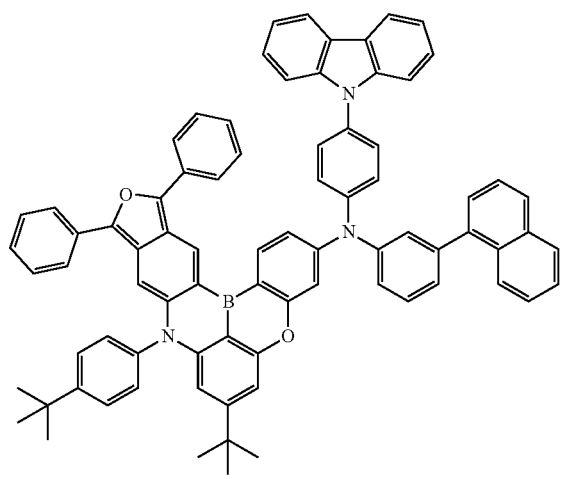
58
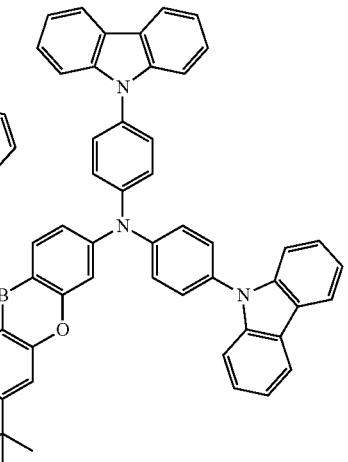
61
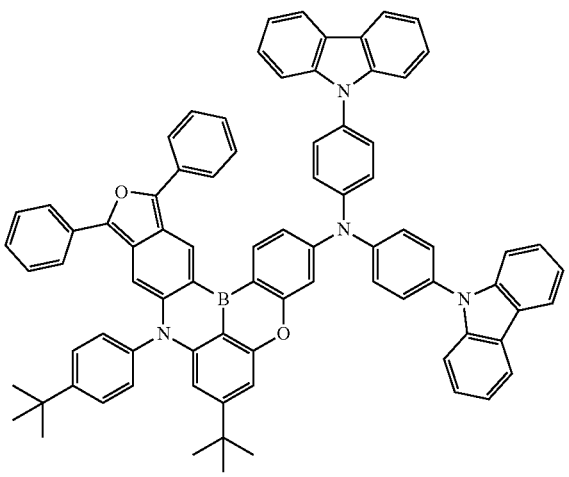
59
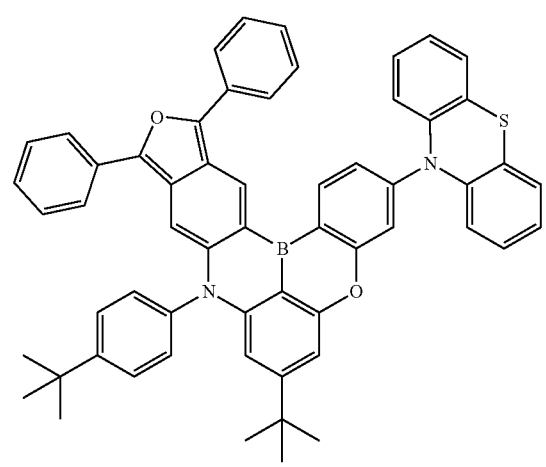
62

63
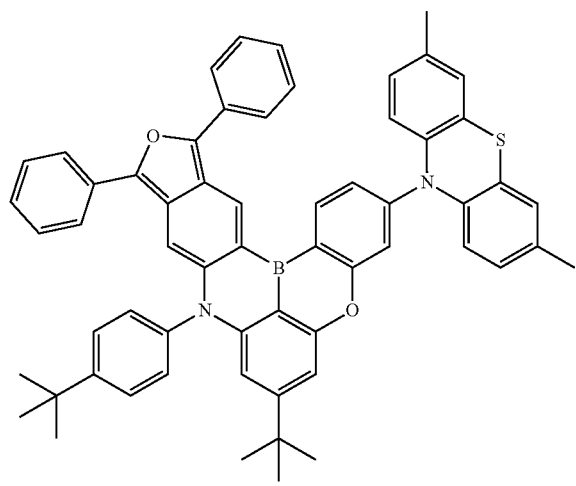
64
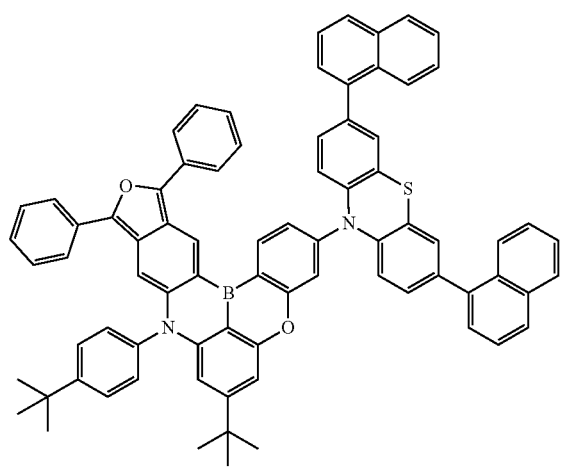
65
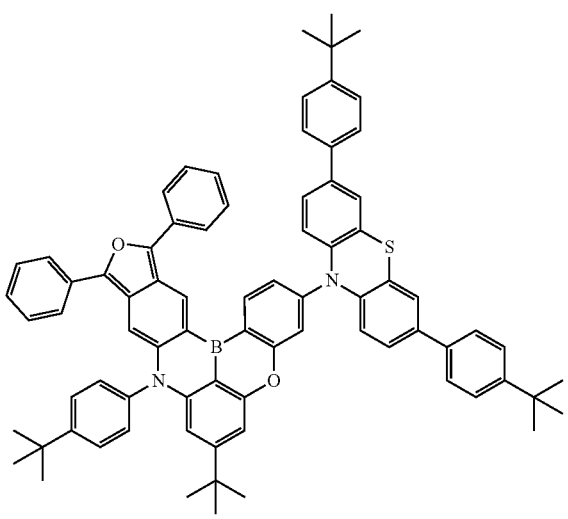
66
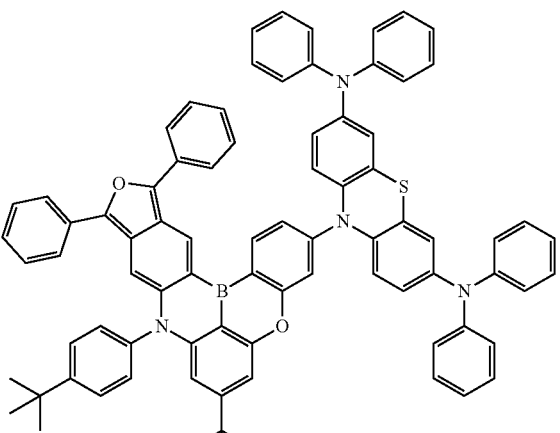
67
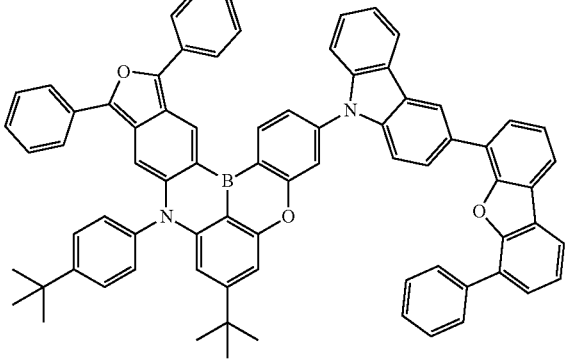

69
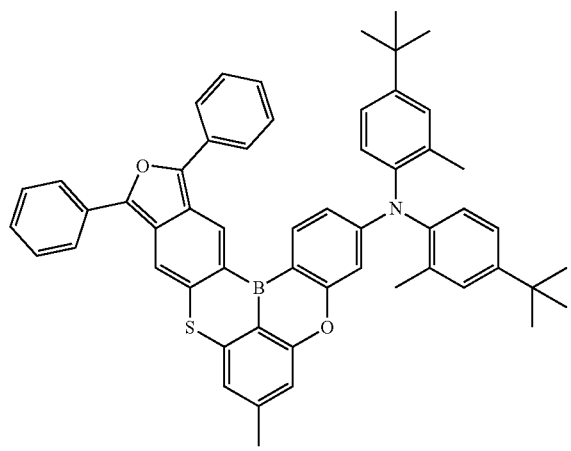
70
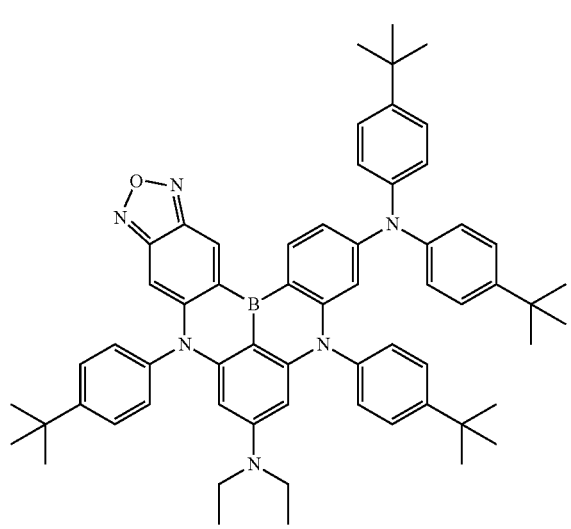
71
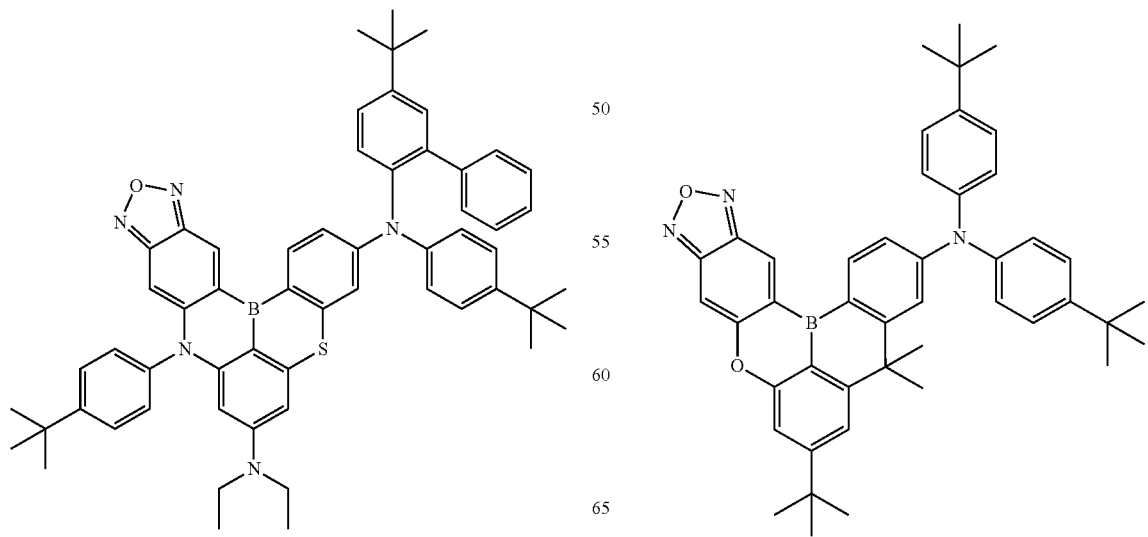
72
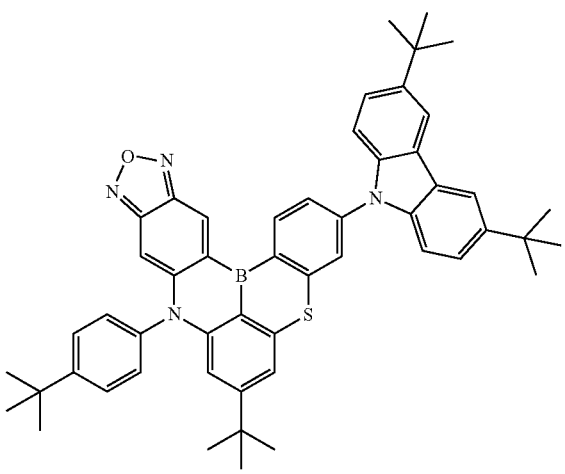
73
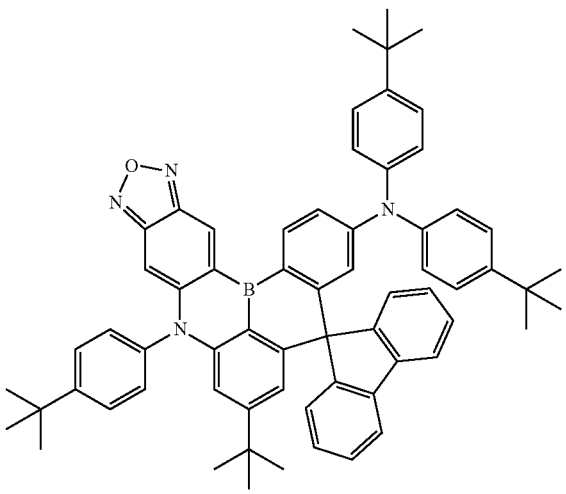
74

75
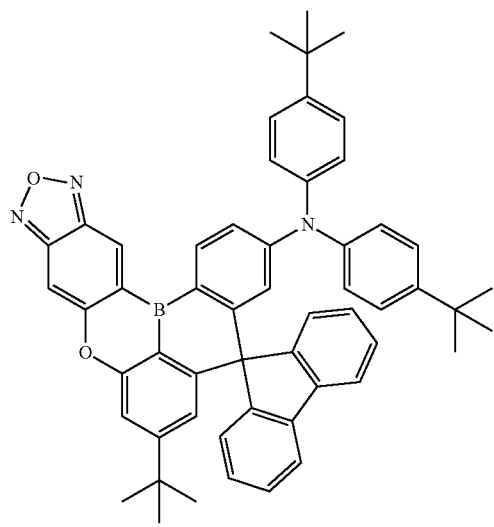
76
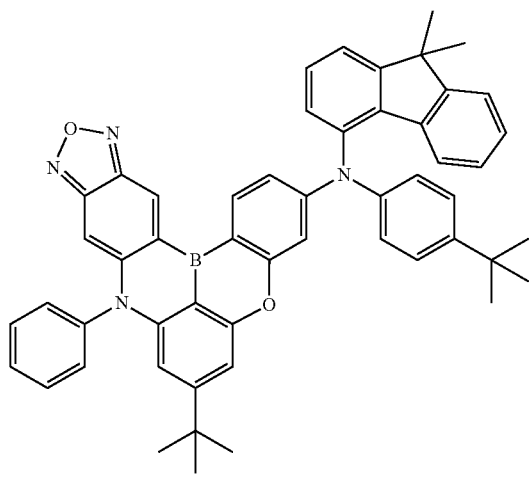
77
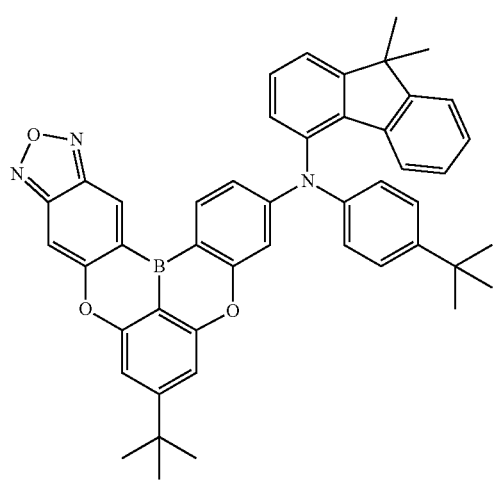
78
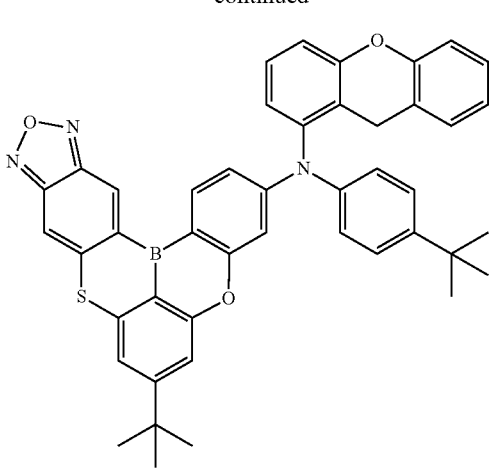
79
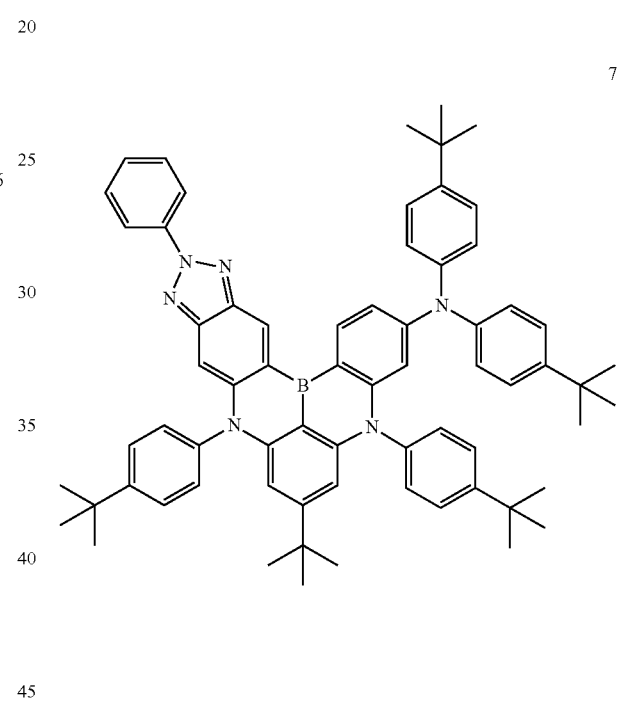
80
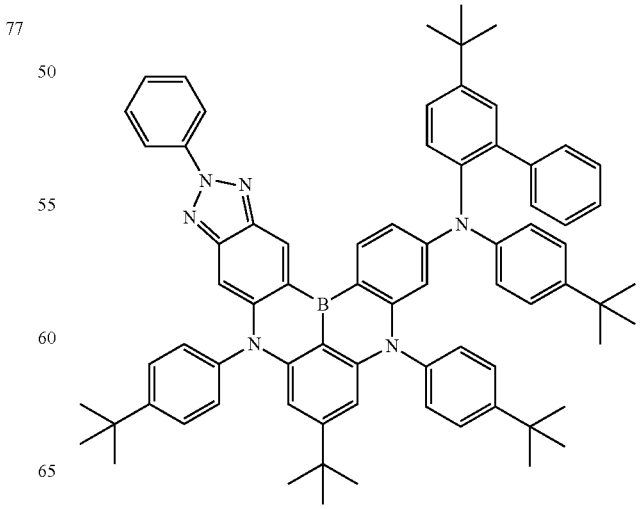

81
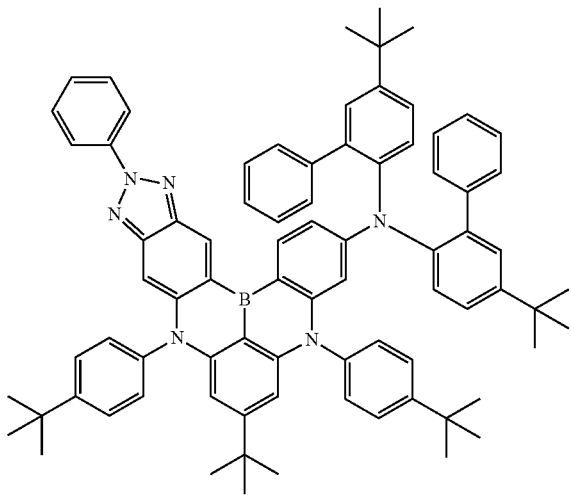
82
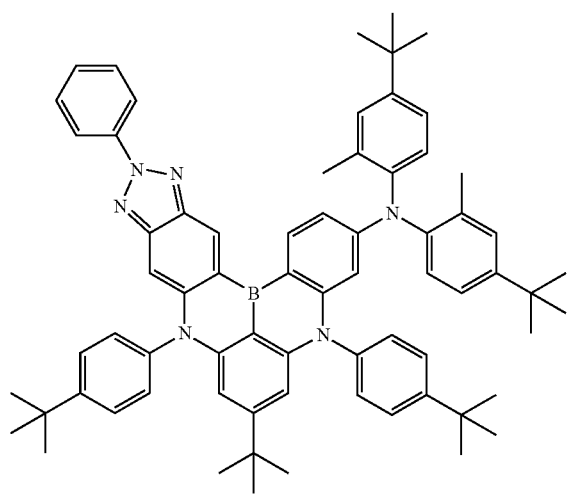
83
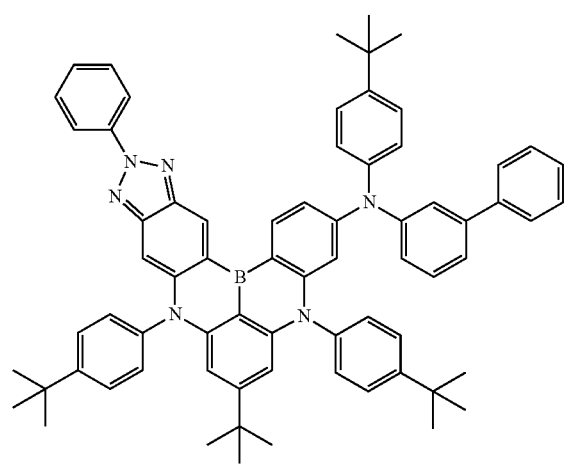
84
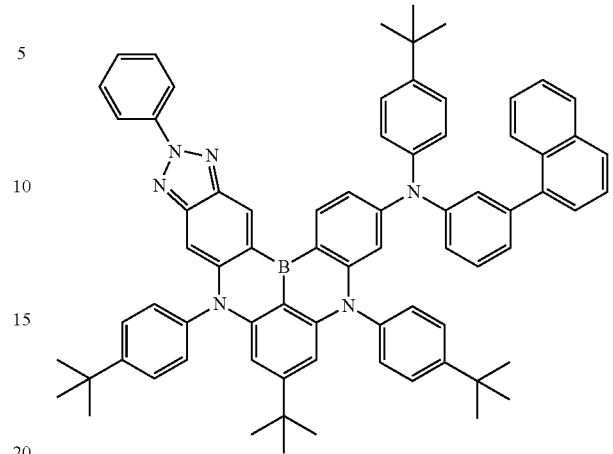
85
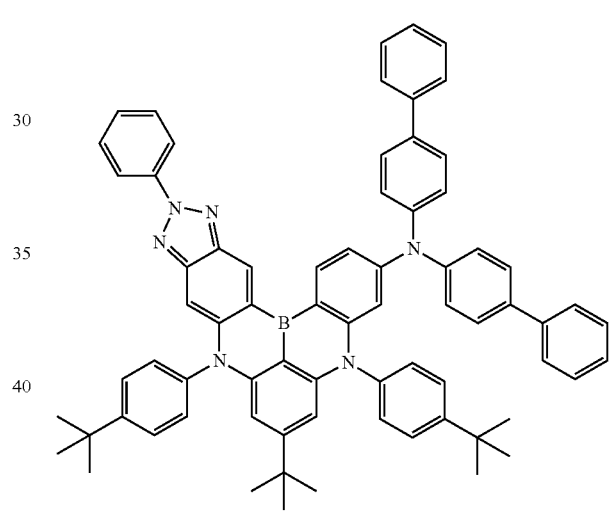
86
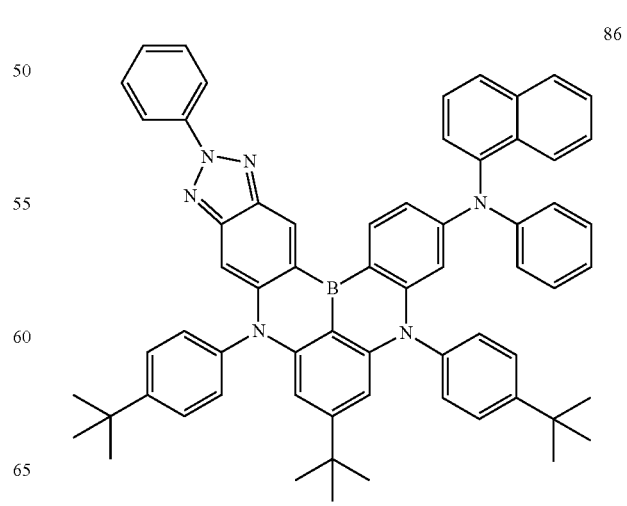

87
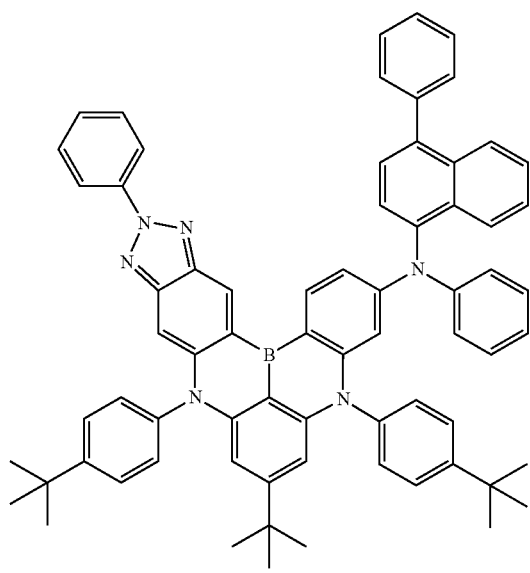
88
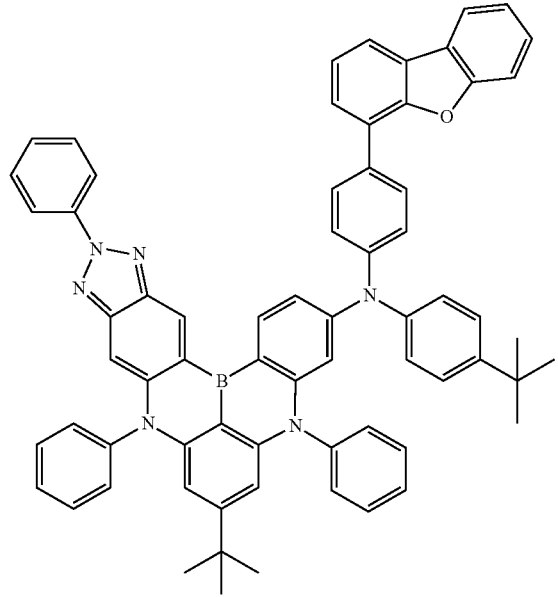
89
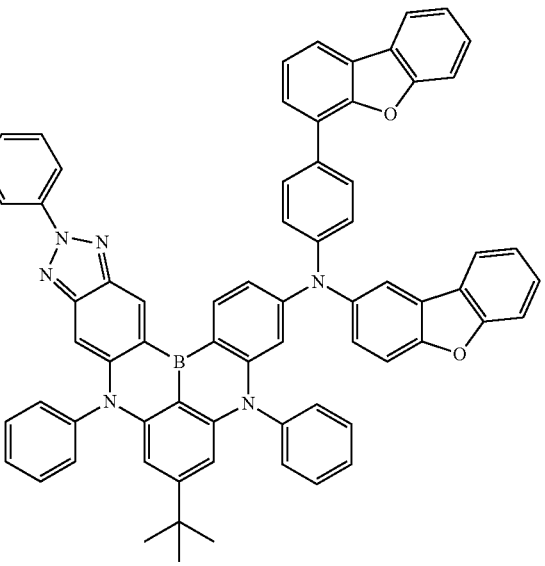
90
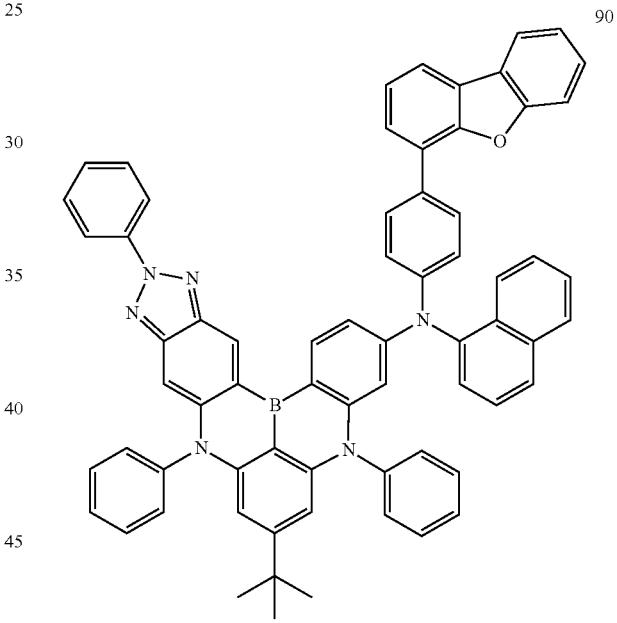
91
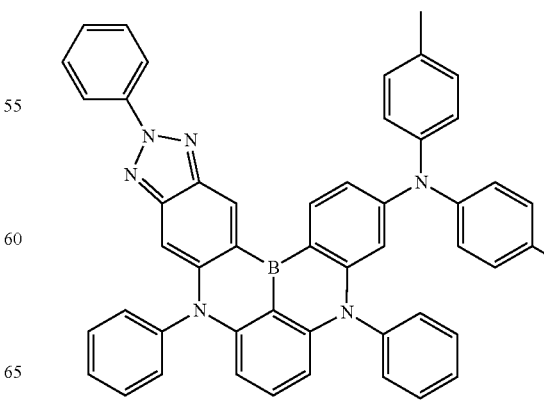

92
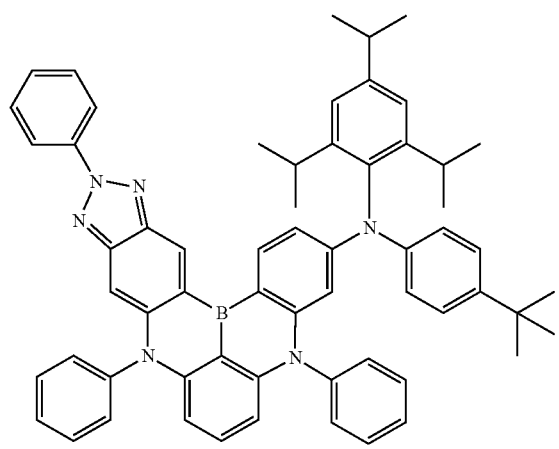
93
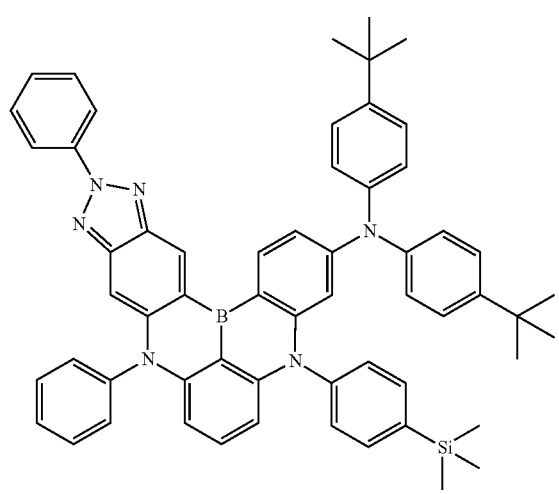
94
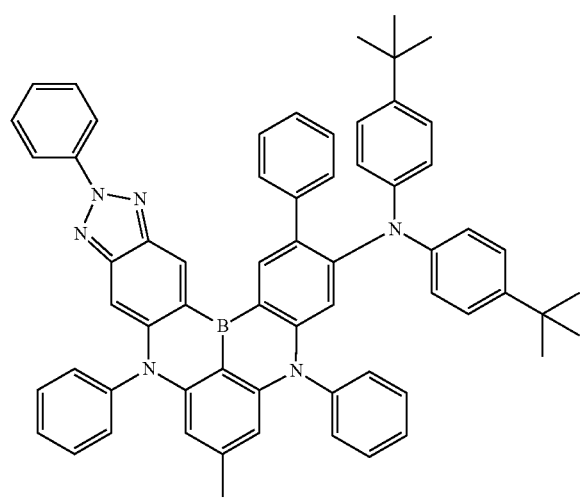
95
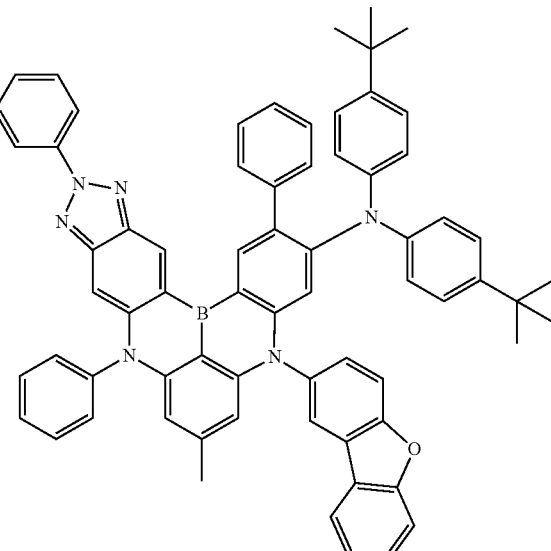
96
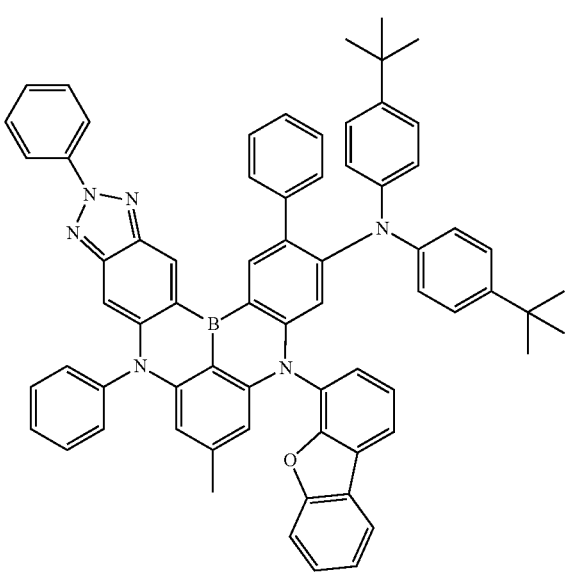
97
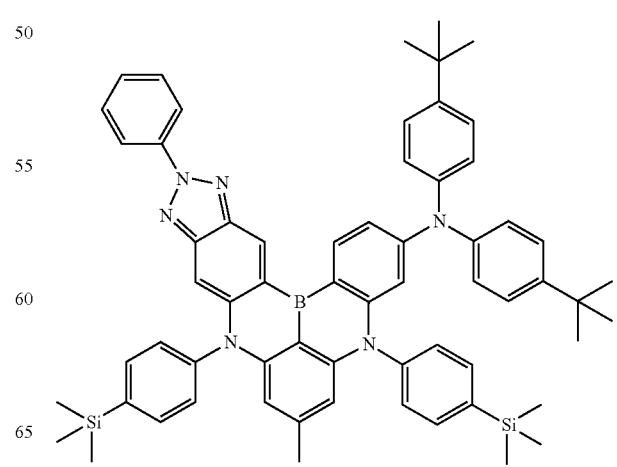

98
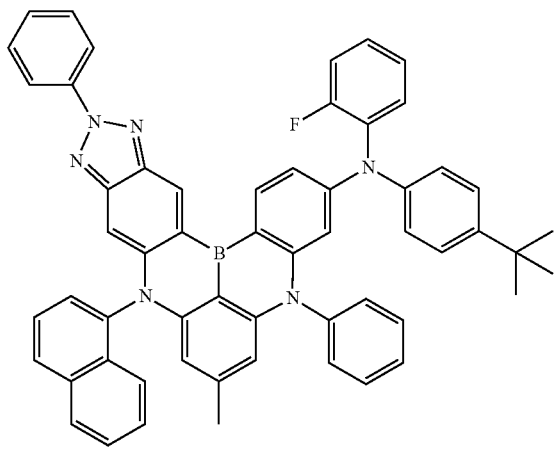
99
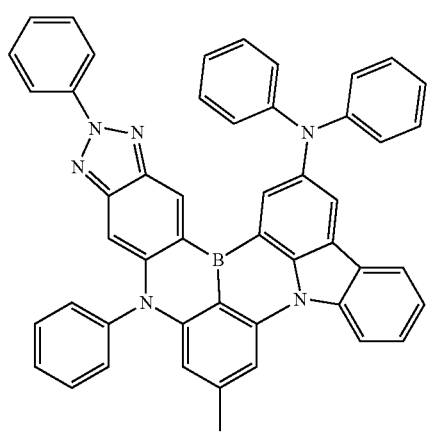
100
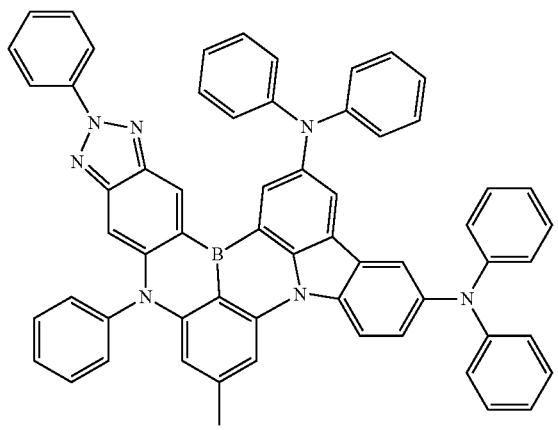
101
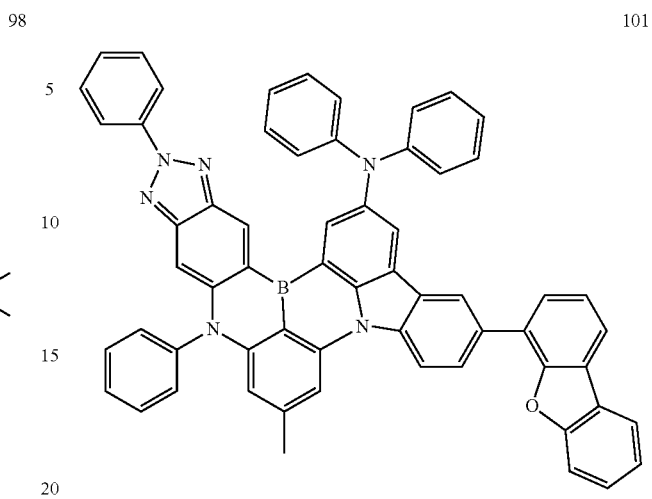
102
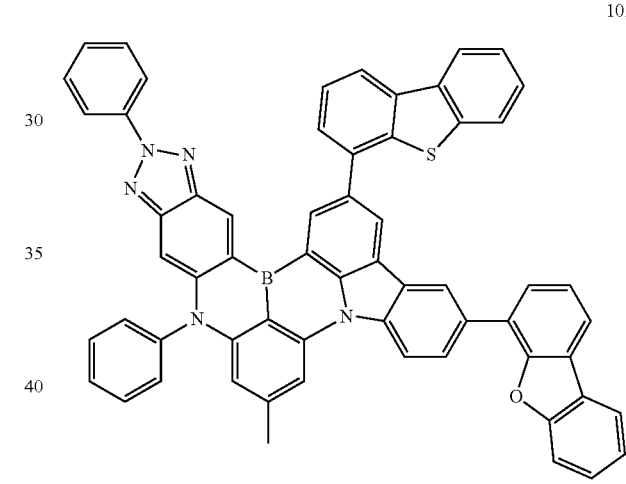
103
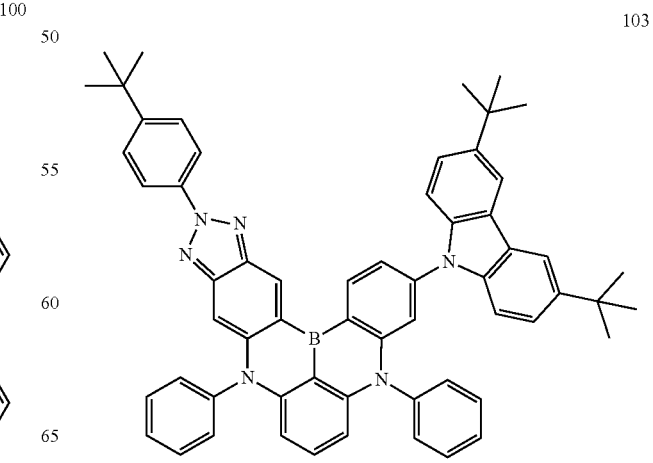

104
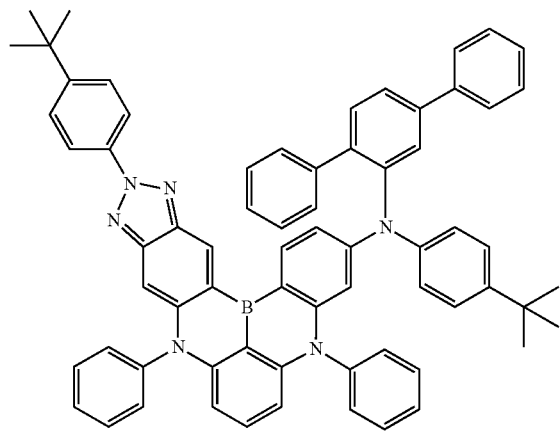
105
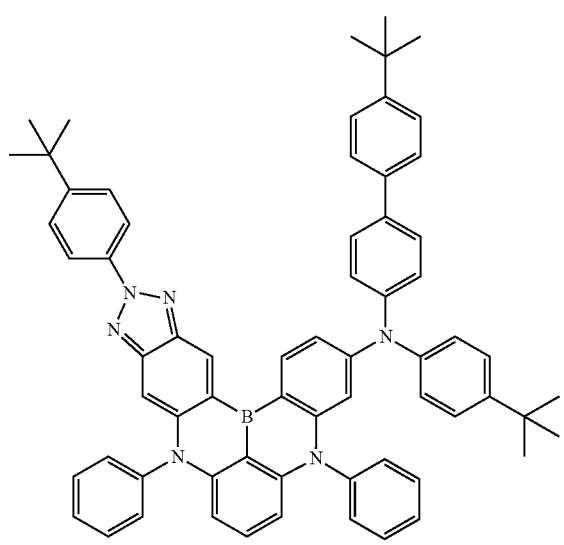
106
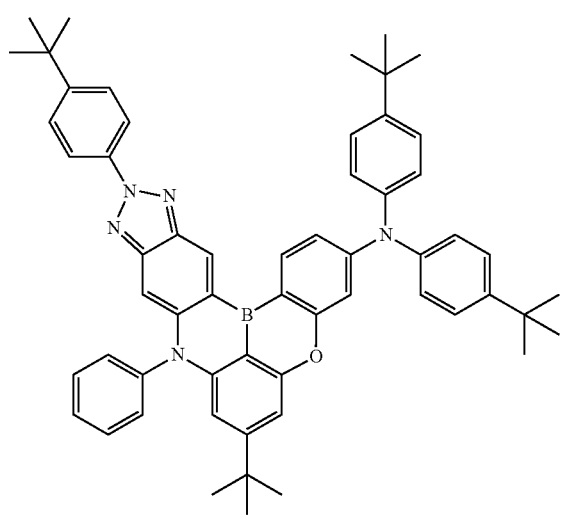
107
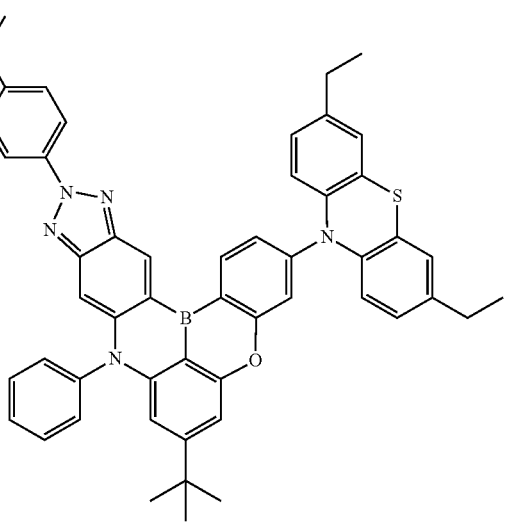
108
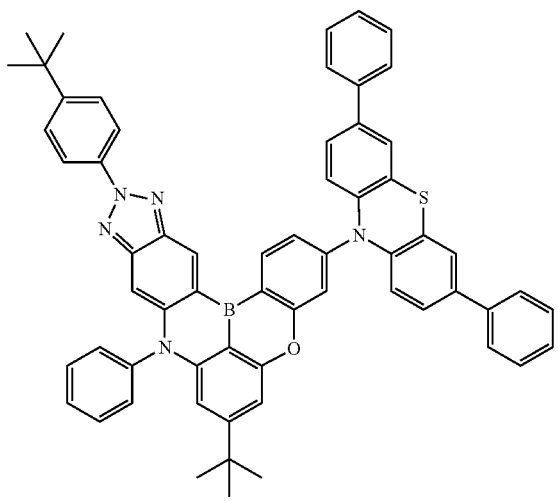
109
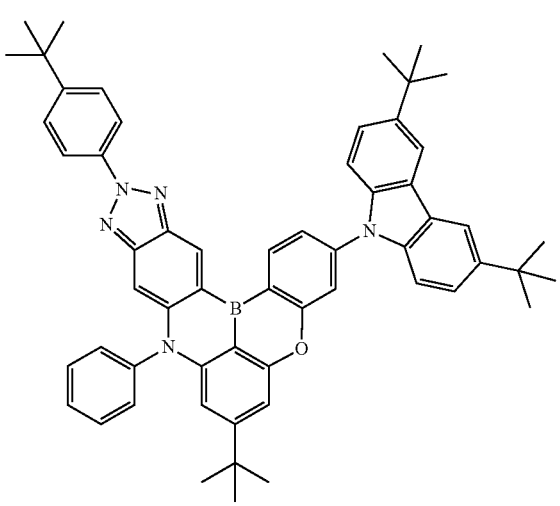

110
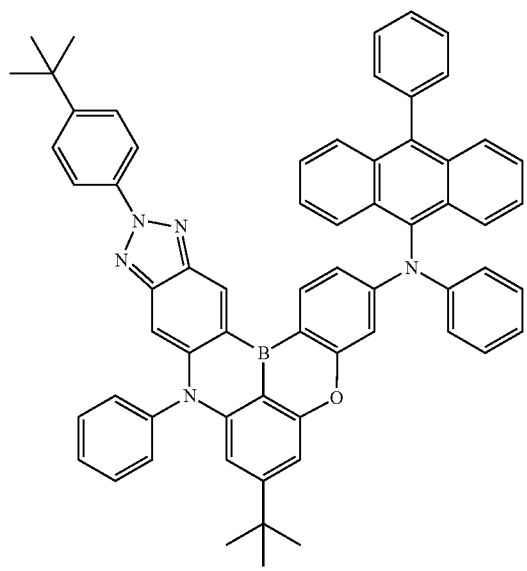
111
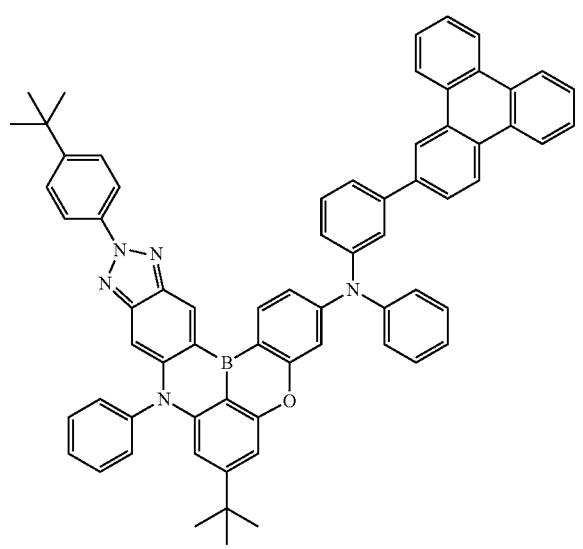
112
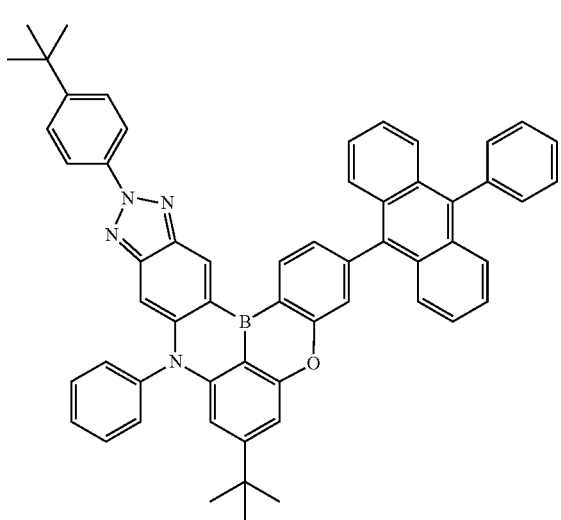
113
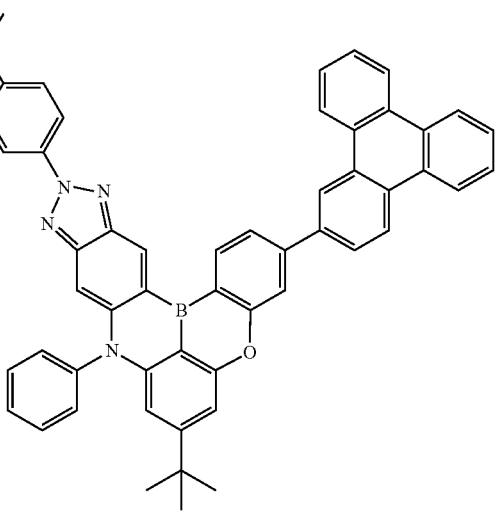
114
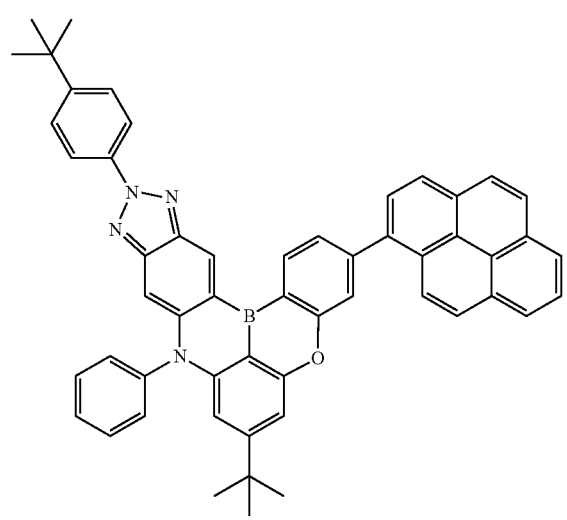
115
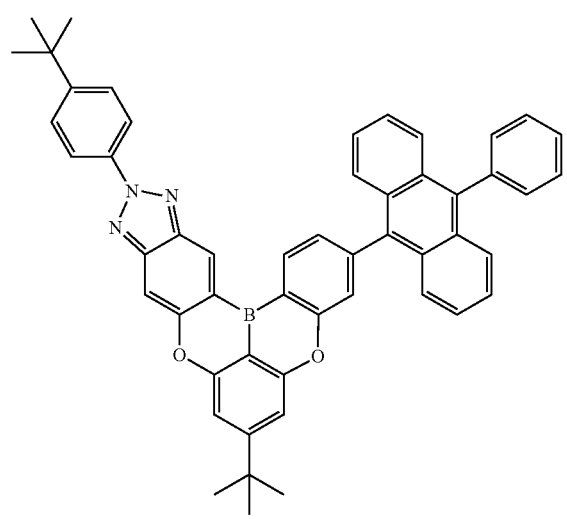

116

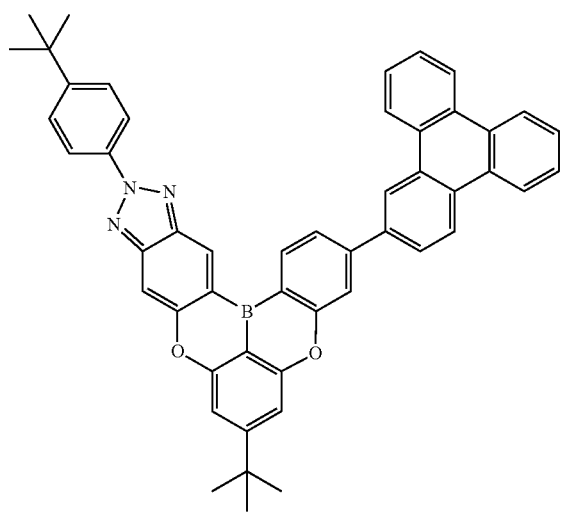

117

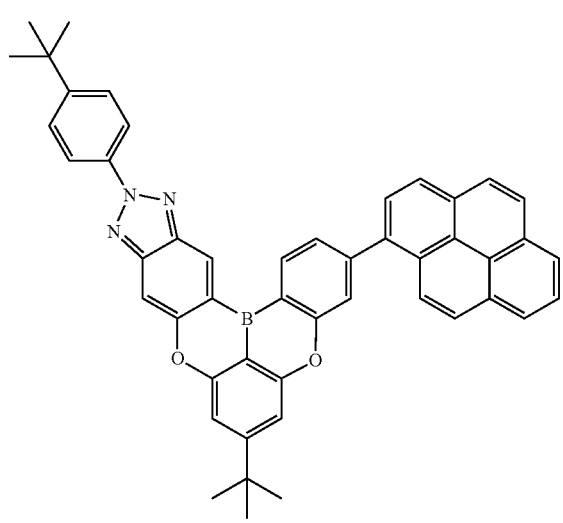

118

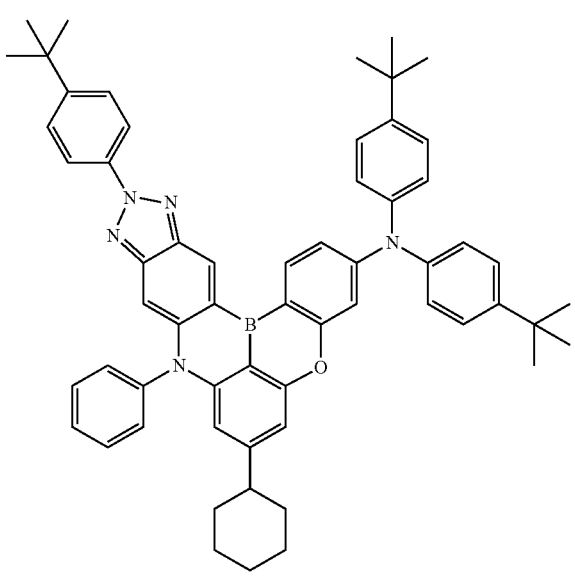

119

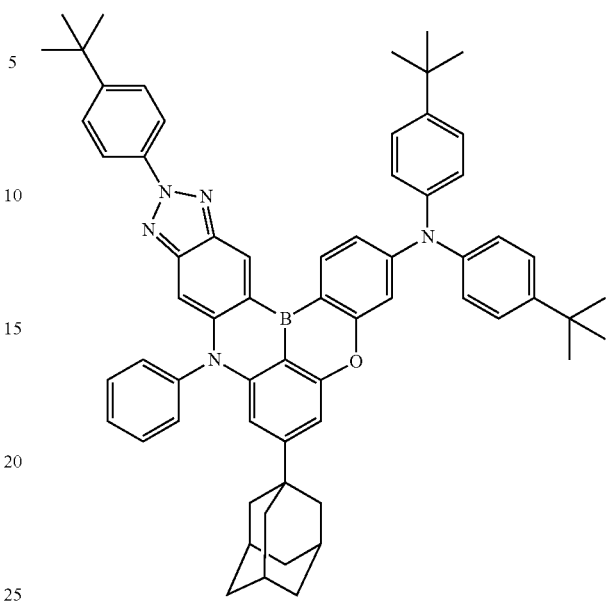

120

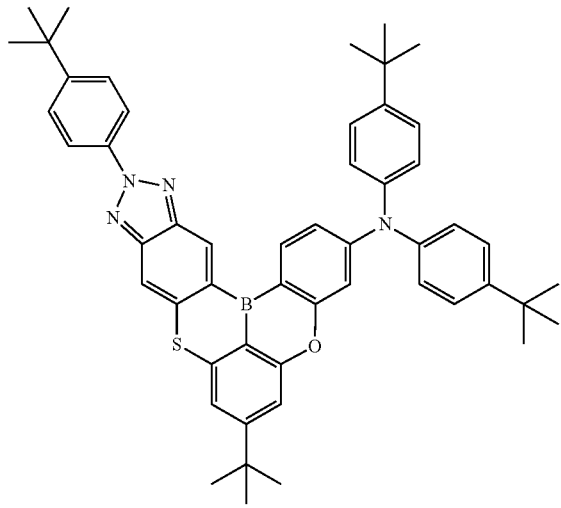

The specific examples of the substituents defined above can be found in Compounds 1 to 120 but are not intended to limit the scope of the compound represented by Formula A.

The boron (B)-containing substituted polycyclic aromatic structures can be used as organic light emitting materials having inherent characteristics of the substituents. For example, the substituents may be those used in materials for hole injecting layers, hole transport layers, light emitting layers, electron transport layers, electron injecting layers, electron blocking layers, and hole blocking layers of organic electroluminescent devices. This substitution allows the use of the polycyclic aromatic compounds as materials that meet the requirements of organic layers, particularly dopant materials for light emitting layers, enabling the fabrication of highly efficient organic electroluminescent devices.

A further aspect of the present invention is directed to an organic electroluminescent device including a first electrode, a second electrode, and one or more organic layers interposed between the first and second electrodes wherein at least one of the organic layers includes the organic electroluminescent compound represented by Formula A and optionally another organic electroluminescent compound represented by Formula A.

That is, according to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that the organic electroluminescent compound of Formula A is used to form the corresponding organic layer.

The organic electroluminescent device of the present invention may include a single organic layer. Alternatively, the organic electroluminescent device of the present invention may include two or more organic layers that form a multilayer laminate structure. In this case, the organic layers may include a hole injecting layer, a hole transport layer, a hole blocking layer, a light emitting layer, an electron blocking layer, an electron transport layer, and an electron injecting layer, but is not limited to this structure. The number of the organic layers is not limited and may be increased or decreased. Preferred structures of the organic layers of the organic electroluminescent device according to the present invention will be explained in more detail in the Examples section that follows.

A more detailed description will be given concerning exemplary embodiments of the organic electroluminescent device according to the present invention.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers that have various functions depending on the desired characteristics of the device.

The light emitting layer of the organic electroluminescent device according to the present invention includes, as a host compound, an anthracene derivative represented by Formula C:

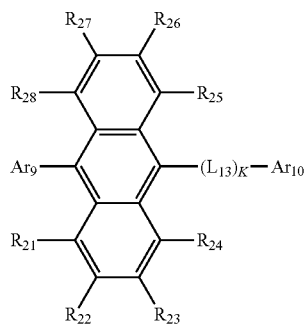

(C)

wherein $R_{21}$ to $R_{28}$ are identical to or different from each other and are as defined for $R_1$ to $R_{13}$ in Formula A, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_{20}$ arylene, and k is an integer from 1 to 3, provided that when k is 2 or more, the linkers $L_{13}$ are identical to or different from each other.

$Ar_9$ in Formula C is represented by Formula C-1:

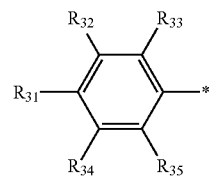

(C-1)

wherein $R_{31}$ to $R_{35}$ are identical to or different from each other and are as defined for $R_1$ to $R_{13}$ in Formula A, and each of $R_{31}$ to $R_{35}$ is optionally bonded to an adjacent substituent to form a saturated or unsaturated ring.

The compound of Formula C employed in the organic electroluminescent device of the present invention may be specifically selected from the compounds of Formulae C1 to C57:

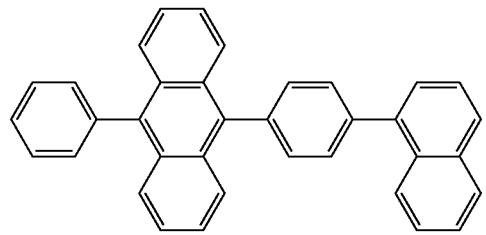

C1

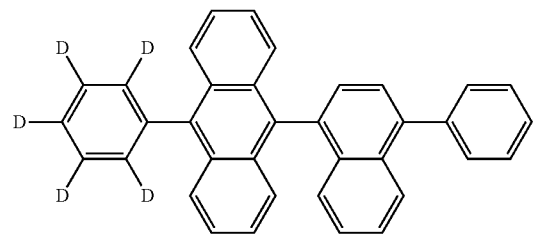

C2

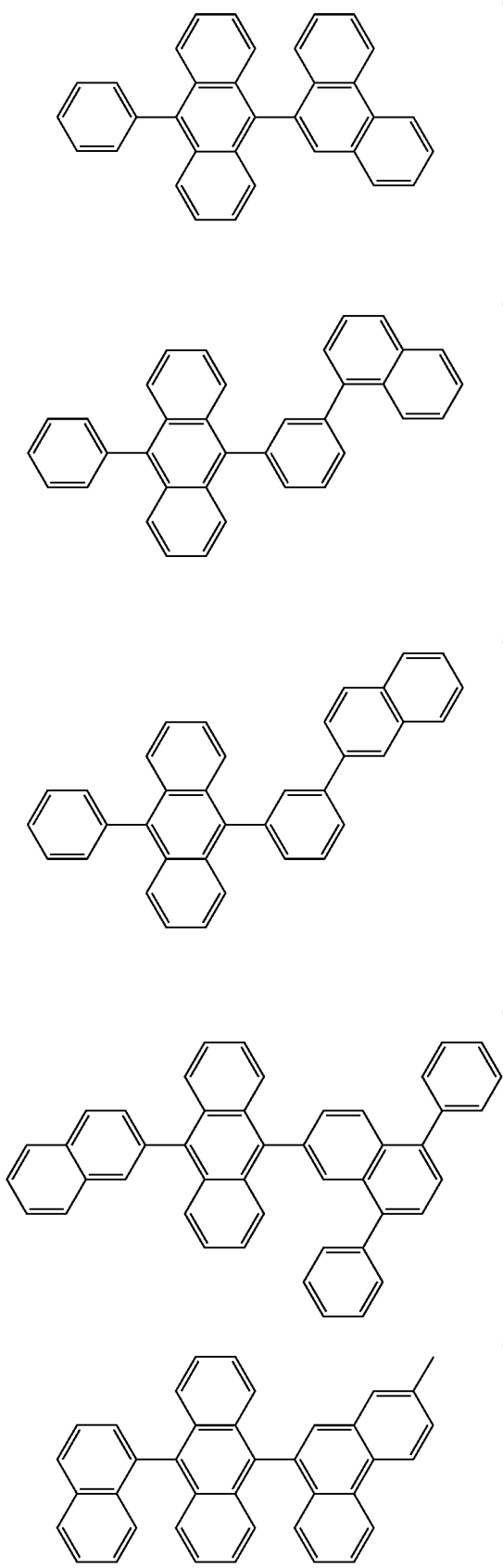

C14
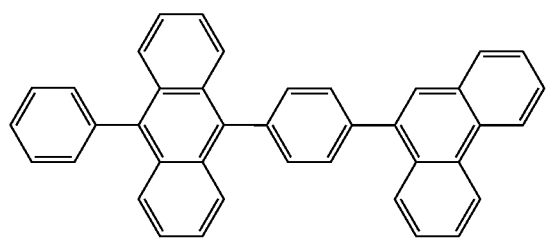
C15
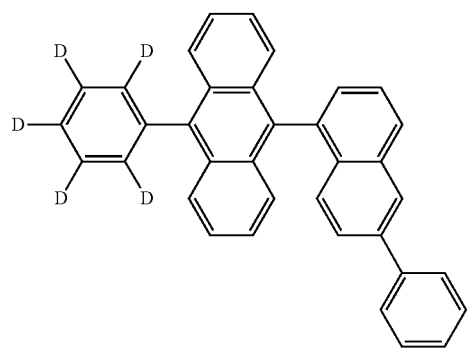
C16
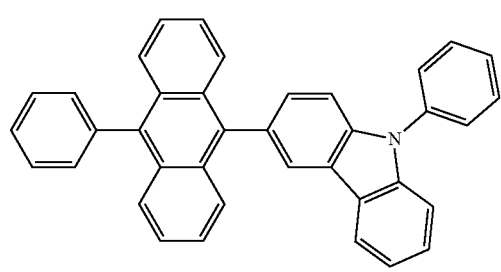
C17
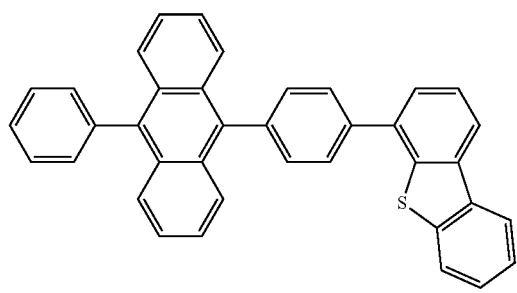
C18
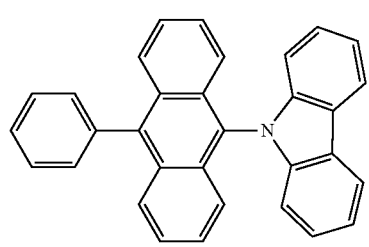
C19
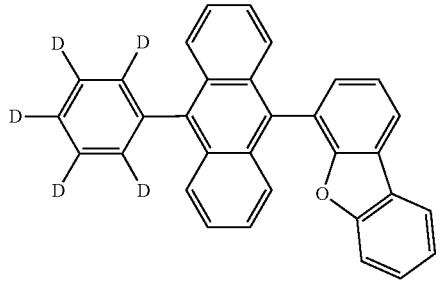
C20
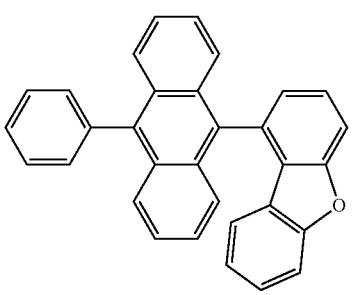
C21
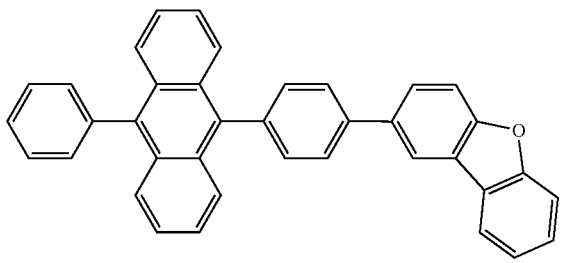
C22
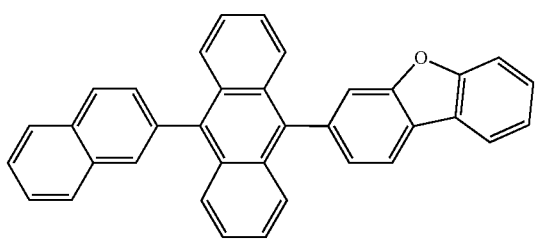
C23
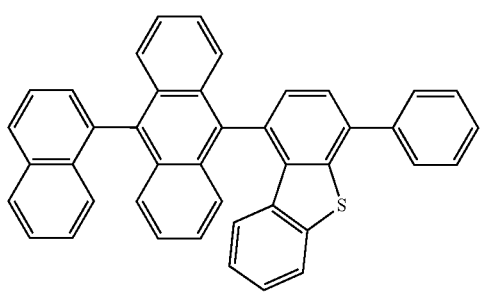

-continued
C24
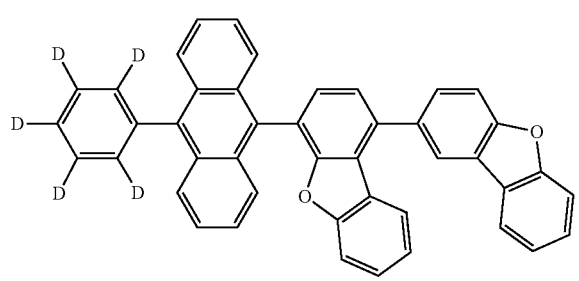
C25
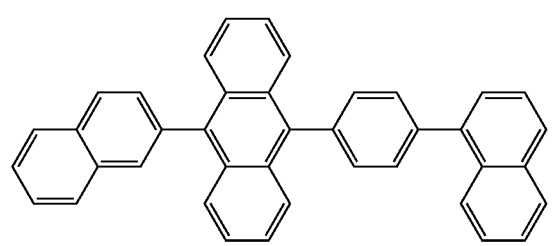
C26
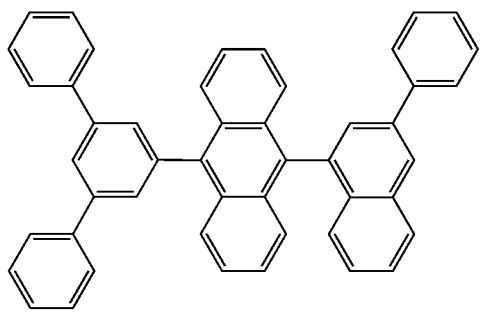
C27
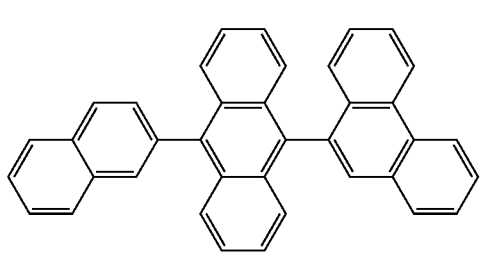
C28
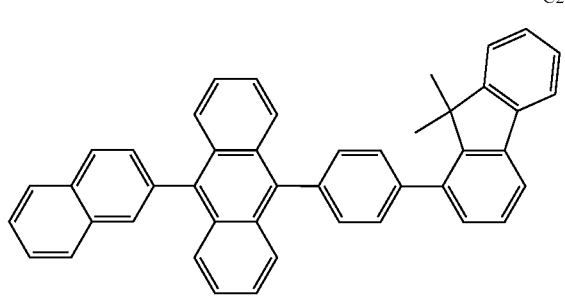
-continued
C29
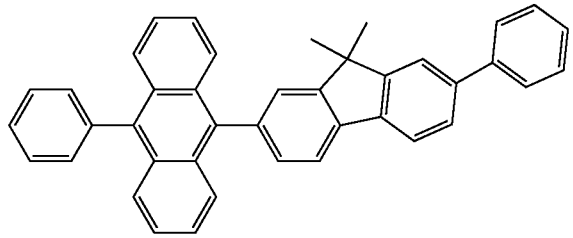
C30
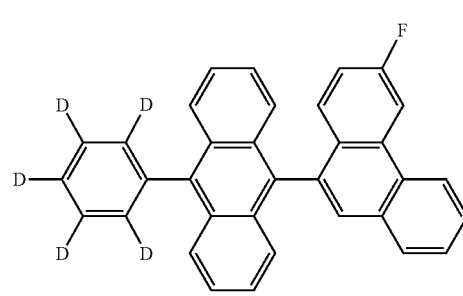
C31
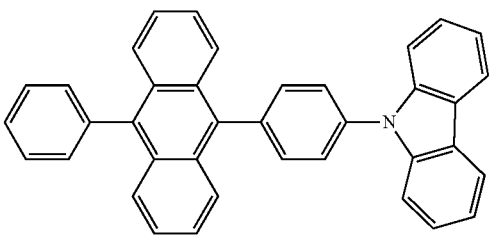
C32
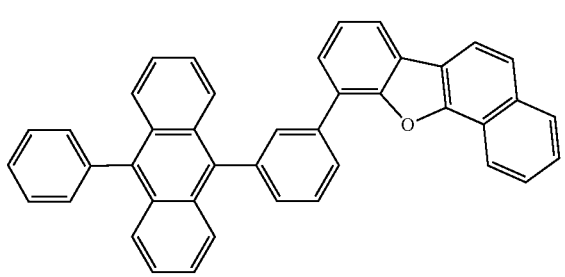
C33
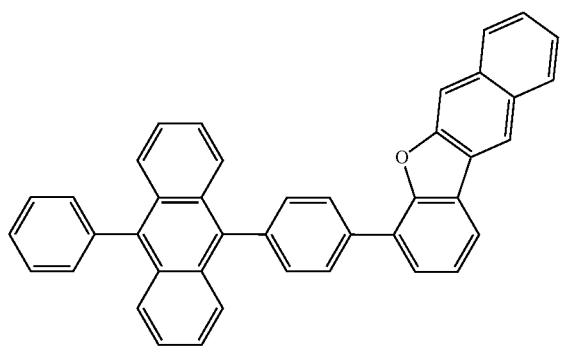

C34
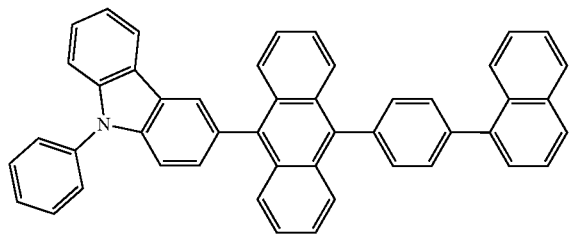
C35
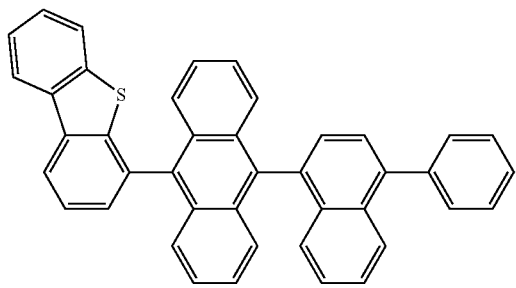
C36
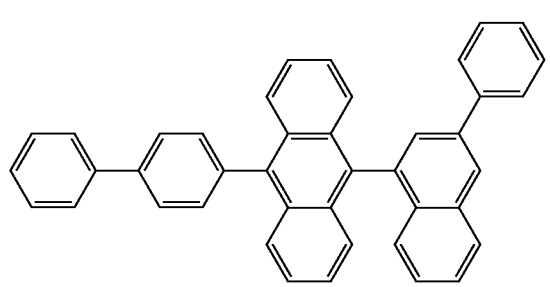
C37
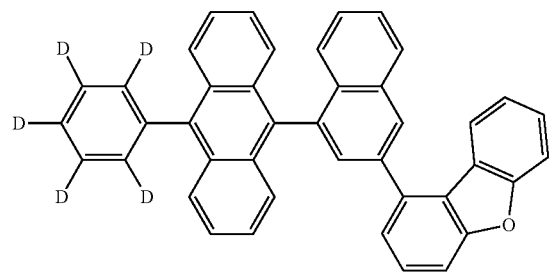
C38
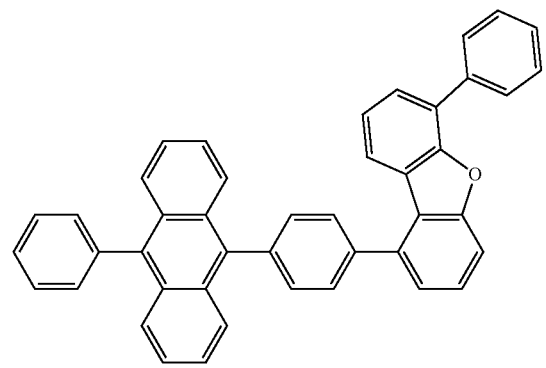
C39
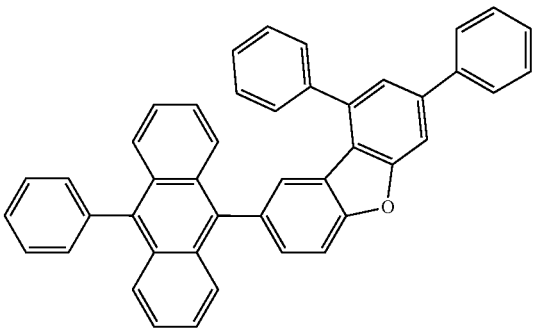
C40
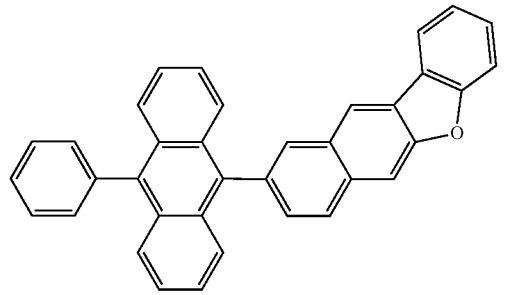
C41
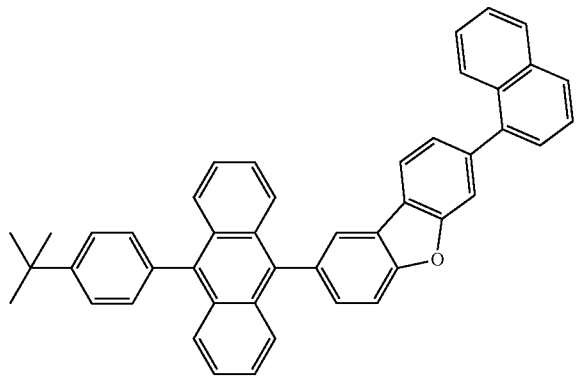
C42
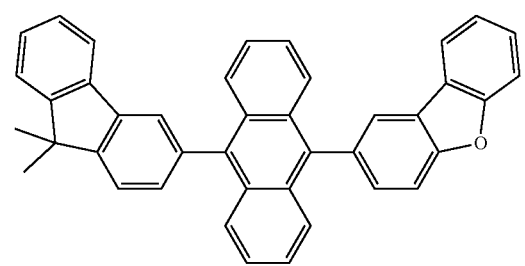

-continued
C43
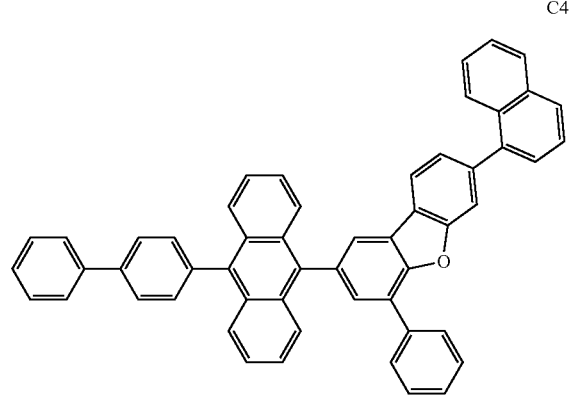
C44
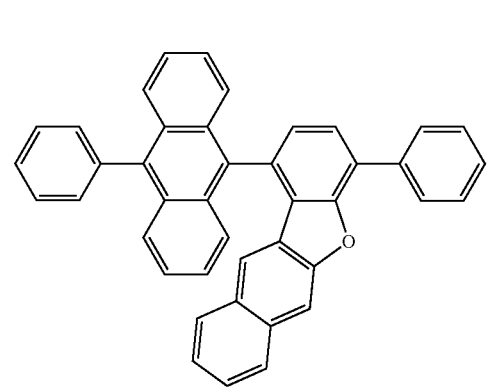
C45
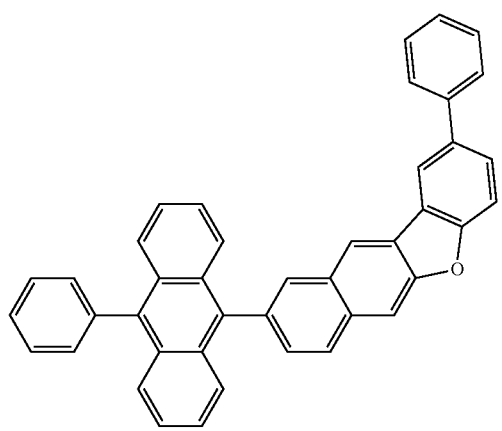
C46
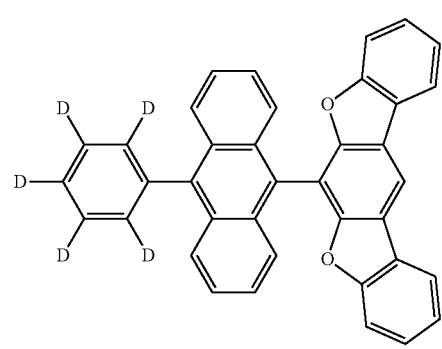
-continued
C47
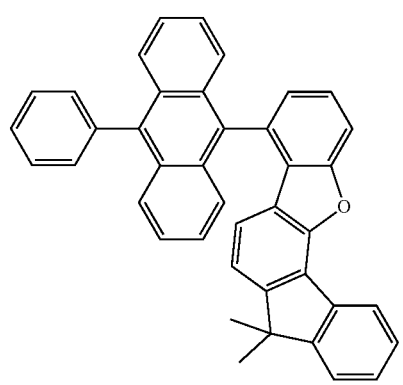
C48
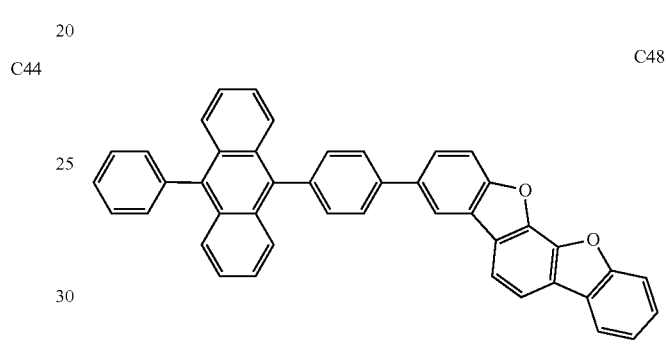
C49
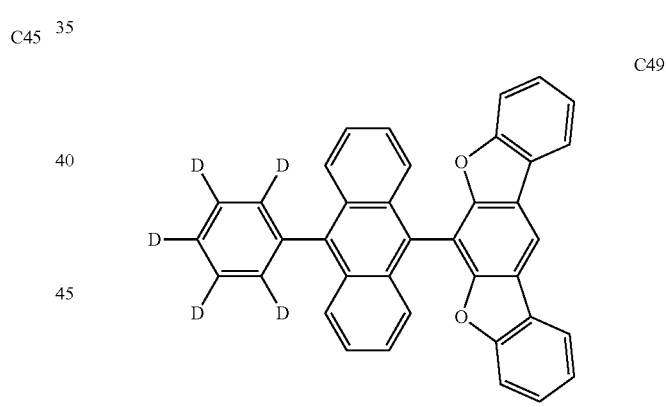
C50
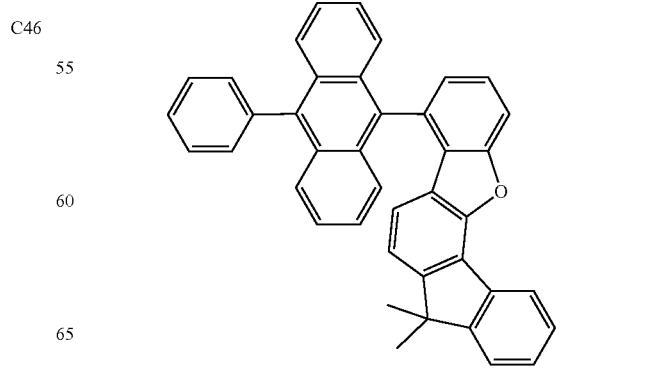

-continued
C51
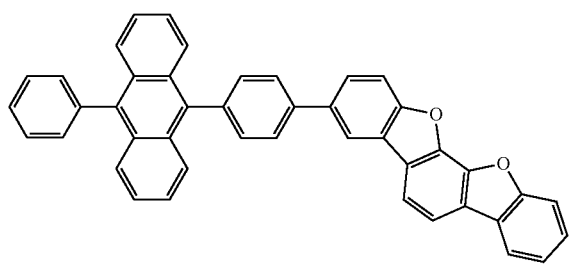
C52
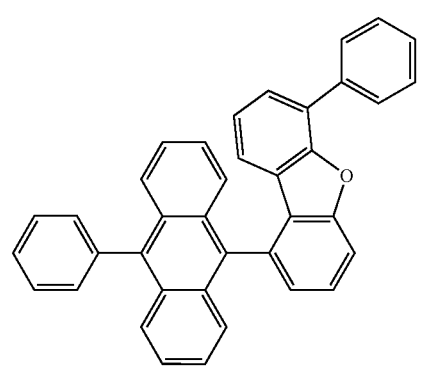
C53
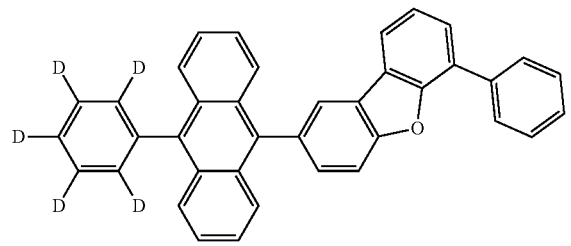
C54
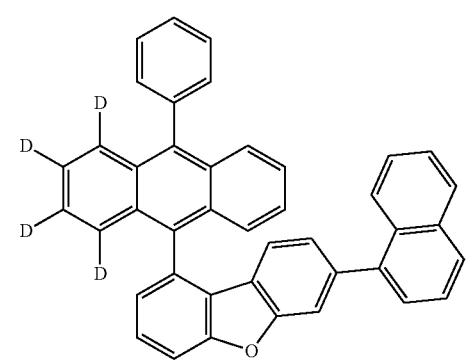
-continued
C55
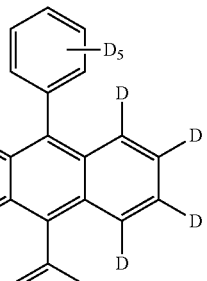
C56
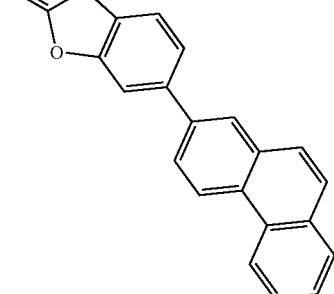
C57
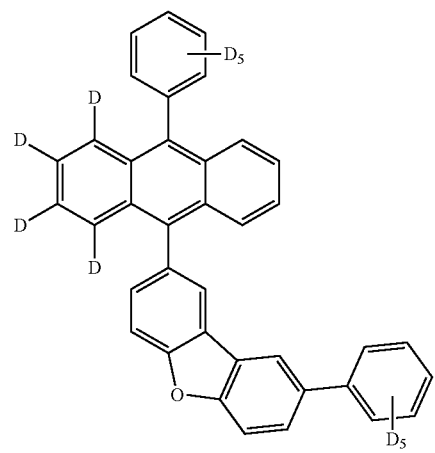

An exemplary structure of the organic electroluminescent device according to the present invention, a method for fabricating the device, and materials for the organic layers will be described below.

First, an anode material is coated on a substrate to form an anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zinc oxide (IZO), tin oxide ($SnO_2$) or zinc oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited as long as it is usually used in the art. Specific examples of such materials include 4,4',4''-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), N,N'-diphenyl-N,N'-bis[4-(phenyl-m-tolylamino)phenyl] biphenyl-4,4'-diamine (DNTPD), and hexaazatriphenylenehexacarbonitrile (HAT-CN).

The hole transport material is not specially limited as long as it is commonly used in the art. Examples of such materials include N,N'-bis(3-methylphenyl)-N,N'-diphenyl-[1,1-biphenyl]-4,4'-diamine (TPD) and N,N'-di(naphthalen-1-yl)-N,N'-diphenylbenzidine (α-NPD).

Subsequently, a hole auxiliary layer and a light emitting layer are sequentially laminated on the hole transport layer. A hole blocking layer may be optionally formed on the light emitting layer by vacuum thermal evaporation or spin coating. The hole blocking layer blocks holes from entering a cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited as long as it has the ability to transport electrons and a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, and Liq.

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic electroluminescent device.

For example, lithium (Li), magnesium (Mg), aluminum (Al), aluminum-lithium (Al—Li), calcium (Ca), magnesium-indium (Mg—In) or magnesium-silver (Mg—Ag) may be used as the cathode metal. The organic electroluminescent device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate)aluminum (Alq3), TAZ, Balq, beryllium bis(benzoquinolin-10-olate) (Bebg2), and oxadiazole derivatives such as PBD, BMD, and BND.

The light emitting layer may further include one or more host materials and one or more dopant materials, in addition to the light emitting compound.

Each of the organic layers can be formed by a monomolecular deposition or solution process. According to the monomolecular deposition process, the material for each layer is evaporated under heat and vacuum or reduced pressure to form the layer in the form of a thin film. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

The present invention will be more specifically explained with reference to the following examples. However, it will be obvious to those skilled in the art that these examples are in no way intended to limit the scope of the invention.

Synthesis Example 1. Synthesis of Compound 1

Synthesis Example 1-(1): Synthesis of Intermediate 1-a

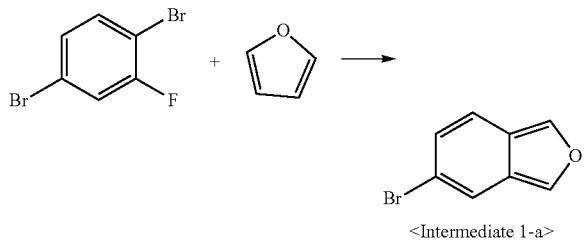

<Intermediate 1-a>

100 g (390 mmol) of 1,4-dibromo-2-fluorobenzene and toluene were placed in a round-bottom flask and cooled to −30° C., and then 270.78 mL (430 mmol) of 1.6 M n-butyllithium was added thereto. After 10 min, 29.5 g (433 mmol) of furan was slowly added. The mixture was stirred at room temperature for 1 h. After completion of the reaction, water was added for extraction. The resulting mixture was allowed to stand for layer separation. The organic layer was concentrated under reduced pressure. The concentrate was dissolved in dichloromethane. The solution was cooled to 0° C. and 46 g (197 mmol) of 3,6-di-2-pyridyl-1,2,4,5-tetrazine was slowly added thereto. The temperature was slowly raised to room temperature, followed by stirring at reflux for 2 h. After completion of the reaction, the reaction mixture was extracted. The organic layer was concentrated under reduced pressure and purified by column chromatography to afford 56.64 g of Intermediate 1-a (yield 73%).

Synthesis Example 1-(2): Synthesis of Intermediate 1-b

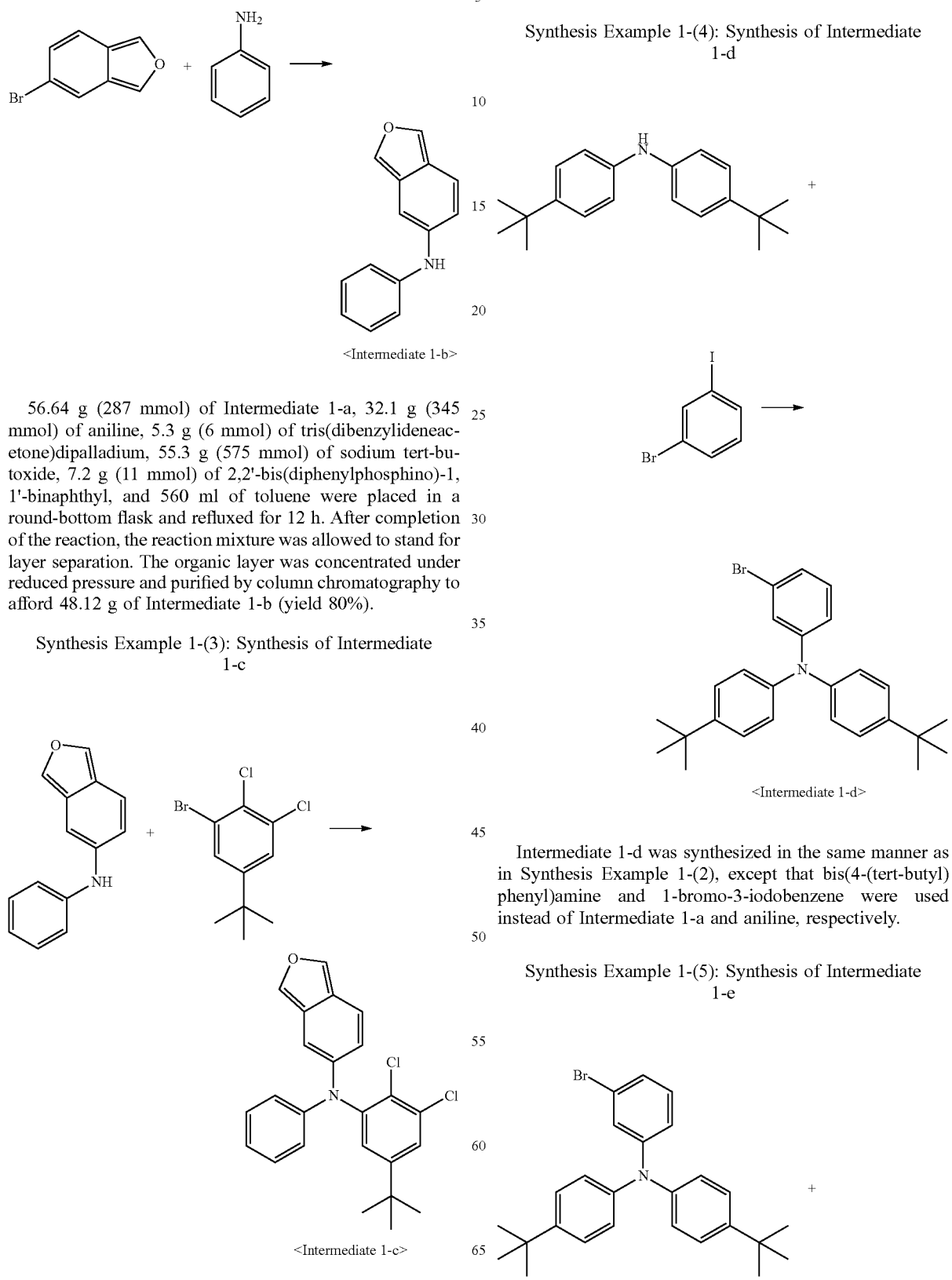

<Intermediate 1-b>

56.64 g (287 mmol) of Intermediate 1-a, 32.1 g (345 mmol) of aniline, 5.3 g (6 mmol) of tris(dibenzylideneacetone)dipalladium, 55.3 g (575 mmol) of sodium tert-butoxide, 7.2 g (11 mmol) of 2,2'-bis(diphenylphosphino)-1,1'-binaphthyl, and 560 ml of toluene were placed in a round-bottom flask and refluxed for 12 h. After completion of the reaction, the reaction mixture was allowed to stand for layer separation. The organic layer was concentrated under reduced pressure and purified by column chromatography to afford 48.12 g of Intermediate 1-b (yield 80%).

Synthesis Example 1-(3): Synthesis of Intermediate 1-c

<Intermediate 1-c>

Intermediate 1-c was synthesized in the same manner as in Synthesis Example 1-(2), except that Intermediate 1-b and 1-bromo-5-(tert-butyl)-2,3-dichlorobenzene were used instead of Intermediate 1-a and aniline, respectively.

Synthesis Example 1-(4): Synthesis of Intermediate 1-d

<Intermediate 1-d>

Intermediate 1-d was synthesized in the same manner as in Synthesis Example 1-(2), except that bis(4-(tert-butyl)phenyl)amine and 1-bromo-3-iodobenzene were used instead of Intermediate 1-a and aniline, respectively.

Synthesis Example 1-(5): Synthesis of Intermediate 1-e

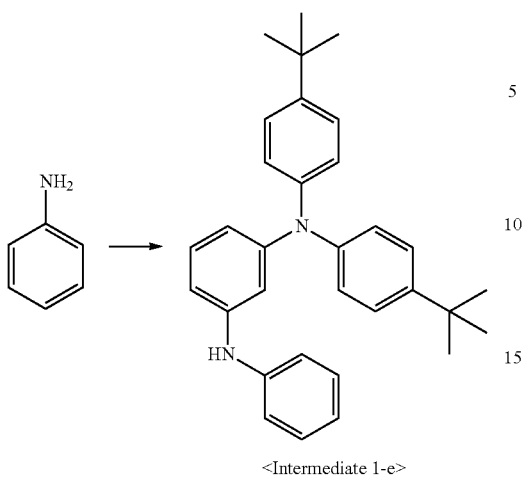

<Intermediate 1-e>

Intermediate 1-e was synthesized in the same manner as in Synthesis Example 1-(2), except that Intermediate 1-d was used instead of Intermediate 1-a.

Synthesis Example 1-(6): Synthesis of Intermediate 1-f

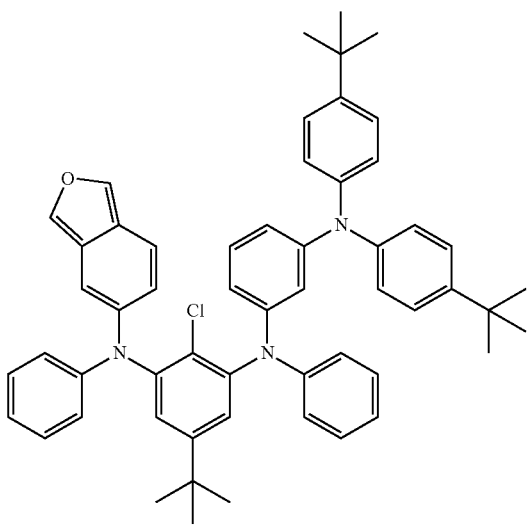

<Intermediate 1-f>

30 g (73 mmol) of Intermediate 1-c, 31.1 g (69 mmol) of Intermediate 1-e, 1.3 g (1.0 mmol) of tris(dibenzylideneacetone)dipalladium, 14.1 g (146 mmol) of sodium tert-butoxide, 0.6 g (3.0 mmol) of tri-tert-butylphosphine, and 300 ml of toluene were placed in a round-bottom flask and refluxed for 6 h. After completion of the reaction, the reaction mixture was allowed to stand for layer separation. The organic layer was concentrated under reduced pressure and purified by column chromatography to afford 50 g of Intermediate 1-f (yield 83%).

Synthesis Example 1-(7): Synthesis of Compound 1

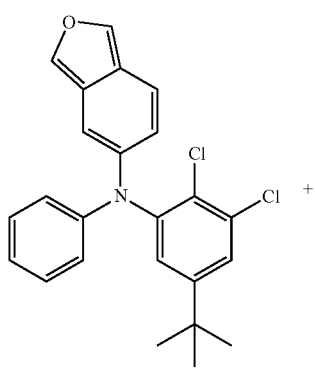

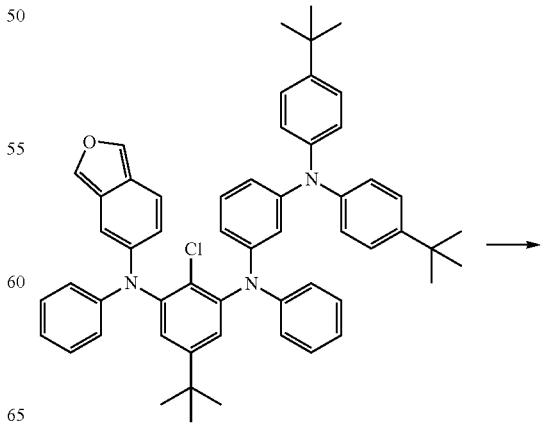

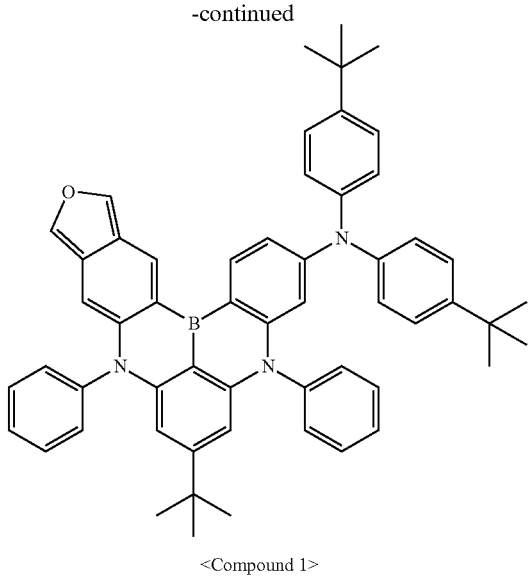

<Compound 1>

50 g (60 mmol) of Intermediate 1-f and 400 mL of tert-butylbenzene were stirred in a round-bottom flask under a nitrogen atmosphere. The mixture was cooled to −20° C. and then 89 mL (150 mmol) of 1.7 M tert-butyllithium was added dropwise thereto. After stirring at 60° C. for 3 h, the resulting mixture was cooled to −30° C. and 30 g (122 mmol) of boron tribromide was added thereto, followed by stirring at room temperature for 1 h. 15.7 g (122 mmol) of diisopropylethylamine was added and stirring was continued at 120° C. for 3 h. After completion of the reaction, the reaction mixture was allowed to stand for layer separation. The organic layer was concentrated under reduced pressure and purified by column chromatography to give 7.2 g of Compound 1 (yield 15%).

MS (MALDI-TOF): m/z 795.44 [M$^+$]

Synthesis Example 2. Synthesis of Compound 7

Synthesis Example 2-(1): Synthesis of Intermediate 2-a

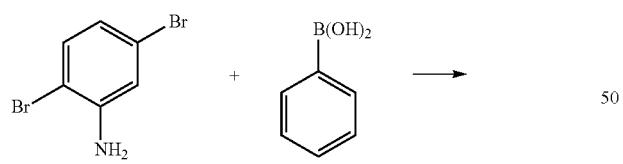

<Intermediate 2-a>

30 g (120 mmol) of 2,5-dibromoaniline, 14.6 g (120 mmol) of phenylboronic acid, 2.8 g (2.0 mmol) of tetrakis(triphenylphosphine)palladium, 33 g (239 mmol) of potassium carbonate, 150 mL of toluene, 150 mL of 1,4-dioxane, and 90 mL of water were placed in a round-bottom flask under a nitrogen atmosphere. The mixture was refluxed for 12 h. After completion of the reaction, the reaction mixture was allowed to stand for layer separation. The organic layer was concentrated under reduced pressure and purified by column chromatography to afford 25 g of Intermediate 2-a (yield 85%).

Synthesis Example 2-(2): Synthesis of Intermediate 2-b

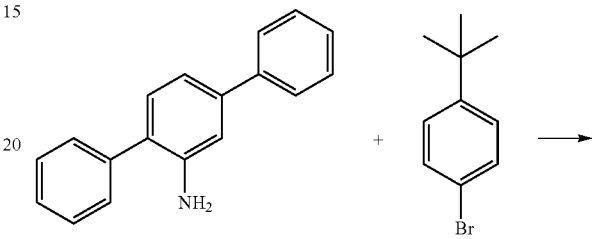

<Intermediate 2-b>

Intermediate 2-b was synthesized in the same manner as in Synthesis Example 1-(2), except that Intermediate 2-a and 1-bromo-4-tert-butylbenzene were used instead of Intermediate 1-a and aniline, respectively.

Synthesis Example 2-(3): Synthesis of Intermediate 2-c

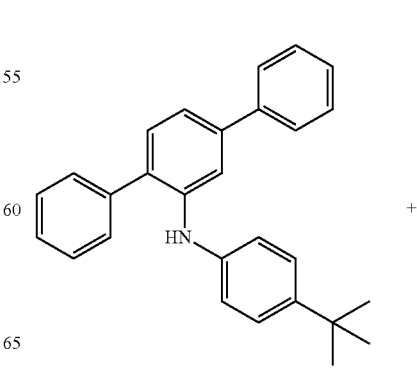

-continued

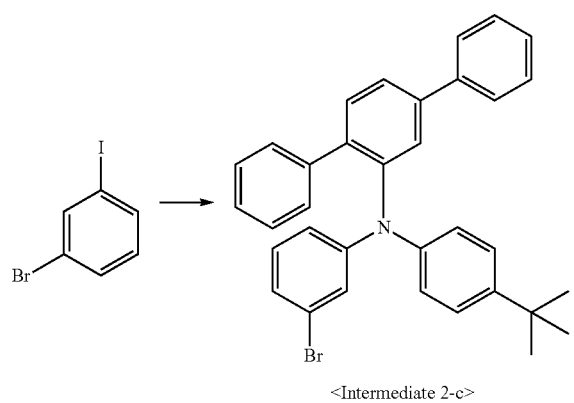

<Intermediate 2-c>

Intermediate 2-c was synthesized in the same manner as in Synthesis Example 1-(4), except that Intermediate 2-b was used instead of bis(4-(tert-butyl)phenyl)amine.

Synthesis Example 2-(4): Synthesis of Intermediate 2-d

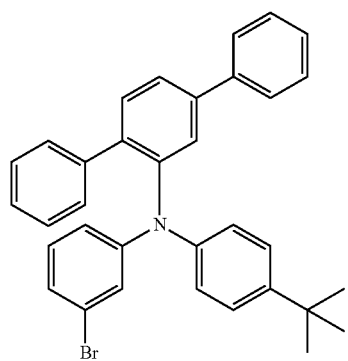

+

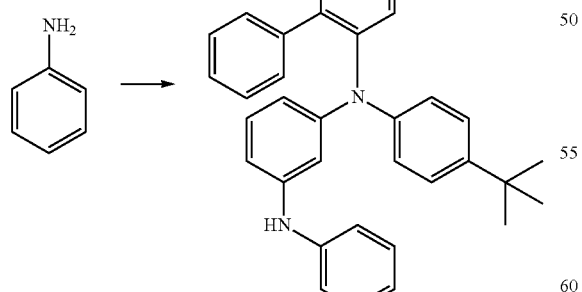

<Intermediate 2-d>

Intermediate 2-d was synthesized in the same manner as in Synthesis Example 1-(2), except that Intermediate 2-c was used instead of Intermediate 1-a.

Synthesis Example 2-(5): Synthesis of Intermediate 2-e

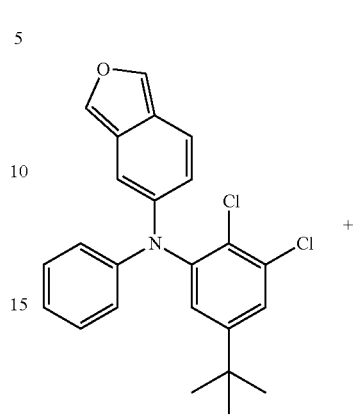

+

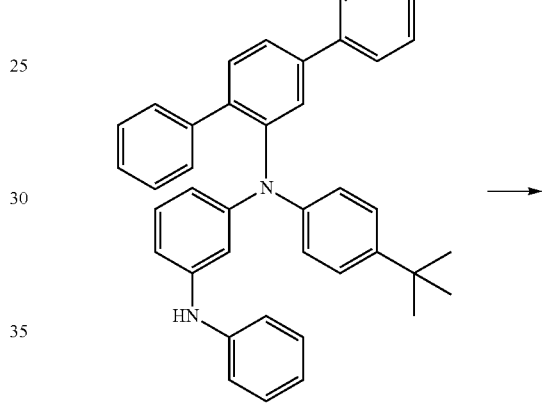

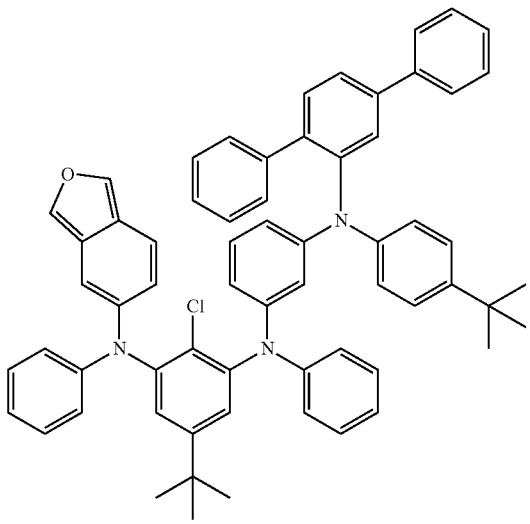

<Intermediate 2-e>

Intermediate 2-e was synthesized in the same manner as in Synthesis Example 1-(6), except that Intermediate 2-d was used instead of Intermediate 1-e.

Synthesis Example 2-(6): Synthesis of Compound 7

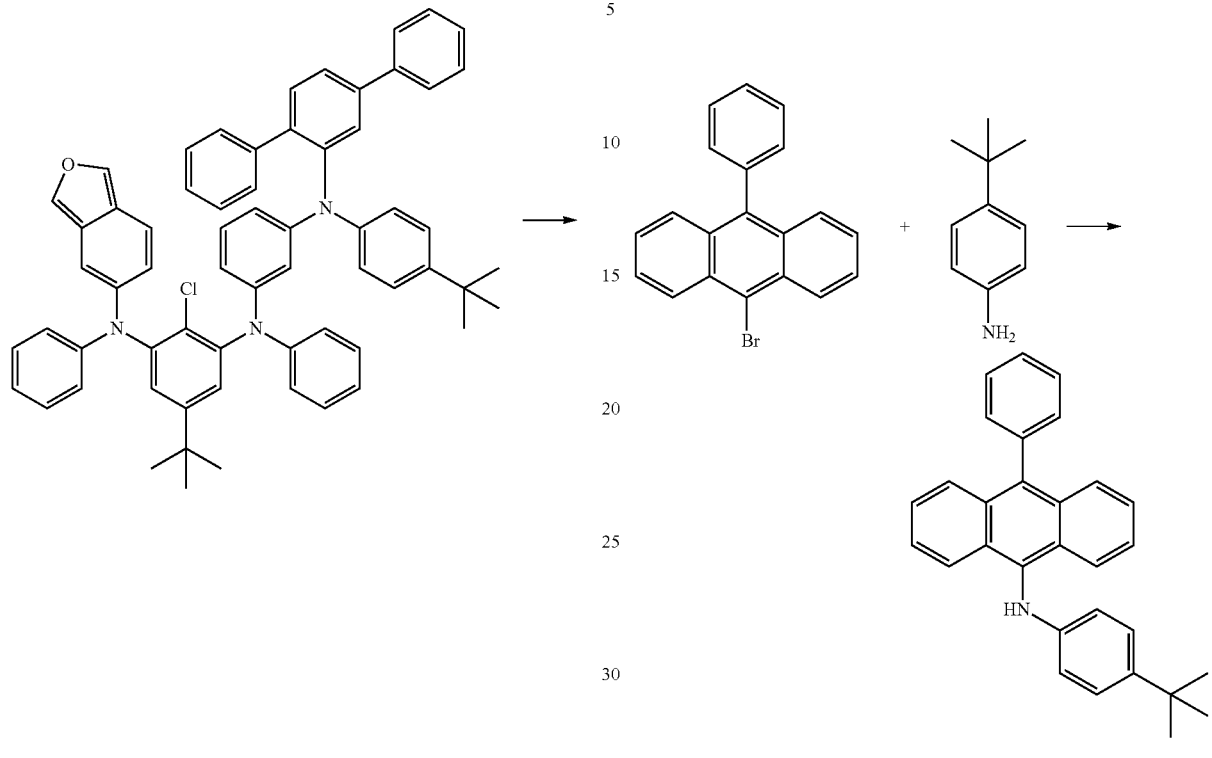

<Compound 7>

Compound 7 was synthesized in the same manner as in Synthesis Example 1-(7), except that Intermediate 2-e was used instead of Intermediate 1-f.

MS (MALDI-TOF): m/z 891.44 [M⁺]

Synthesis Example 3. Synthesis of Compound 15

Synthesis Example 3-(1): Synthesis of Intermediate 3-a

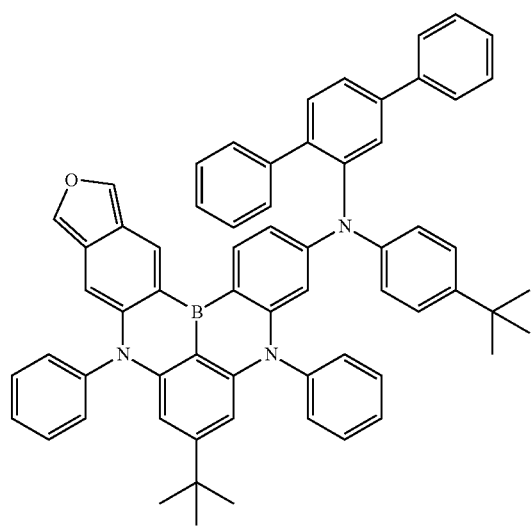

<Intermediate 3-a>

30 g (90 mmol) of 9-bromophenylanthracene, 14.8 g (99 mmol) of tert-butylaniline, 1.6 g (2.0 mmol) of tris(dibenzylideneacetone)dipalladium, 17.3 g (180 mmol) of sodium tert-butoxide, 2.2 g (4.0 mmol) of 2,2'-bis(diphenylphosphino)-1,1'-binaphthyl, and 300 mL of toluene were placed in a round-bottom flask and refluxed for 12 h. After completion of the reaction, the reaction mixture was allowed to stand for layer separation. The organic layer was concentrated under reduced pressure and purified by column chromatography to afford 26.5 g of Intermediate 3-a (yield 74%).

Synthesis Example 3-(2): Synthesis of Intermediate 3-b

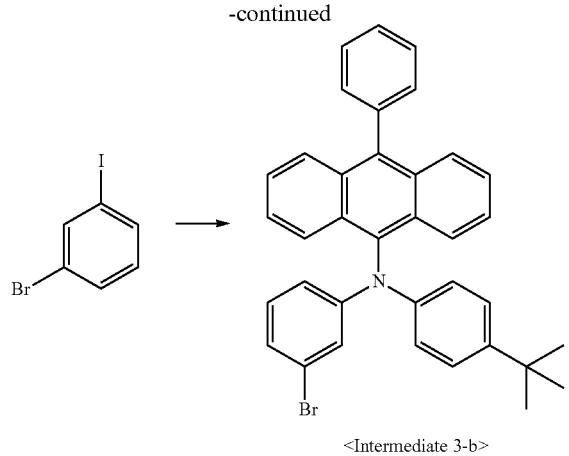

<Intermediate 3-b>

Intermediate 3-b was synthesized in the same manner as in Synthesis Example 1-(4), except that Intermediate 3-a was used instead of bis(4-(tert-butyl)phenyl)amine.

Synthesis Example 3-(3): Synthesis of Intermediate 3-c

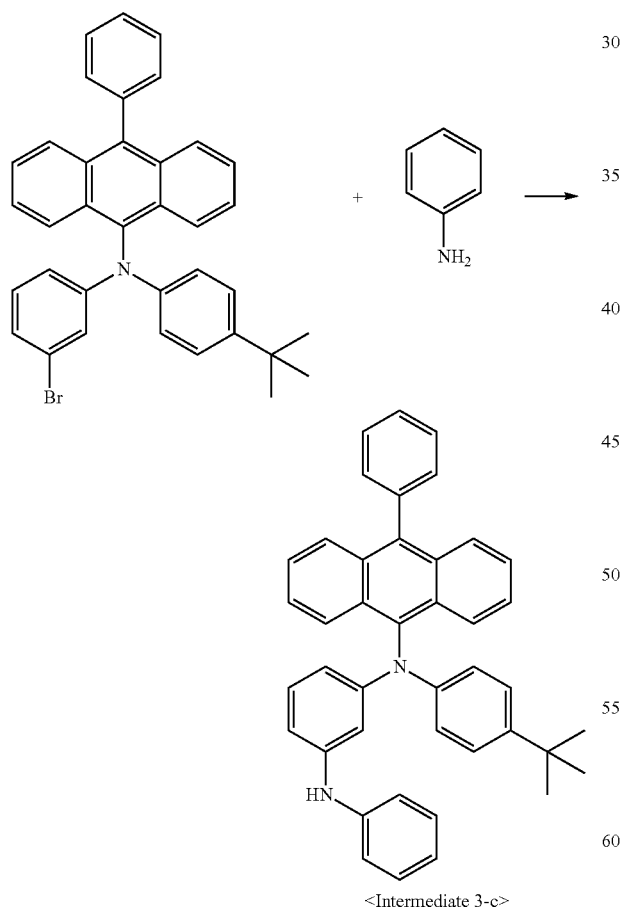

<Intermediate 3-c>

Intermediate 3-c was synthesized in the same manner as in Synthesis Example 1-(2), except that Intermediate 3-b was used instead of Intermediate 1-a.

Synthesis Example 3-(4): Synthesis of Intermediate 3-d

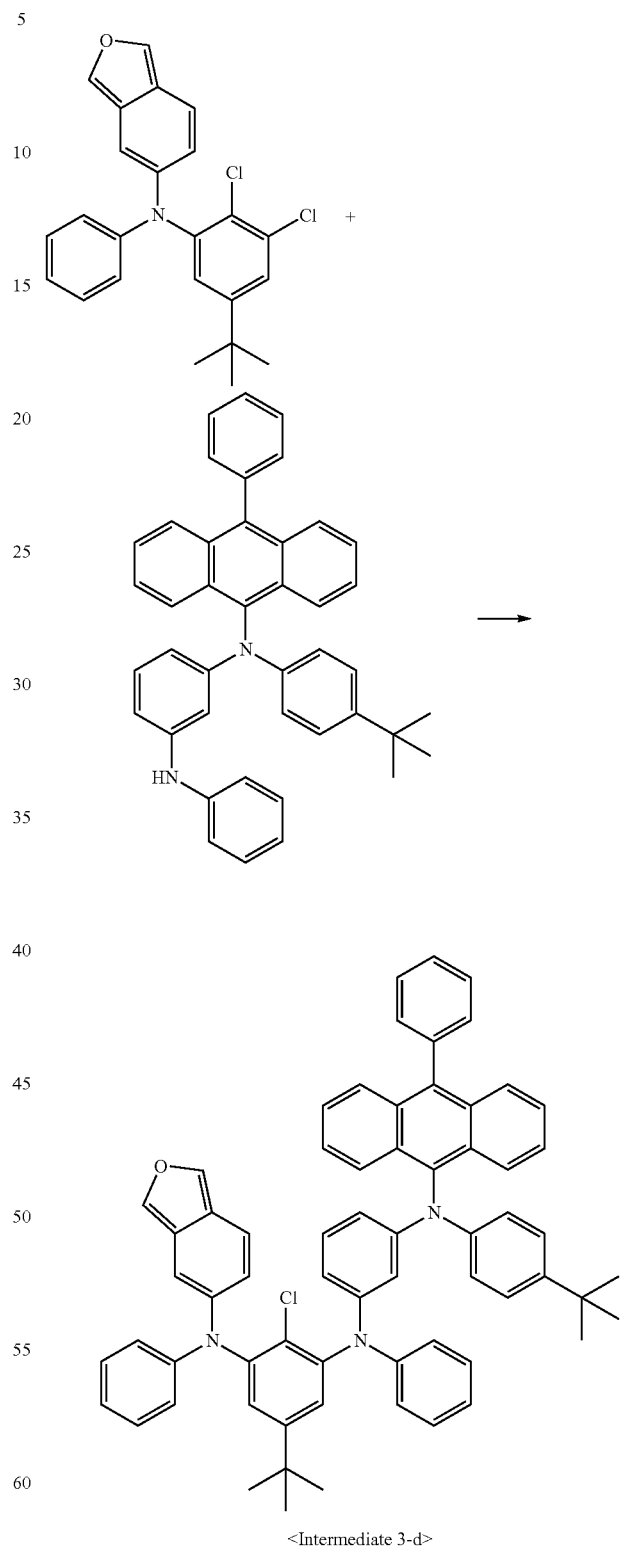

<Intermediate 3-d>

Intermediate 3-d was synthesized in the same manner as in Synthesis Example 1-(6), except that Intermediate 3-c was used instead of Intermediate 1-e.

Synthesis Example 3-(5): Synthesis of Compound 15

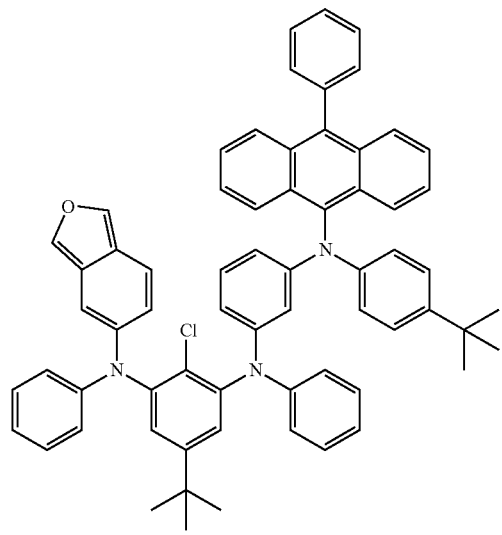

<Compound 15>

Compound 15 was synthesized in the same manner as in Synthesis Example 1-(7), except that Intermediate 3-d was used instead of Intermediate 1-f.

MS (MALDI-TOF): m/z 915.44 [M⁺]

Synthesis Example 4. Synthesis of Compound 29

Synthesis Example 4-(1): Synthesis of Intermediate 4-a

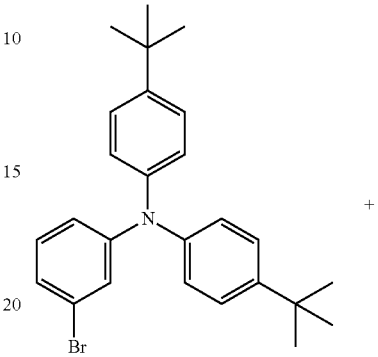

+

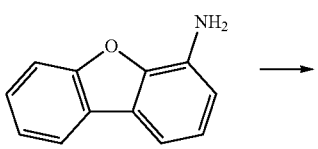

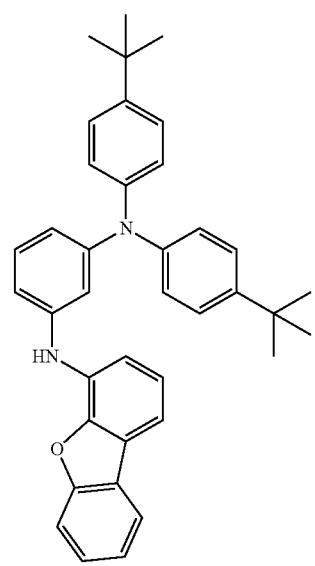

<Intermediate 4-a>

Intermediate 4-a was synthesized in the same manner as in Synthesis Example 1-(5), except that 4-dibenzofuranamine was used instead of aniline.

Synthesis Example 4-(2): Synthesis of Intermediate 4-b

Synthesis Example 4-(3): Synthesis of Compound 29

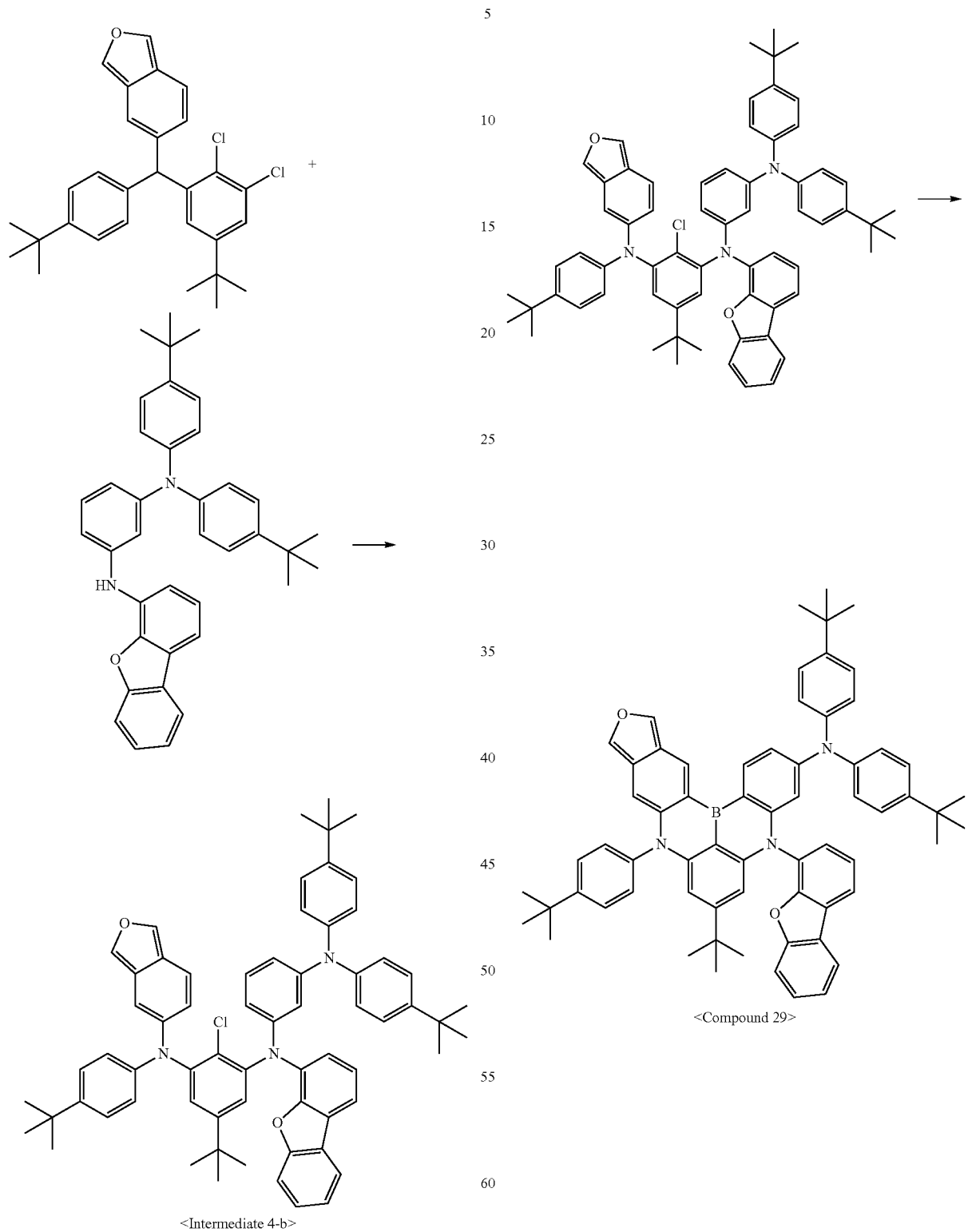

<Intermediate 4-b>

<Compound 29>

Intermediate 4-b was synthesized in the same manner as in Synthesis Example 1-(6), except that Intermediate 4-a was used instead of Intermediate 1-e.

Compound 29 was synthesized in the same manner as in Synthesis Example 1-(7), except that Intermediate 4-b was used instead of Intermediate 1-f.

MS (MALDI-TOF): m/z 941.51 [M⁺]

Synthesis Example 5. Synthesis of Compound 52

Synthesis Example 5-(1): Synthesis of Intermediate 5-a

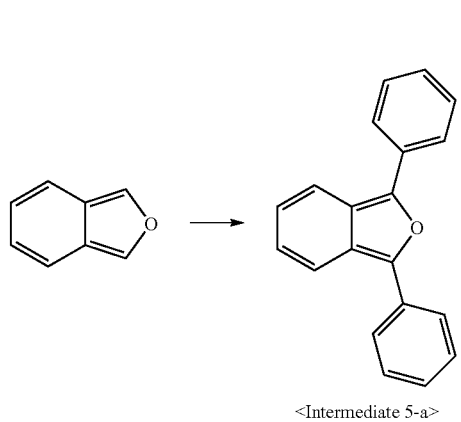 [SMILES: c1ccc2cocc2c1 ; c1ccc(-c2oc(-c3ccccc3)c3ccccc23)cc1]

<Intermediate 5-a>

Intermediate 5-a was synthesized in the same manner as in Synthesis Example 1-(1), except that isobenzofuran was used instead of furan and iodobenzene and tetrahydrofuran were used instead of 1,4-dibromo-2-fluorobenzene and toluene, respectively.

Synthesis Example 5-(2): Synthesis of Intermediate 5-b

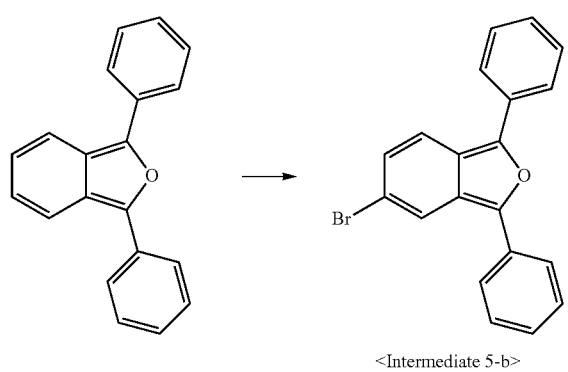 [SMILES: c1ccc(-c2oc(-c3ccccc3)c3ccccc23)cc1 ; Brc1ccc2c(-c3ccccc3)oc(-c3ccccc3)c2c1]

<Intermediate 5-b>

50 g (185 mmol) of Intermediate 5-a, 32.9 g (185 mmol) of N-bromosuccinimide, and 500 mL of dimethylformamide were placed in a round-bottom flask under a nitrogen atmosphere and stirred at room temperature for 12 h. After completion of the reaction, the reaction mixture was allowed to stand for layer separation. The organic layer was concentrated under reduced pressure and purified by column chromatography to afford 55 g of Intermediate 5-b (yield 85%).

Synthesis Example 5-(3): Synthesis of Intermediate 5-c

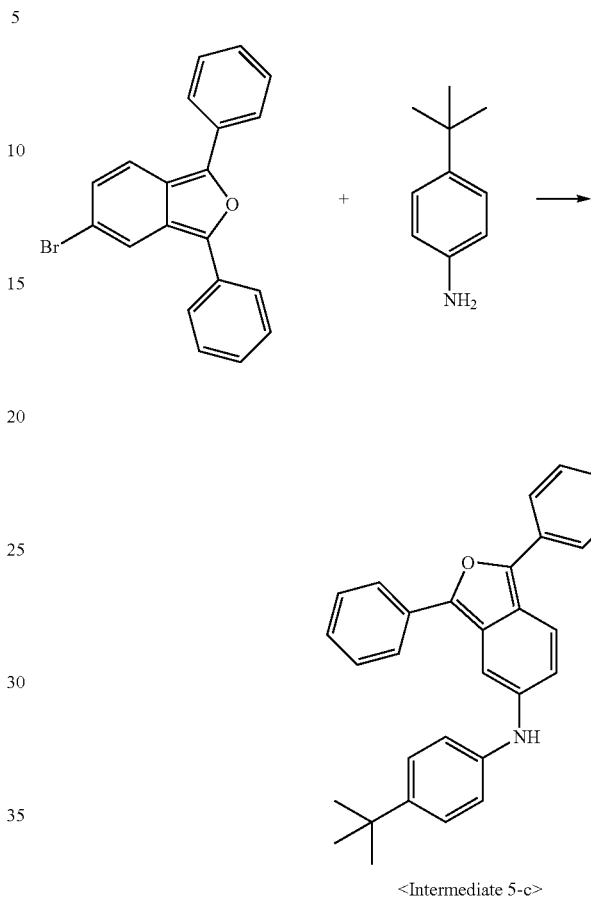

<Intermediate 5-c>

Intermediate 5-c was synthesized in the same manner as in Synthesis Example 1-(2), except that Intermediate 5-b and 4-tert-butylaniline were used instead of Intermediate 1-a and aniline, respectively.

Synthesis Example 5-(4): Synthesis of Intermediate 5-d

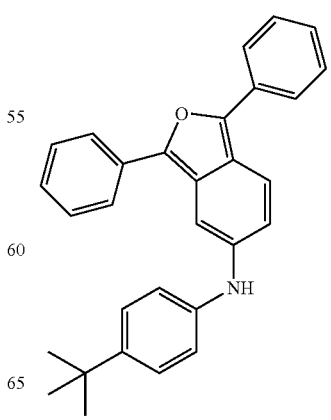

+

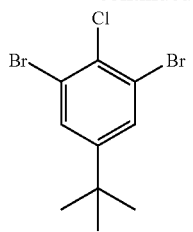

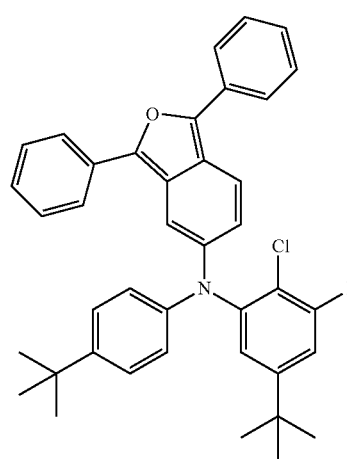

<Intermediate 5-d>

Intermediate 5-d was synthesized in the same manner as in Synthesis Example 1-(3), except that Intermediate 5-c and 1,3-bromo-5-(tert-butyl)-2-chlorobenzene were used instead of Intermediate 1-b and 1-bromo-5-(tert-butyl)-2,3-dichlorobenzene, respectively.

Synthesis Example 5-(5): Synthesis of Intermediate 5-e

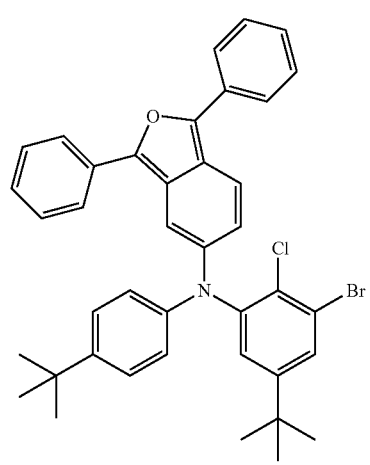

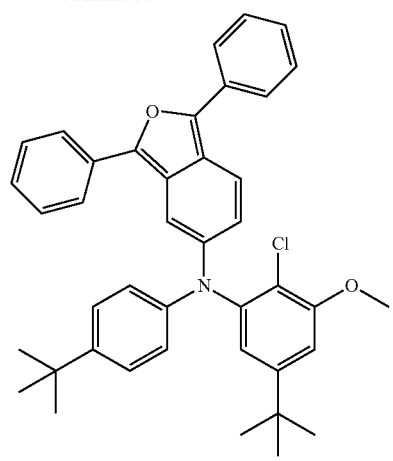

<Intermediate 5-e>

50 g (75 mmol) of Intermediate 5-d, 24.5 mL (452 mmol) of sodium methoxide, 4.3 g (23 mmol) of copper(I) iodide, and 500 mL of dimethylformamide were placed in a round-bottom flask under a nitrogen atmosphere and refluxed with stirring for 12 h. After completion of the reaction, the reaction mixture was allowed to stand for layer separation. The organic layer was concentrated under reduced pressure and purified by column chromatography to afford 32 g of Intermediate 5-e (yield 71%).

Synthesis Example 5-(6): Synthesis of Intermediate 5-f

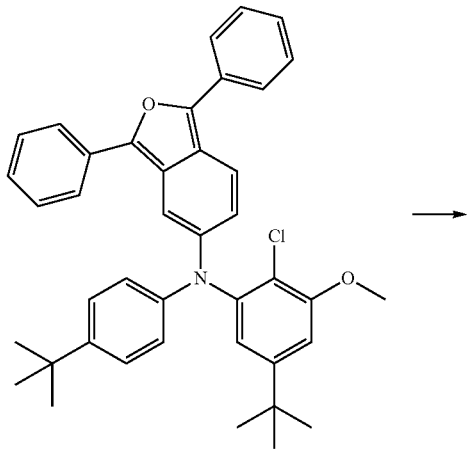

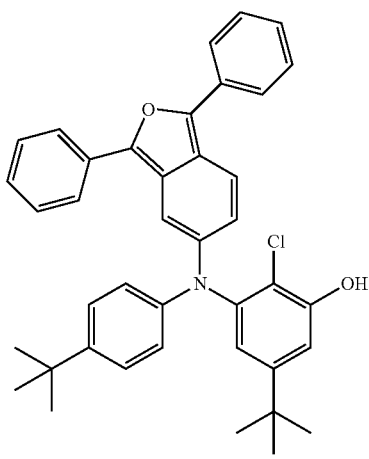

<Intermediate 5-f>

32 g (52 mmol) of Intermediate 5-e and 300 mL of dichloromethane were placed in a round-bottom flask and a dilute solution of boron tribromide (13.2 g, 52 mmol) in dichloromethane (300 mL) was slowly added dropwise thereto at 0° C. The mixture was stirred at room temperature for 6 h. After the reaction was completed, the reaction mixture was allowed to stand for layer separation. The organic layer was concentrated under reduced pressure and purified by column to afford 21 g of Intermediate 5-f (yield 65%).

Synthesis Example 5-(7): Synthesis of Intermediate 5-g

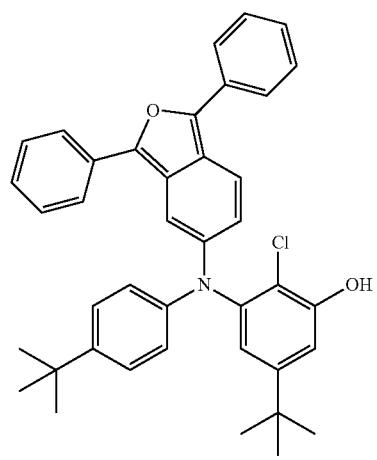 +

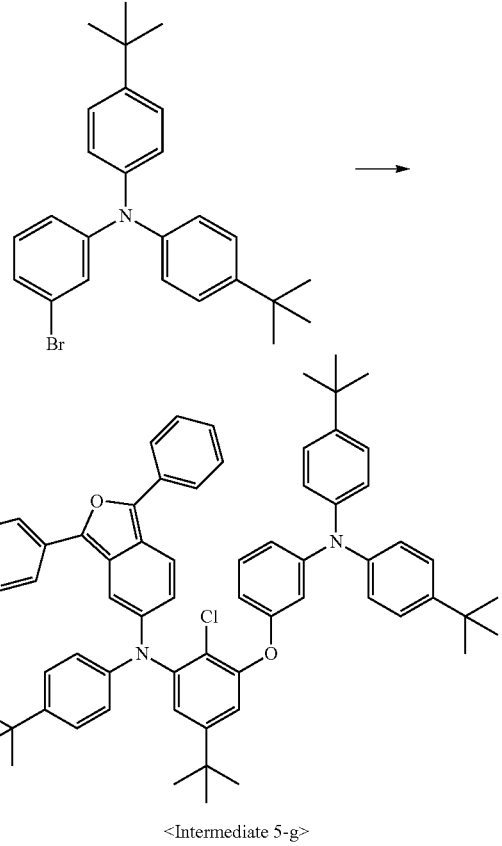

<Intermediate 5-g>

20 g (33 mmol) of Intermediate 5-f, 14.5 g (33 mmol) of Intermediate 1-d, 0.3 g (2 mmol) copper(I) iodide, 0.3 g (2 mmol) of iron(III) acetylacetonate, 9 g (65 mmol) of potassium carbonate, and 200 mL of dimethylformamide were placed in a round-bottom flask and refluxed with stirring under a nitrogen atmosphere for 24 h. After completion of the reaction, the reaction mixture was allowed to stand for layer separation. The organic layer was concentrated under reduced pressure and purified by column chromatography to afford 27 g of Intermediate 5-g (yield 85%).

Synthesis Example 5-(8): Synthesis of Compound 52

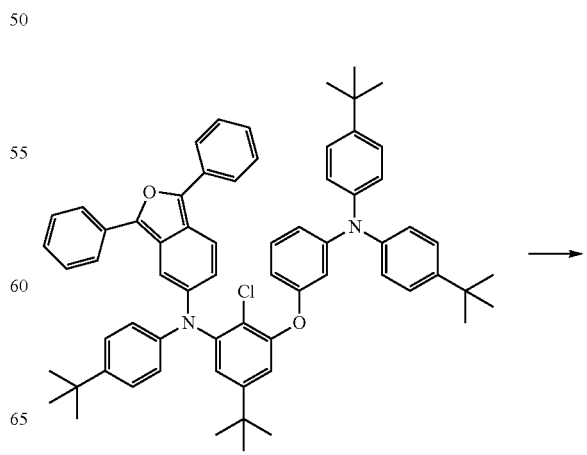

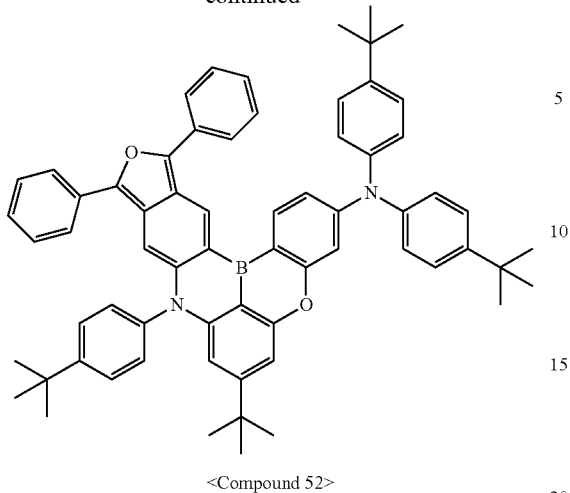

<Compound 52>

Compound 52 was synthesized in the same manner as in Synthesis Example 1-(7), except that Intermediate 5-g was used instead of Intermediate 1-f.

MS (MALDI-TOF): m/z 928.51 [M$^+$]

Synthesis Example 6. Synthesis of Compound 79

Synthesis Example 6-(1): Synthesis of Intermediate 6-a

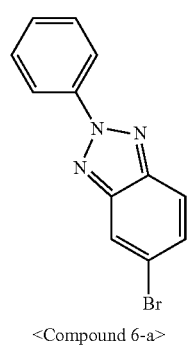

<Compound 6-a>

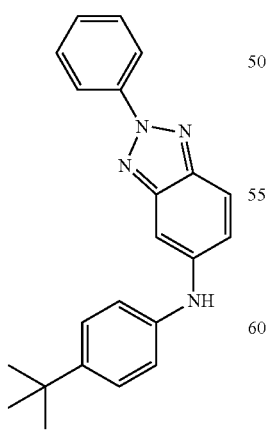

<Intermediate 6-a>

Intermediate 6-a was synthesized in the same manner as in Synthesis Example 1-(2), except that Compound 6-a and 4-tert-butylaniline were used instead of Intermediate 1-a and aniline, respectively.

Synthesis Example 6-(2): Synthesis of Intermediate 6-b

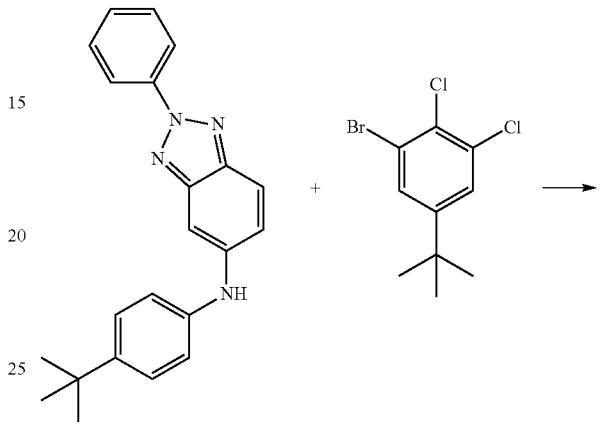

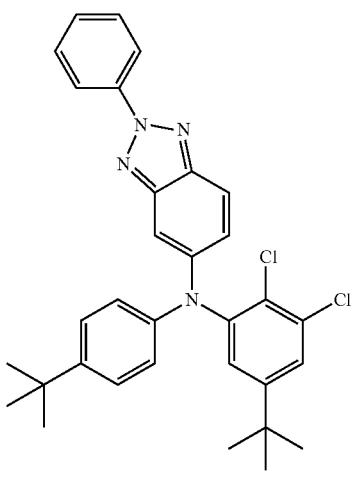

<Intermediate 6-b>

Intermediate 6-b was synthesized in the same manner as in Synthesis Example 1-(3), except that Intermediate 6-a was used instead of Intermediate 1-b.

Synthesis Example 6-(3): Synthesis of Intermediate 6-c

Synthesis Example 6-(4): Synthesis of Compound 79

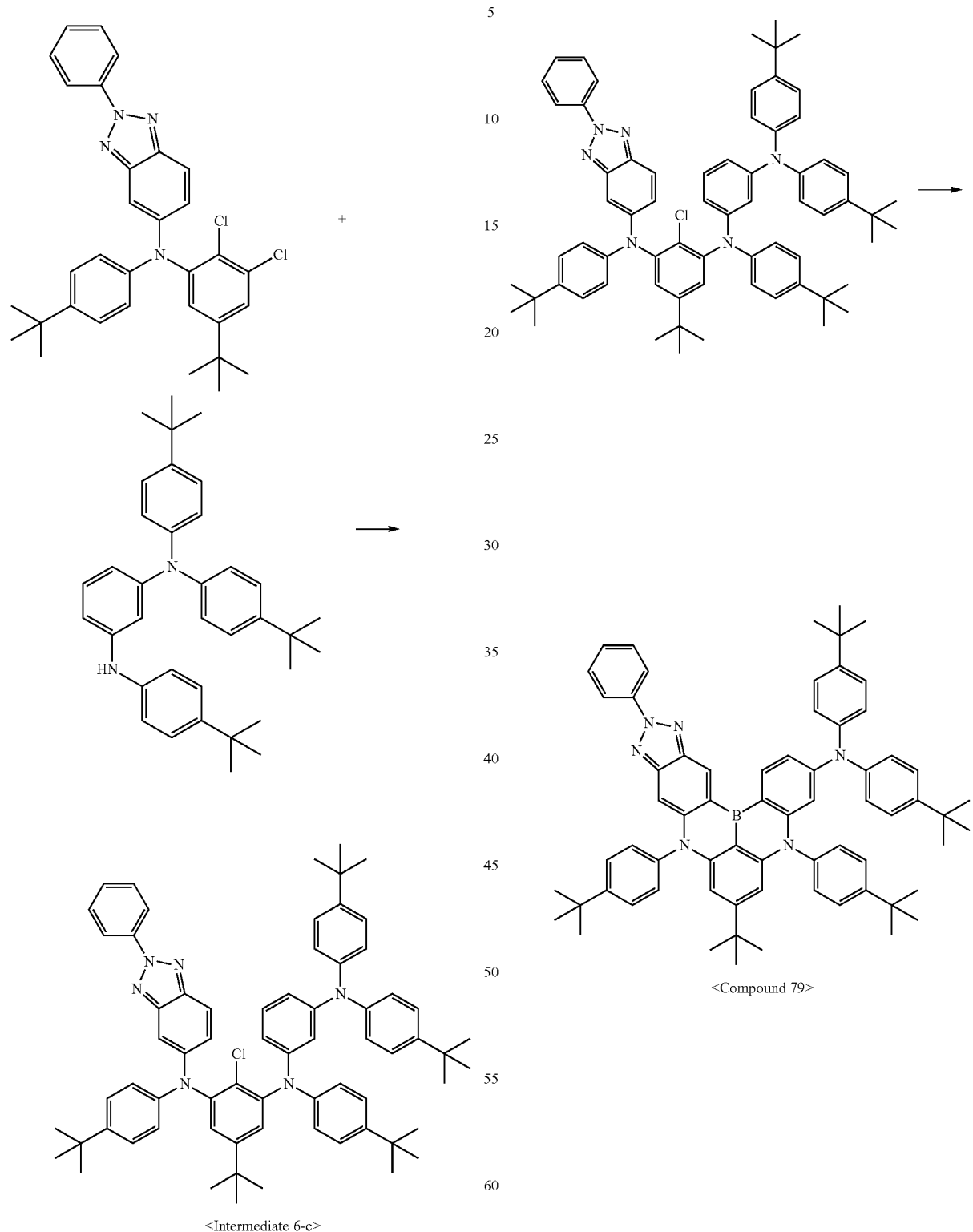

<Intermediate 6-c>

<Compound 79>

Intermediate 6-c was synthesized in the same manner as in Synthesis Example 1-(6), except that Intermediate 6-b was used instead of Intermediate 1-c.

Compound 79 was synthesized in the same manner as in Synthesis Example 1-(7), except that Intermediate 6-c was used instead of Intermediate 1-f.

MS (MALDI-TOF): m/z 984.60 [M$^+$]

Synthesis Example 7. Synthesis of Compound 103

Synthesis Example 7-(1): Synthesis of Intermediate 7-a

Synthesis Example 7-(2): Synthesis of Intermediate 7-b

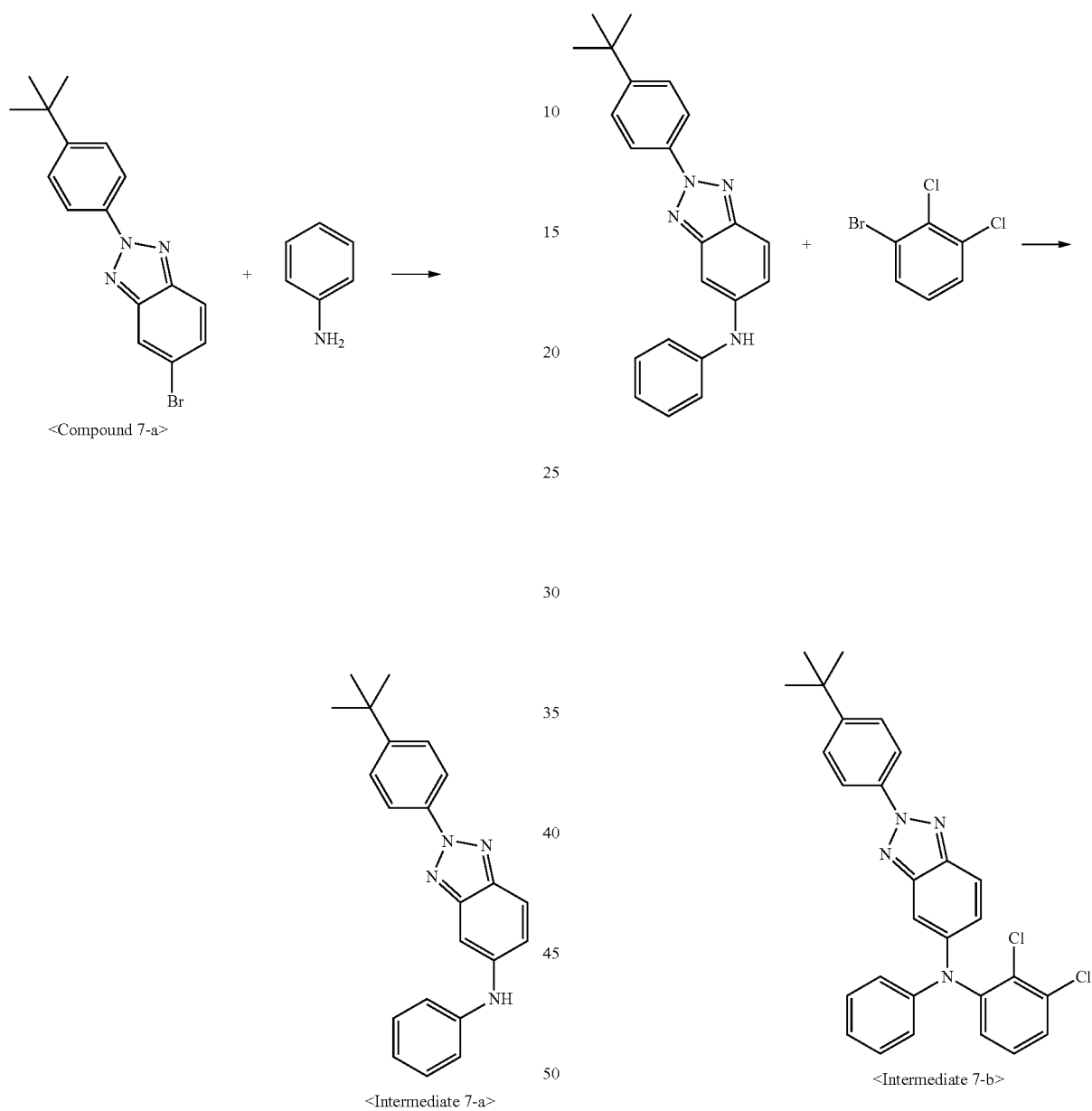

Intermediate 7-a was synthesized in the same manner as in Synthesis Example 1-(2), except that Compound 7-a was used instead of Intermediate 1-a.

Intermediate 7-b was synthesized in the same manner as in Synthesis Example 1-(3), except that Intermediate 7-a and 1-bromo-2,3-dichlorobenzene were used instead of Intermediate 7-b and 1-bromo-5-(tert-butyl)-2,3-dichlorobenzene, respectively.

Synthesis Example 7-(3): Synthesis of Intermediate 7-c

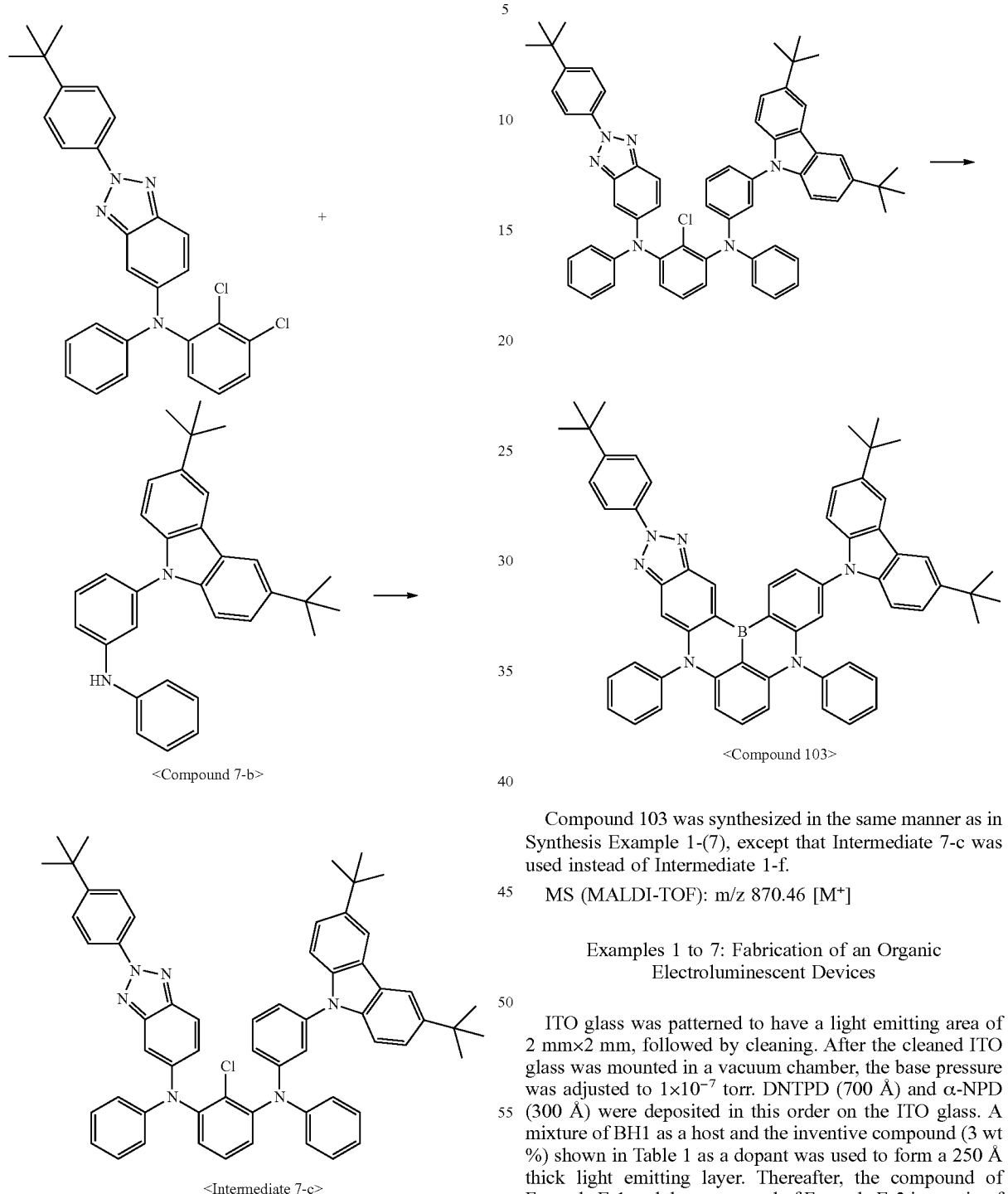

<Compound 7-b>

<Intermediate 7-c>

Intermediate 7-c was synthesized in the same manner as in Synthesis Example 1-(6), except that Intermediate 7-b and Compound 7-b were used instead of Intermediate 1-c and Intermediate 1-e, respectively.

Synthesis Example 7-(4): Synthesis of Compound 103

<Compound 103>

Compound 103 was synthesized in the same manner as in Synthesis Example 1-(7), except that Intermediate 7-c was used instead of Intermediate 1-f.

MS (MALDI-TOF): m/z 870.46 [M$^+$]

Examples 1 to 7: Fabrication of an Organic Electroluminescent Devices

ITO glass was patterned to have a light emitting area of 2 mm×2 mm, followed by cleaning. After the cleaned ITO glass was mounted in a vacuum chamber, the base pressure was adjusted to $1 \times 10^{-7}$ torr. DNTPD (700 Å) and α-NPD (300 Å) were deposited in this order on the ITO glass. A mixture of BH1 as a host and the inventive compound (3 wt %) shown in Table 1 as a dopant was used to form a 250 Å thick light emitting layer. Thereafter, the compound of Formula E-1 and the compound of Formula E-2 in a ratio of 1:1 were used to form a 300 Å thick electron transport layer on the light emitting layer. The compound of Formula E-1 was used to form a 5 Å thick electron injecting layer on the electron transport layer. Al was deposited on the electron injecting layer to form a 1000 Å thick Al electrode, completing the fabrication of an organic electroluminescent device. The luminescent properties of the organic electroluminescent device were measured at 0.4 mA.

[DNTPD]
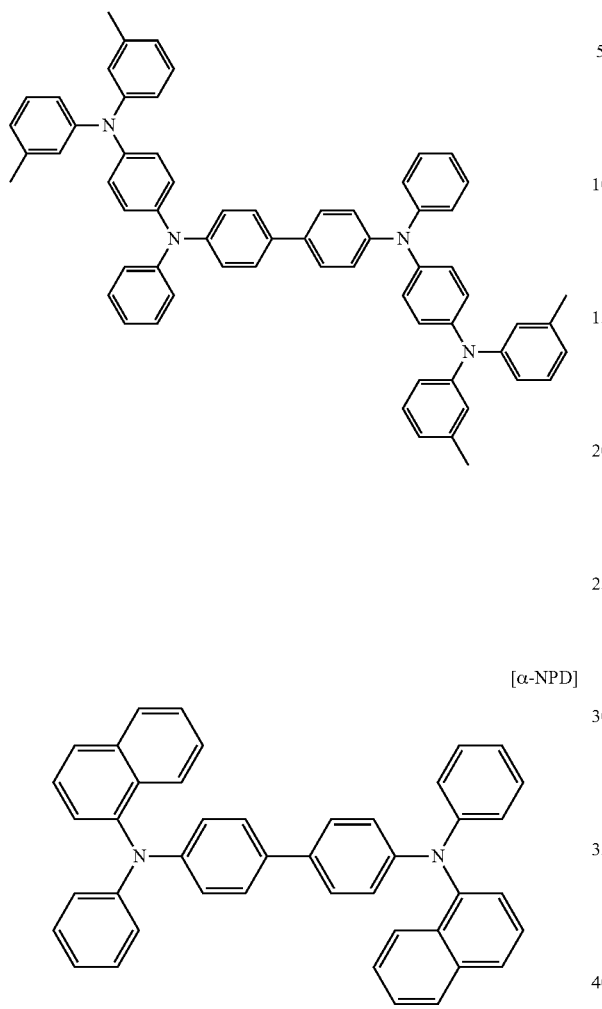
[α-NPD]
[BH1]
[Formula E-1]
[Formula E-2]
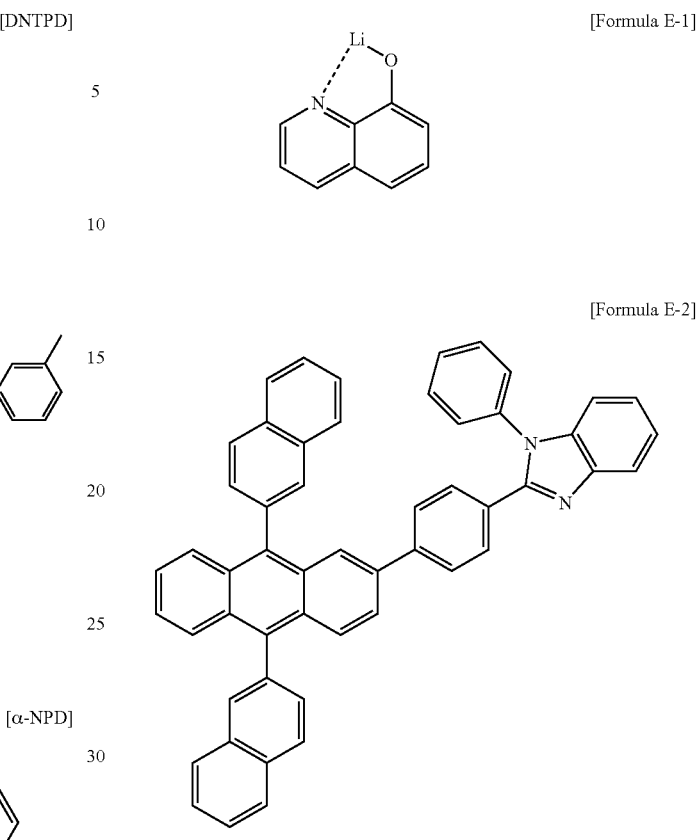
Comparative Examples 1-3
Organic electroluminescent devices were fabricated in the same manner as in Examples 1-7, except that BD1, BD2 or BD3 was used instead of the inventive dopant compound. The luminescent properties of the organic electroluminescent devices were measured at 0.4 mA. The structures of BD1, BD2, and BD3 are as follow:
[BD1]
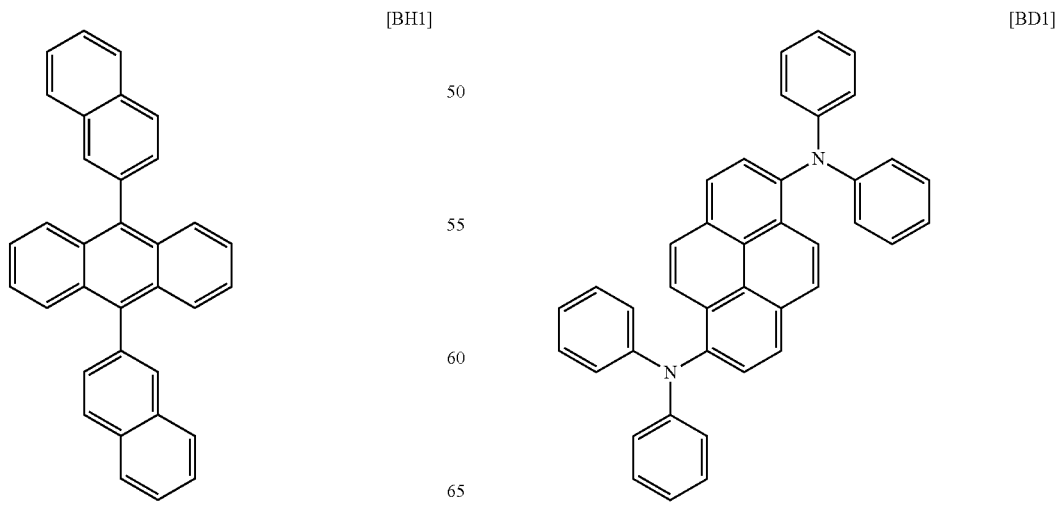

[BD2]

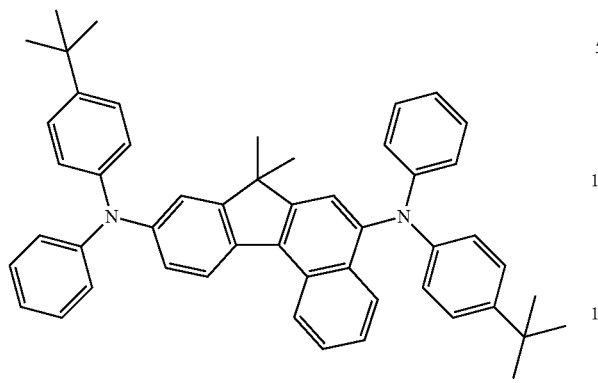

[BD3]

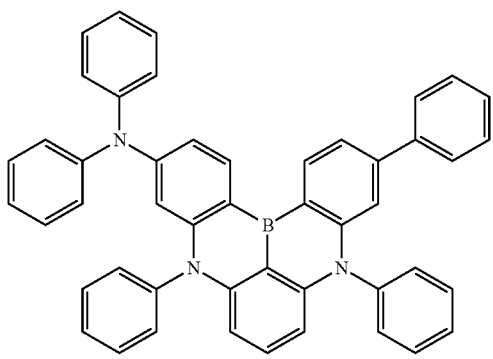

TABLE 1

| Example No. | Dopant | Current density (mA/cm²) | Voltage (V) | External quantum efficiency (%) |
|---|---|---|---|---|
| Example 1 | Formula 1 | 10 | 3.74 | 9.1 |
| Example 2 | Formula 7 | 10 | 3.78 | 9.0 |
| Example 3 | Formula 15 | 10 | 3.78 | 8.8 |
| Example 4 | Formula 29 | 10 | 3.77 | 9.2 |
| Example 5 | Formula 52 | 10 | 3.76 | 9.3 |
| Example 6 | Formula 79 | 10 | 3.77 | 8.9 |
| Example 7 | Formula 103 | 10 | 3.79 | 9.0 |
| Comparative Example 1 | BD1 | 10 | 4.10 | 7.3 |
| Comparative Example 2 | BD2 | 10 | 4.07 | 7.2 |
| Comparative Example 3 | BD3 | 10 | 3.87 | 7.7 |

As can be seen from the results in Table 1, the organic electroluminescent devices of Examples 1-7, each of which employed the inventive compound for the light emitting layer, were driven at low voltages and showed high quantum efficiencies compared to the organic electroluminescent devices of Comparative Examples 1-3, each of which employed the dopant compound BD1, BD2 or BD3.

What is claimed is:

1. An organic electroluminescent compound represented by Formula A:

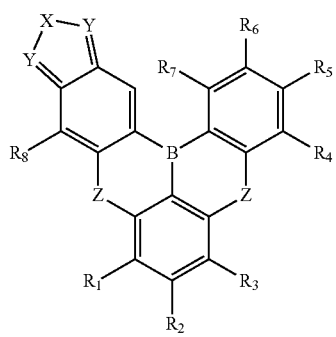

(A)

wherein X is O, S or $NR_9$, each Y is $CR_{10}$ or N, each Z is independently $CR_{11}R_{12}$, $NR_{13}$, O or S, $R_1$ to $R_{13}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylsilyl, substituted or unsubstituted $C_6$-$C_{30}$ arylsilyl, nitro, cyano, halogen, and —$N(R_{14})(R_{15})$, with the proviso that $R_{11}$ to $R_{13}$ are each independently optionally bonded to $R_1$ and $R_8$ or $R_3$ and $R_4$ to form an alicyclic or aromatic monocyclic or polycyclic ring and that $R_{11}$ and $R_{12}$ are optionally linked to each other to form an alicyclic or aromatic monocyclic or polycyclic ring, and $R_{14}$ and $R_{15}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, and substituted or unsubstituted $C_2$-$C_{50}$ heteroaryl, with the proviso that $R_{14}$ and $R_{15}$ are optionally linked to each other to form an alicyclic or aromatic monocyclic or polycyclic ring, the "substituted" in the definition of "substituted or unsubstituted" indicating substitution with one or more substituents selected from the group consisting of deuterium, cyano, halogen, hydroxyl, nitro, $C_1$-$C_{24}$ alkyl, $C_1$-$C_{24}$ haloalkyl, $C_2$-$C_{24}$ alkenyl, $C_2$-$C_{24}$ alkynyl, $C_1$-$C_{24}$ heteroalkyl, $C_3$-$C_{24}$ cycloalkyl, $C_6$-$C_{24}$ aryl, $C_7$-$C_{24}$ arylalkyl, $C_7$-$C_{24}$ alkylaryl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_6$-$C_{24}$ arylamino, $C_1$-$C_{24}$ heteroarylamino, $C_1$-$C_{24}$ alkylsilyl, $C_6$-$C_{24}$ arylsilyl, and $C_6$-$C_{24}$ aryloxy.

2. The organic electroluminescent compound according to claim 1, wherein Z is $NR_{13}$.

3. The organic electroluminescent compound according to claim 1, wherein at least one of $R_1$ to $R_8$ is —$N(R_{14})(R_{15})$.

4. The organic electroluminescent compound according to claim 3, wherein the —N(R$_{14}$)(R$_{15}$) is represented by Structure A:

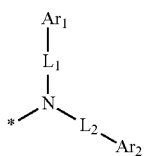

(Structure A)

wherein L$_1$ and L$_2$ are identical to or different from each other and are each independently a single bond or substituted or unsubstituted C$_6$-C$_{18}$ arylene and Ar$_1$ and Ar$_2$ are identical to or different from each other and are each independently selected from substituted or unsubstituted C$_1$-C$_{15}$ alkyl, substituted or unsubstituted C$_6$-C$_{18}$ aryl, substituted or unsubstituted C$_3$-C$_{15}$ cycloalkyl, and substituted or unsubstituted C$_2$-C$_{18}$ heteroaryl, with the proviso that Ar$_1$ and Ar$_2$ are optionally linked to each other to form an alicyclic or aromatic monocyclic or polycyclic ring.

5. The organic electroluminescent compound according to claim 1, wherein at least one of R$_1$ to R$_8$ is substituted or unsubstituted C$_1$-C$_{30}$ alkyl or substituted or unsubstituted C$_3$-C$_{30}$ cycloalkyl.

6. The organic electroluminescent compound according to claim 1, wherein the compound represented by Formula A is selected from the following compounds:

1

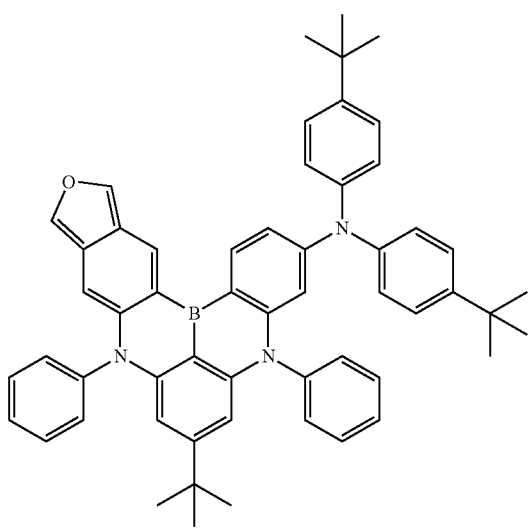

2

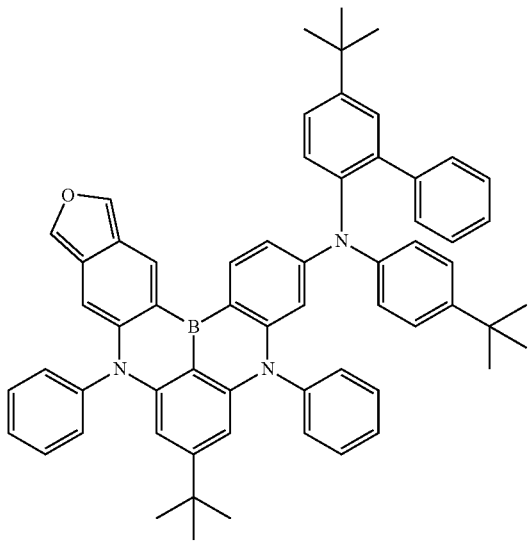

3

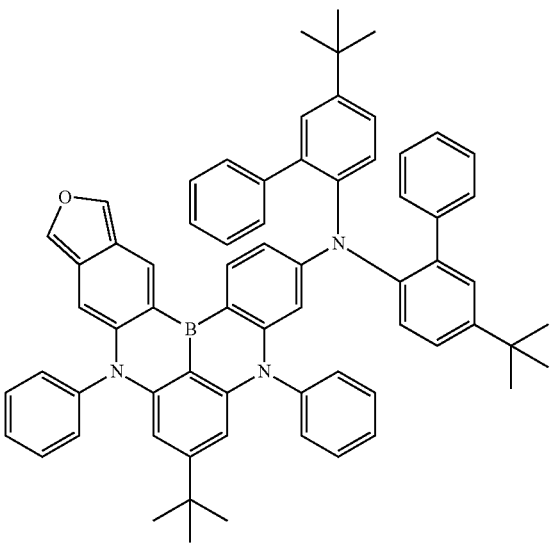

4

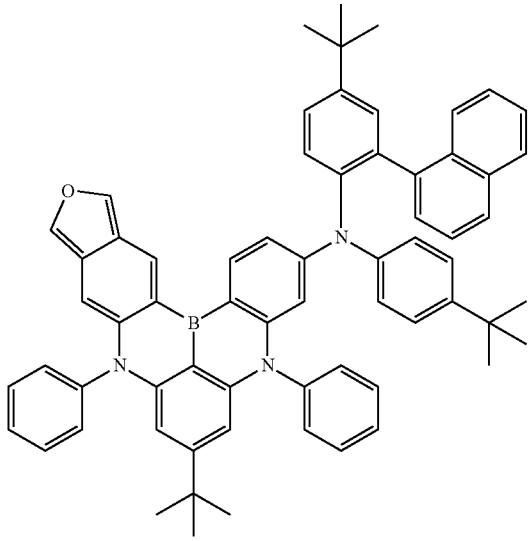

101
-continued
5
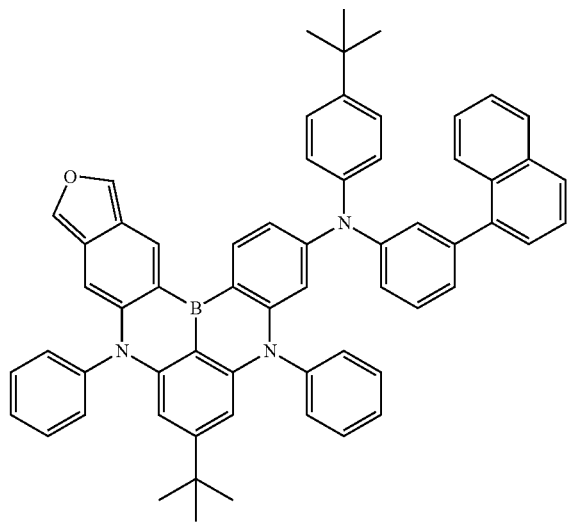
6
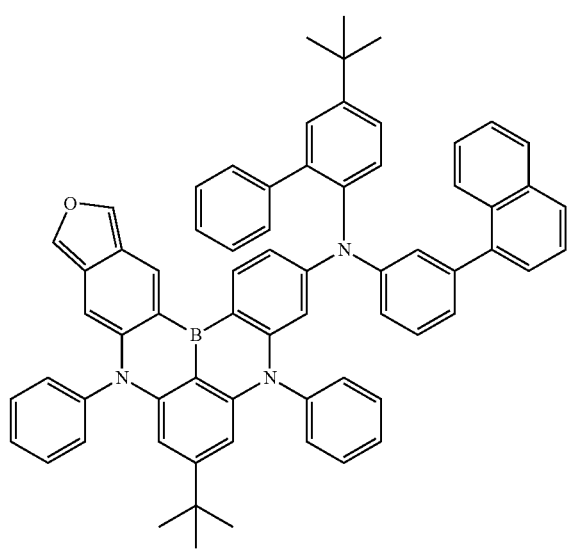
7
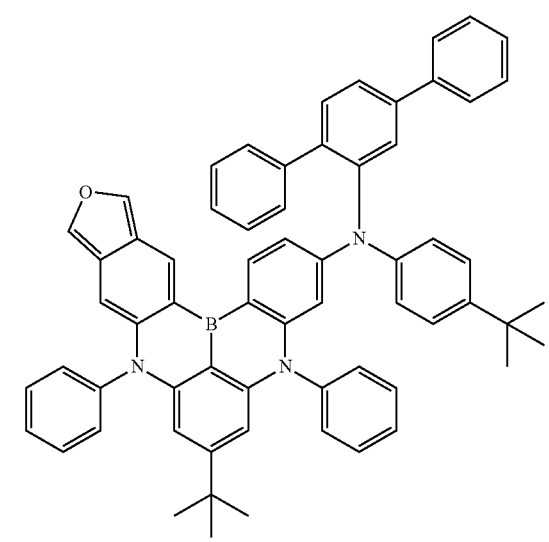
102
-continued
8
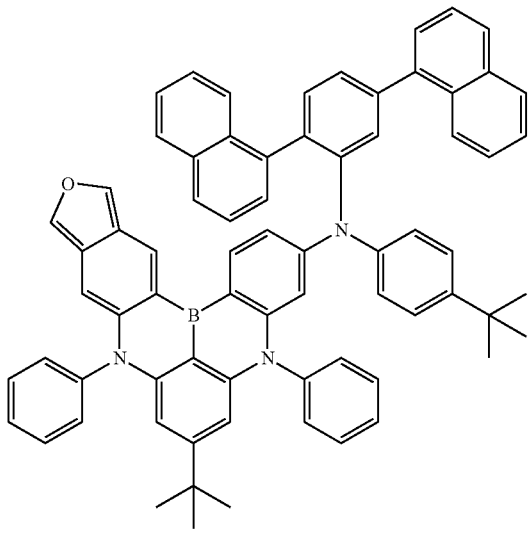
9
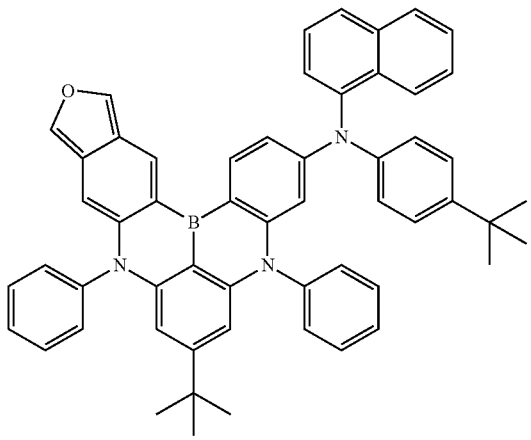
10
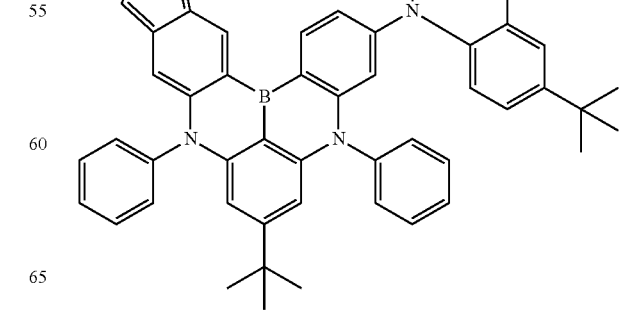

103
-continued
11
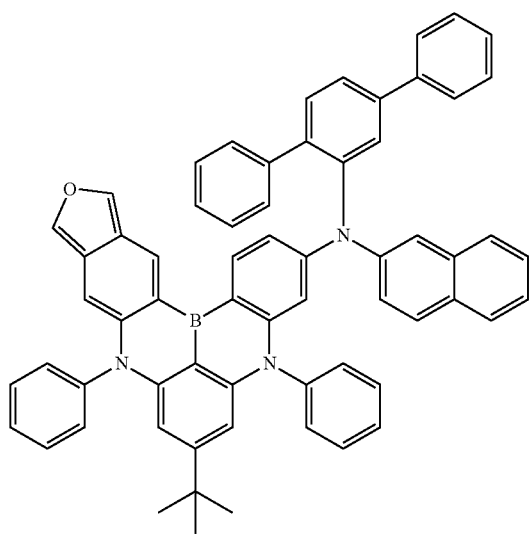
12
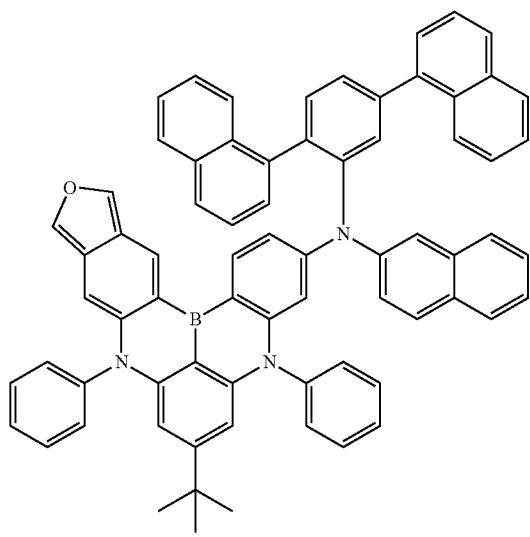
104
-continued
13
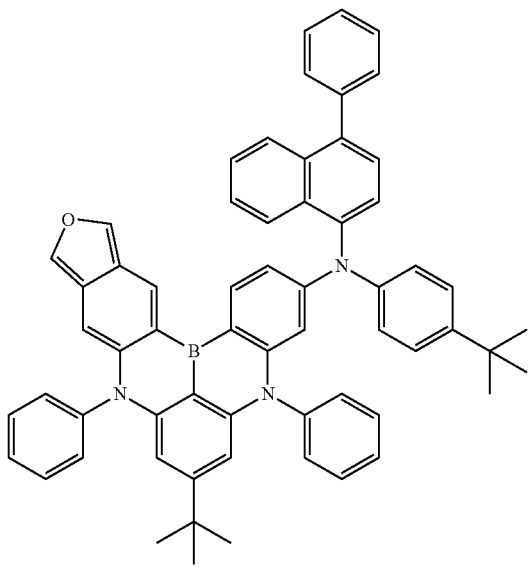
14
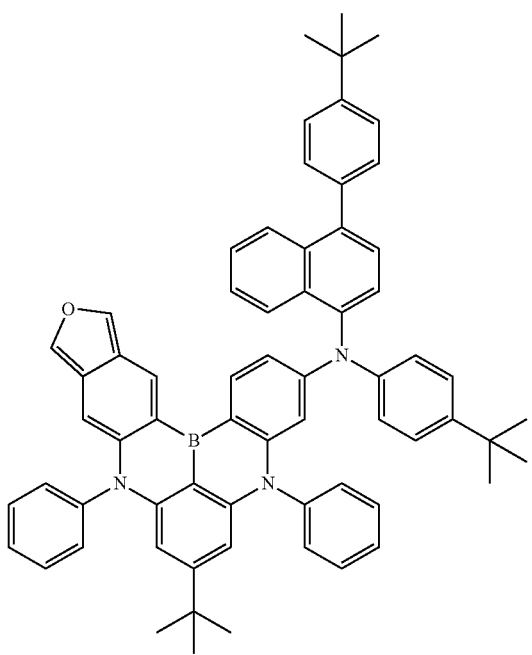

15
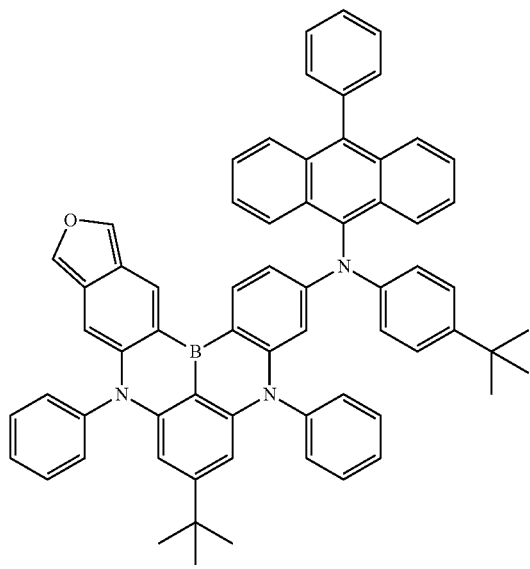
16
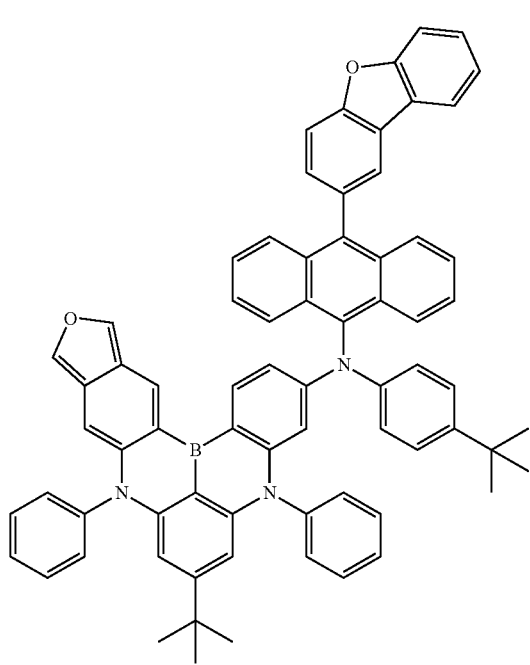
17
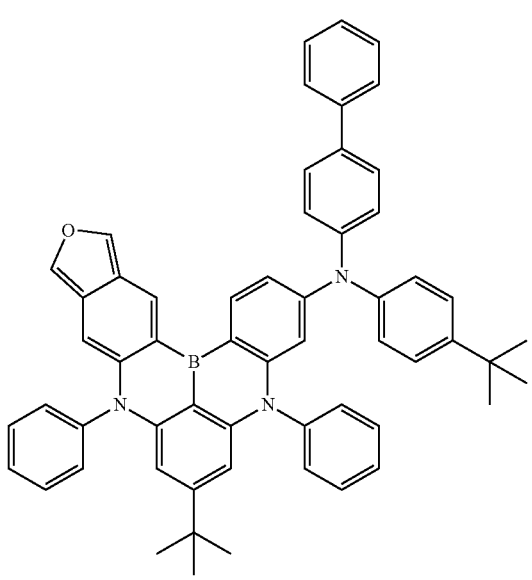
18
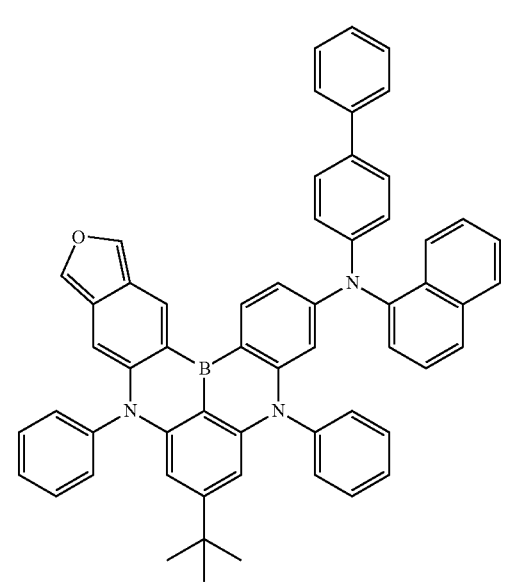

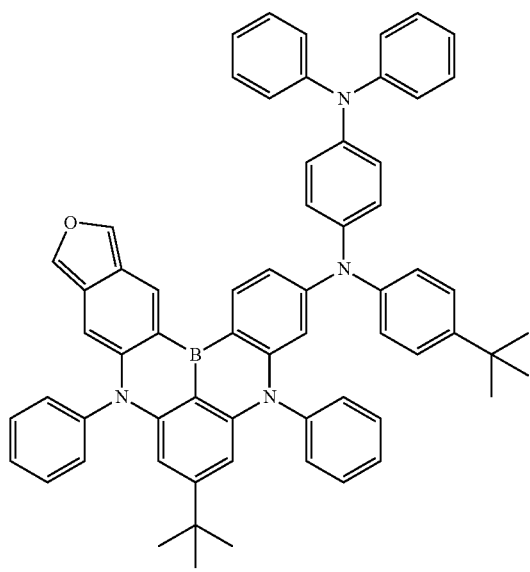
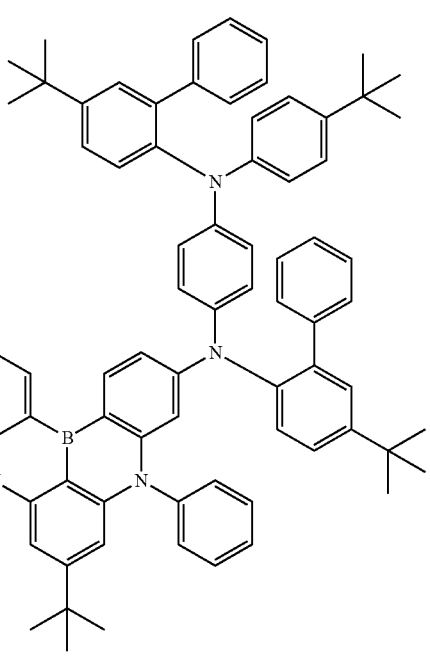

23
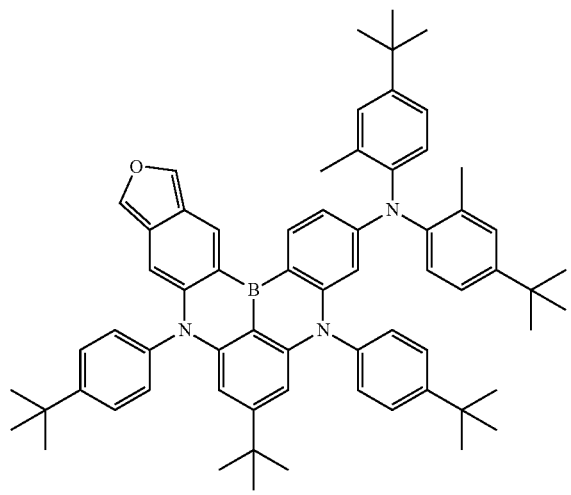
24
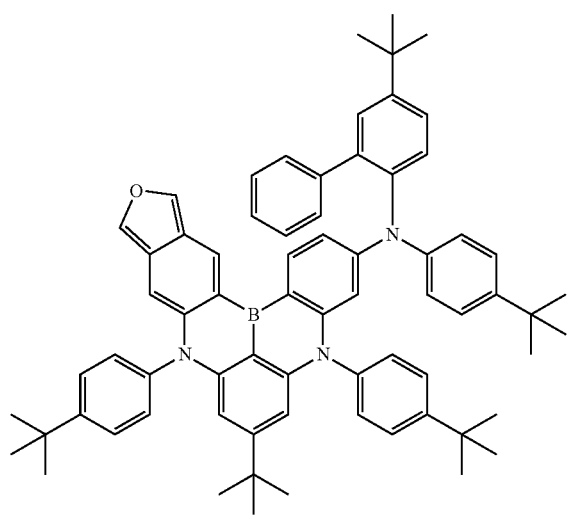
25
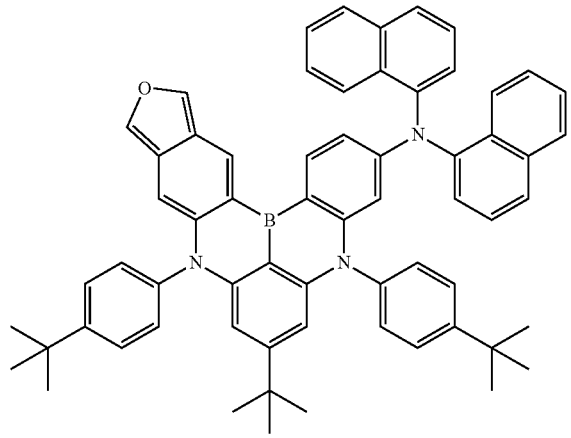
26
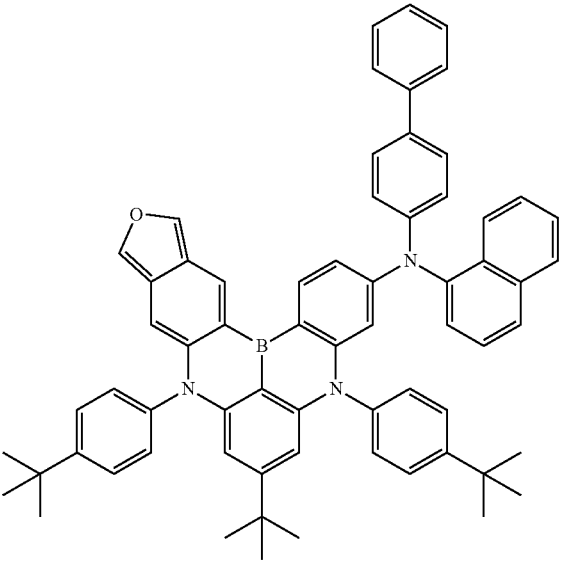
27
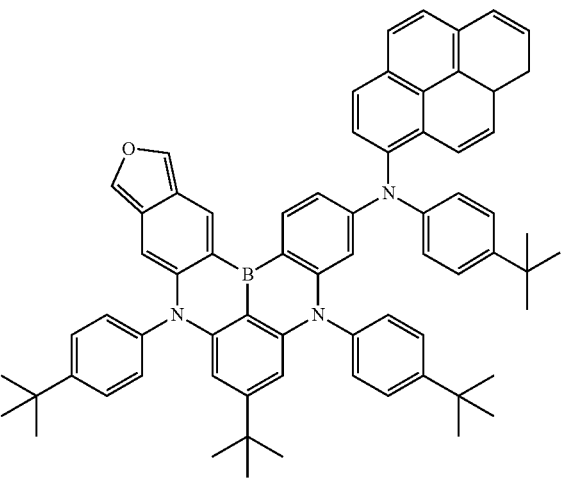
28
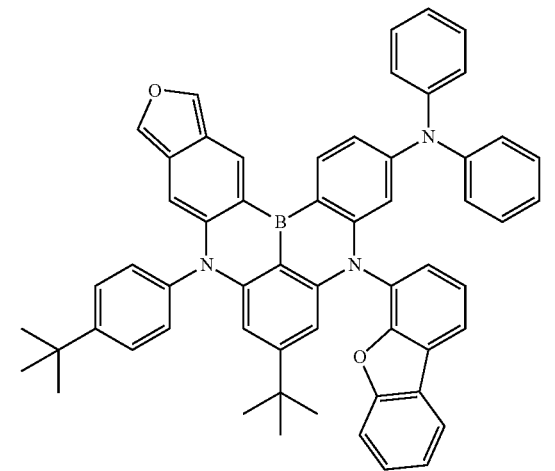

29
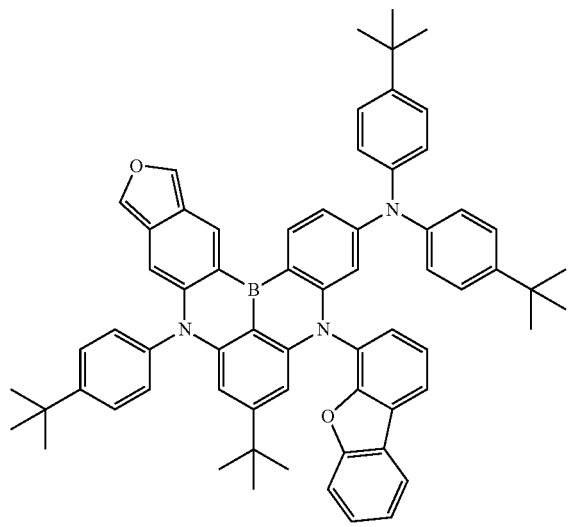
30
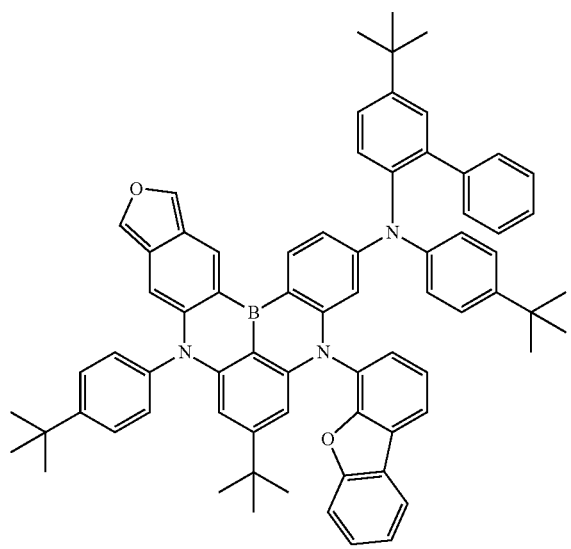
31
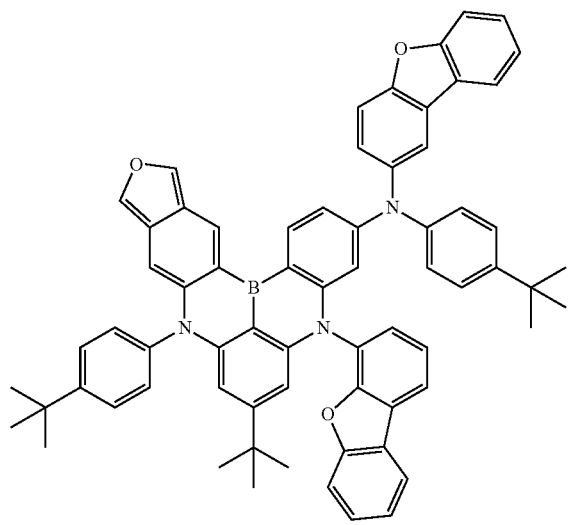
32
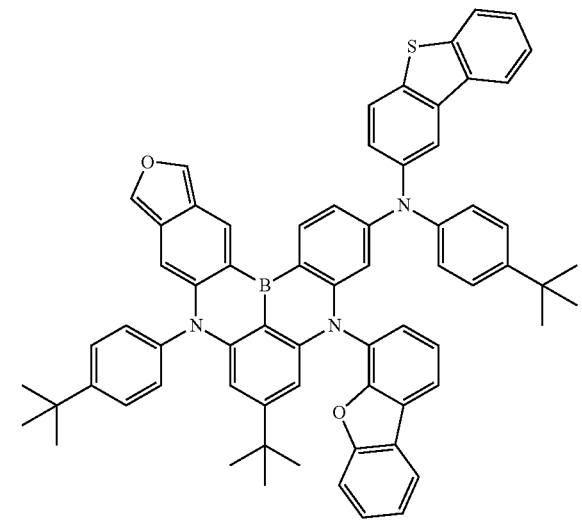
33
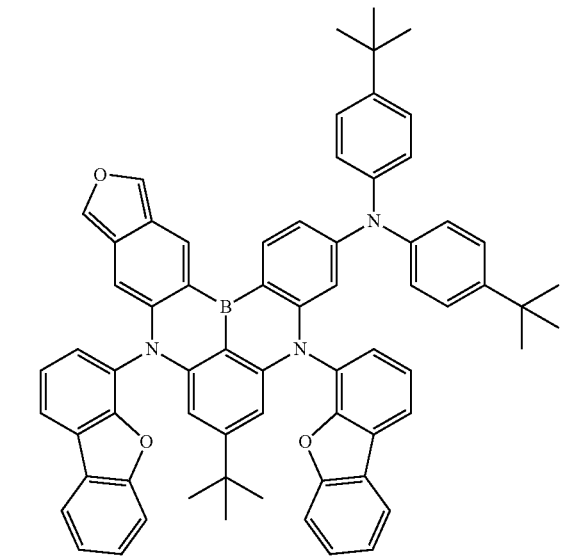
34
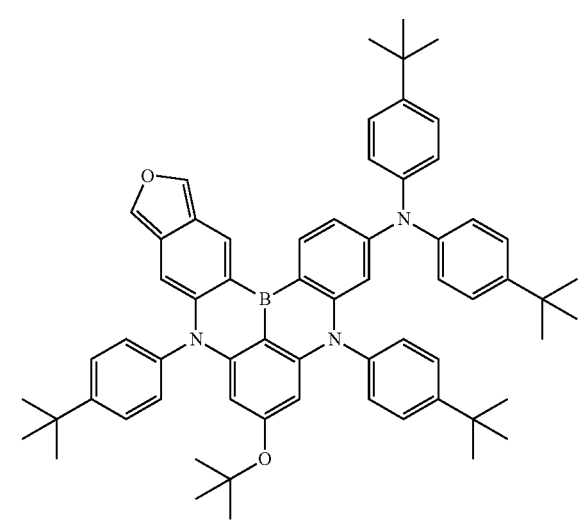

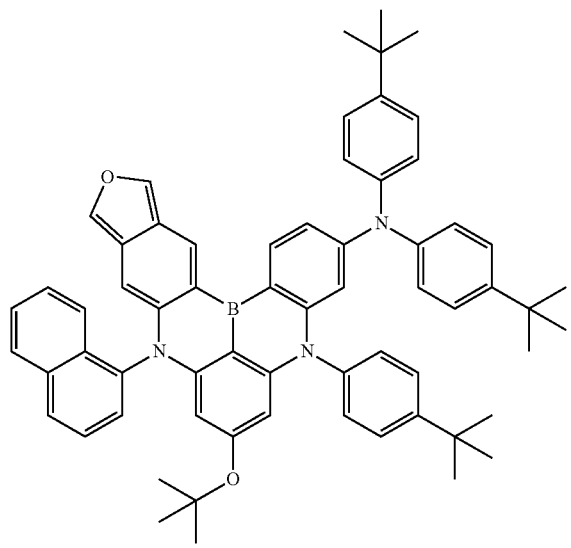
35
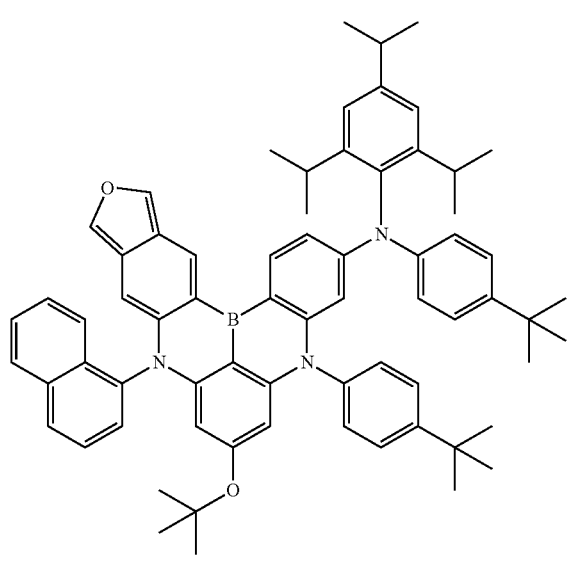
36
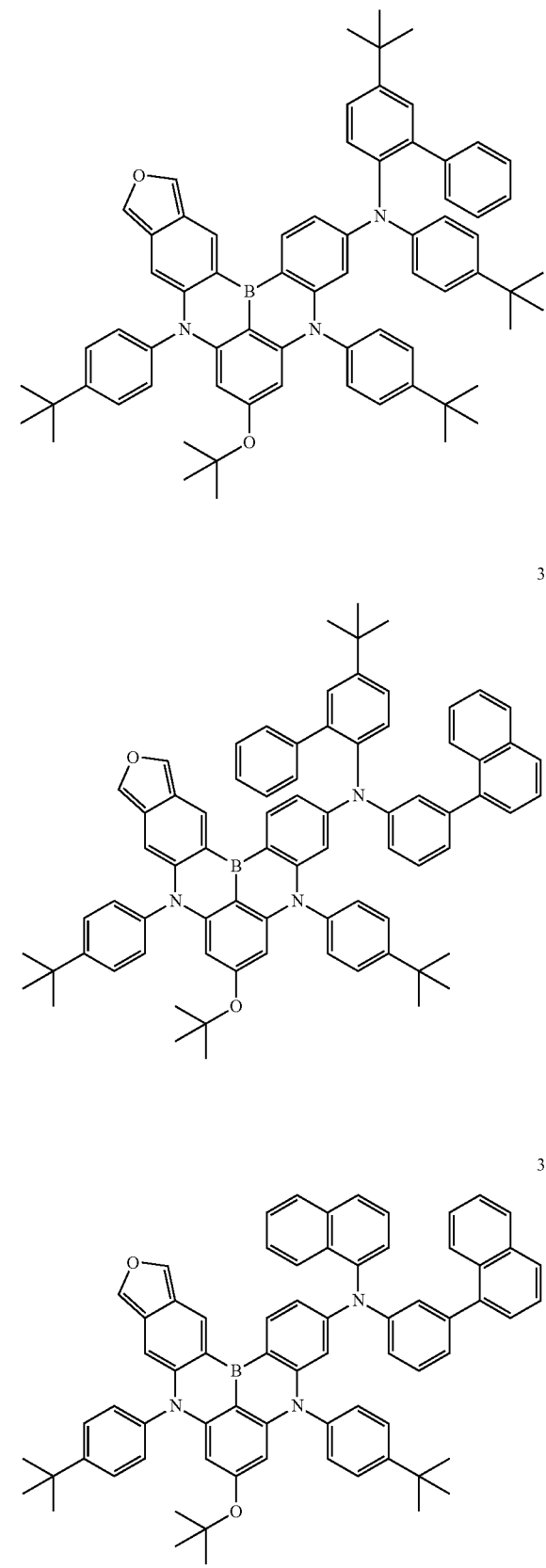
37
38
39

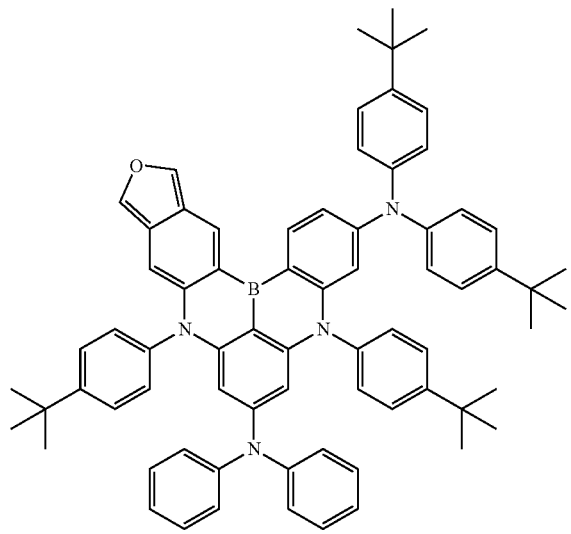
40
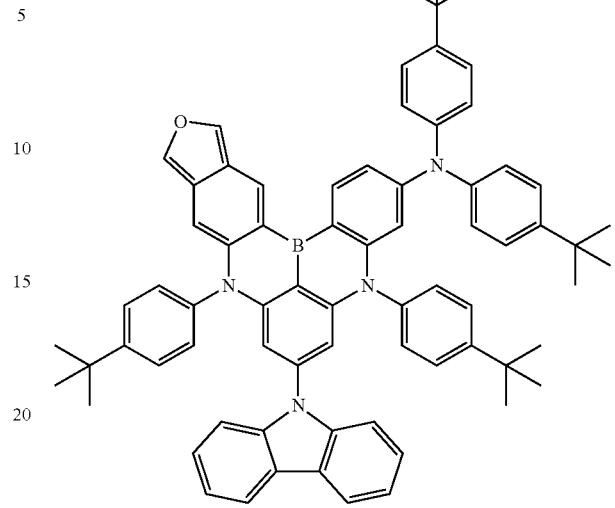
42
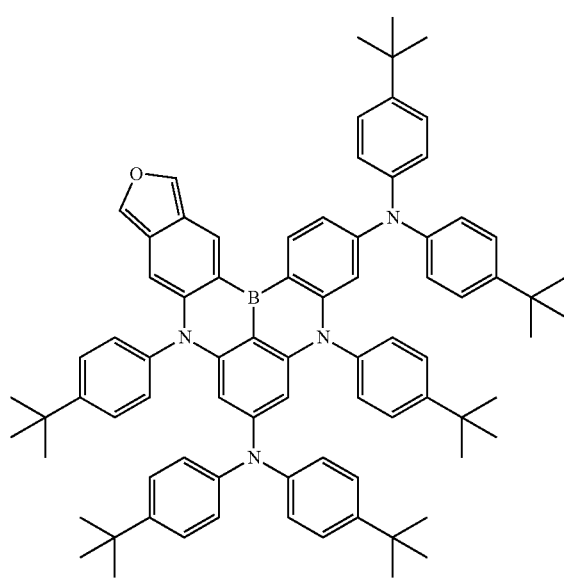
41
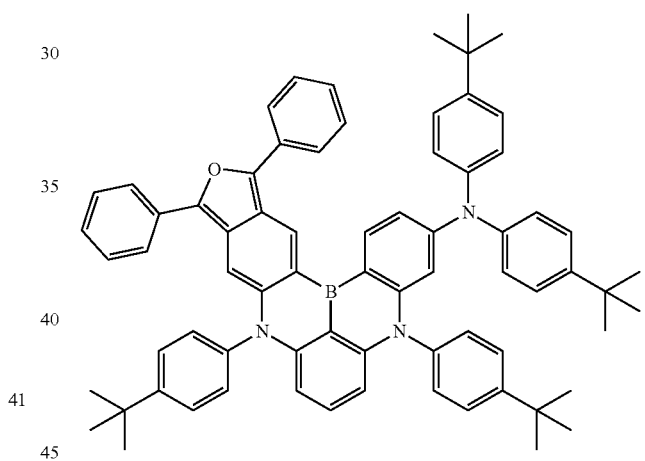
43
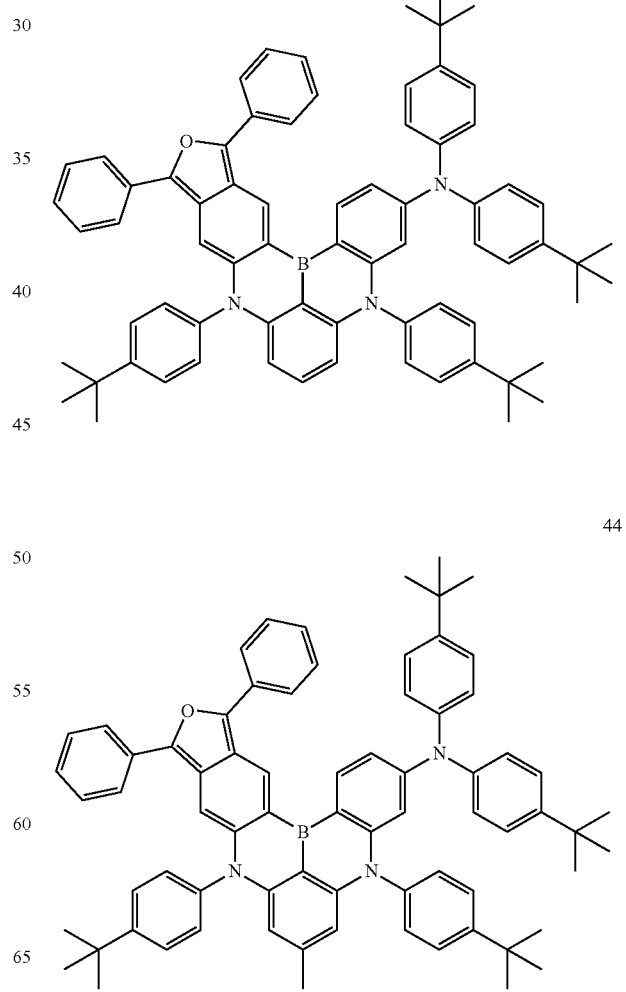
44

45
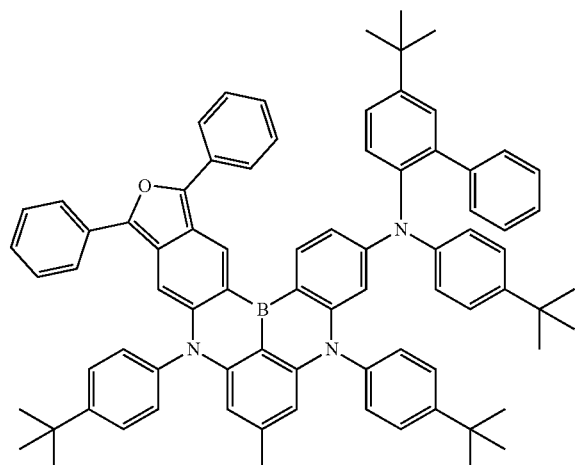
46
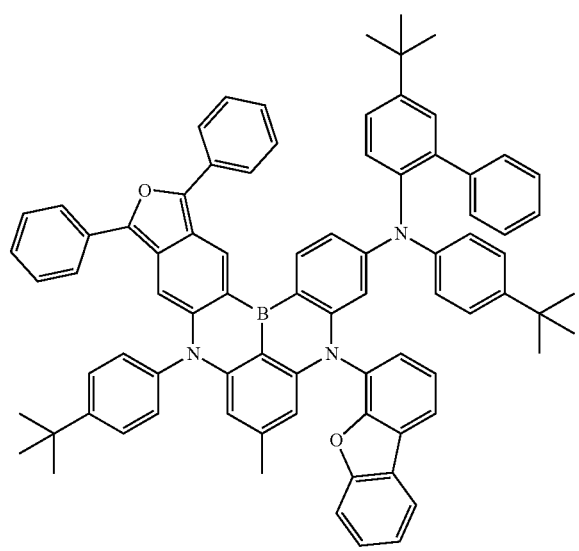
47
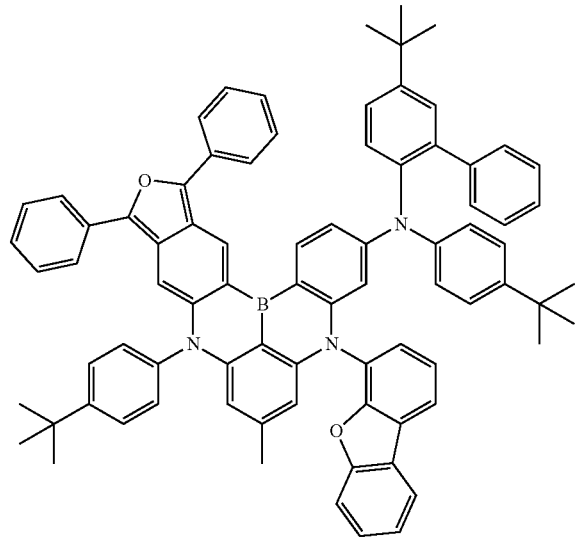
48
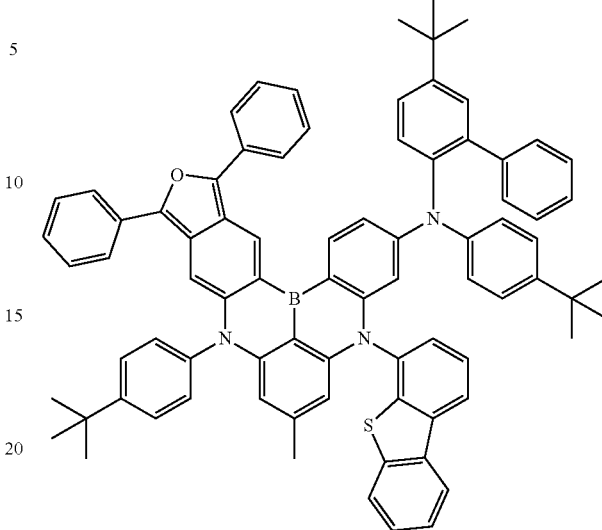
49
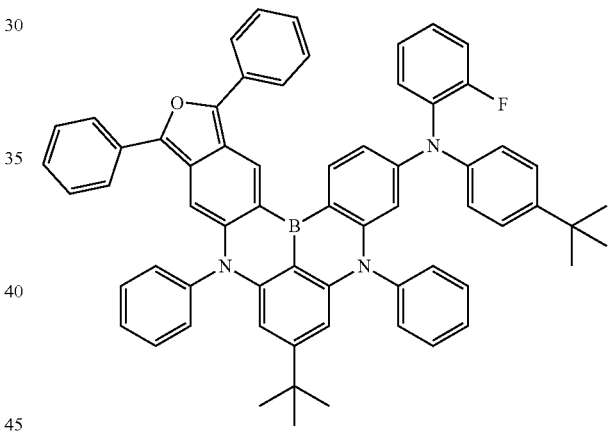
50
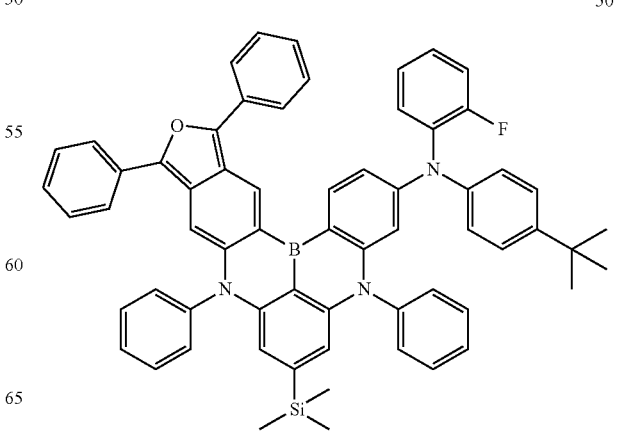

119
-continued
51
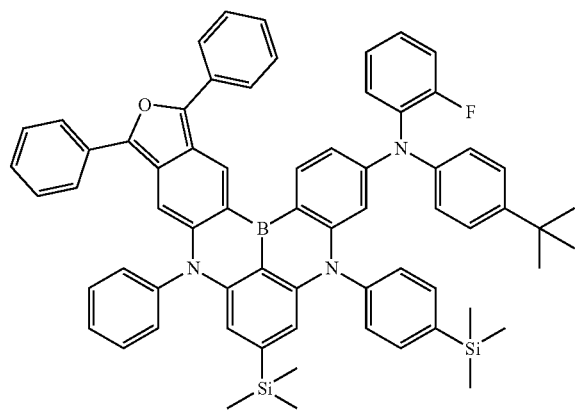
52
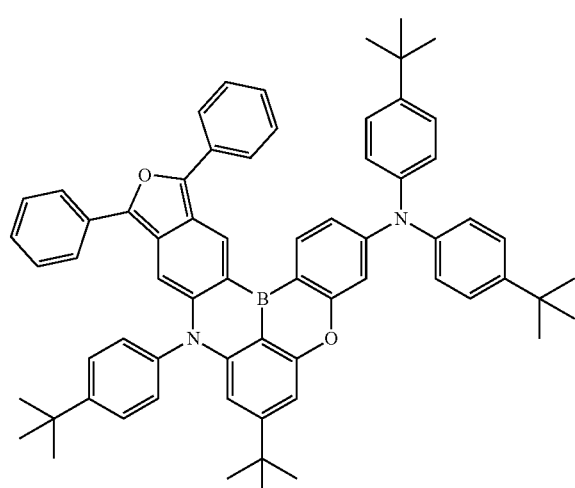
53
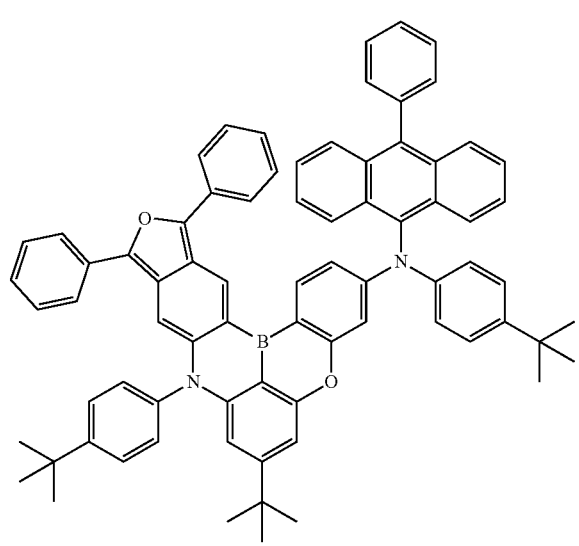
120
-continued
54
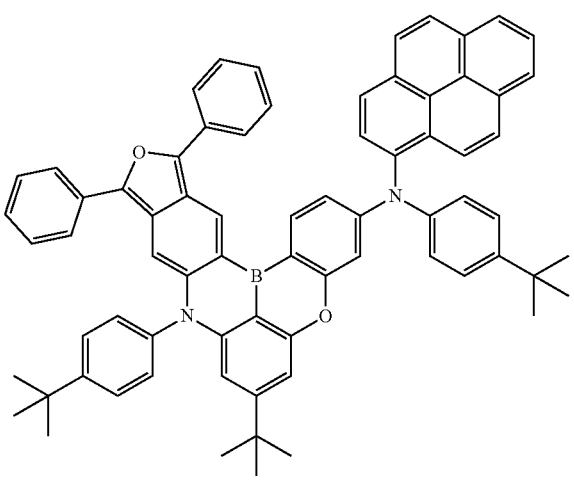
55
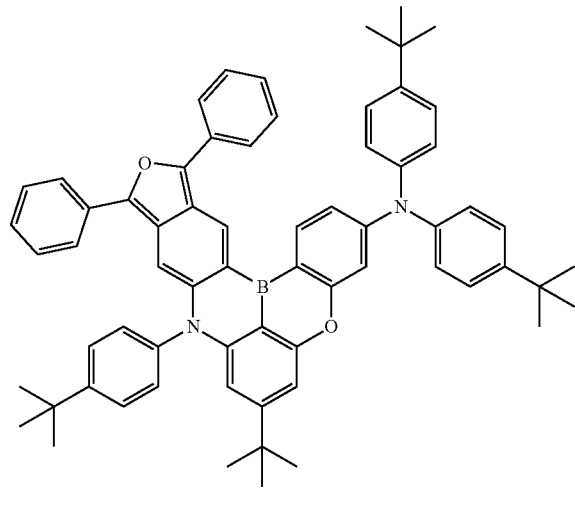
56
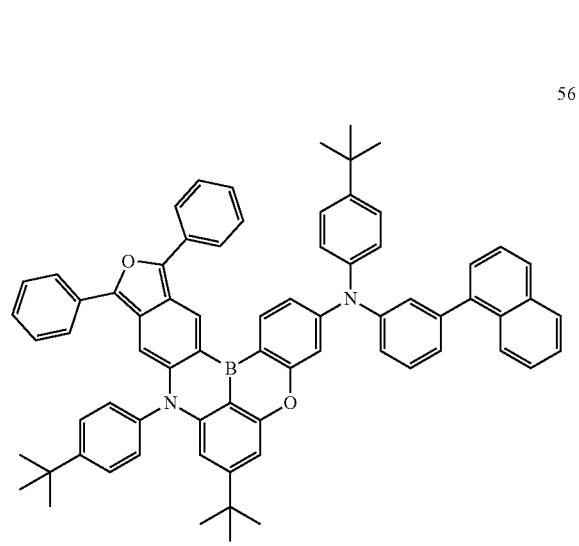

57
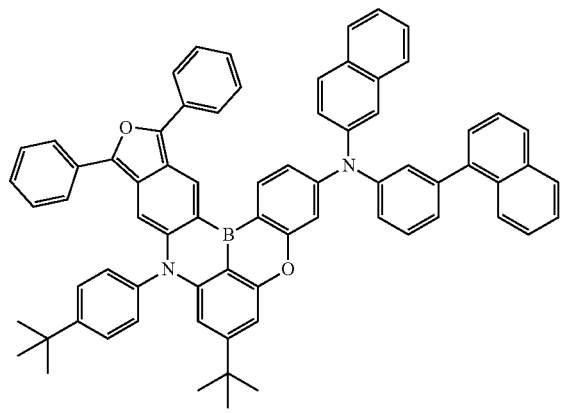
58
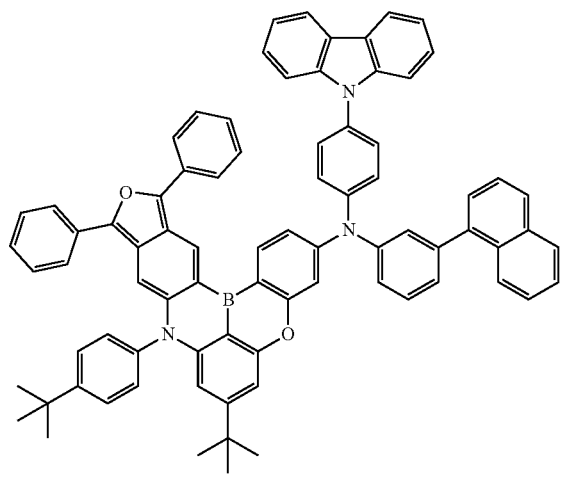
59
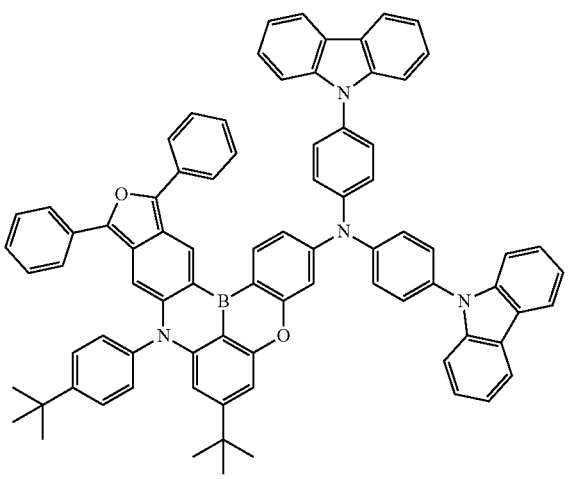
60
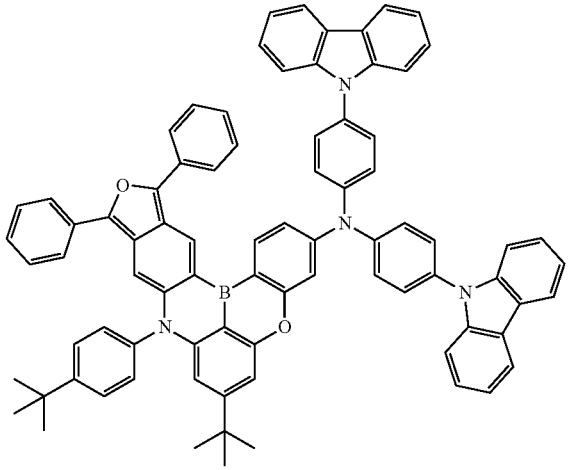
61
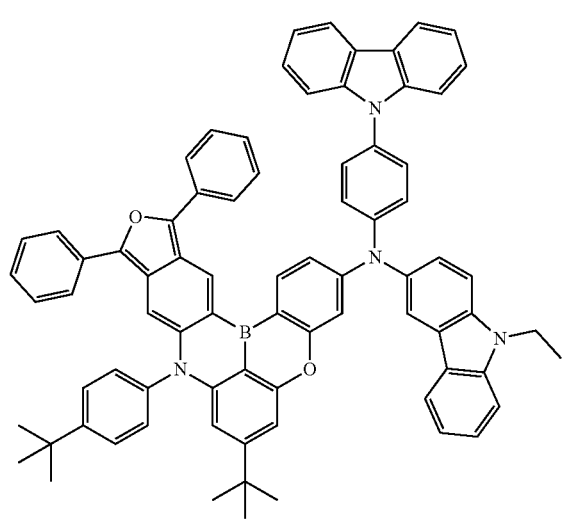
62
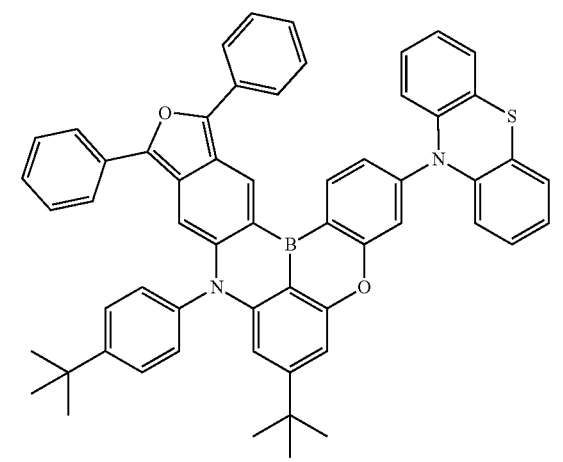

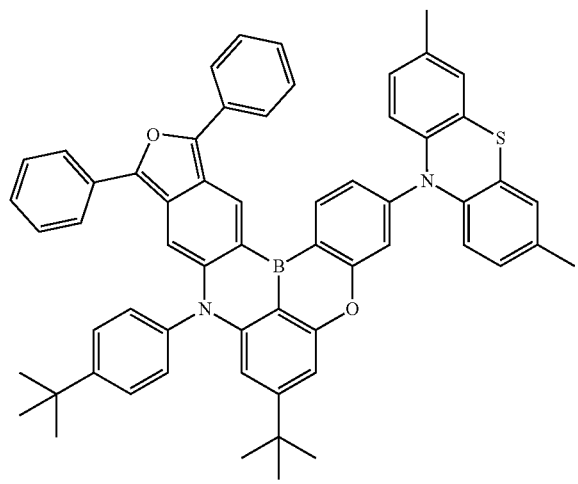
63
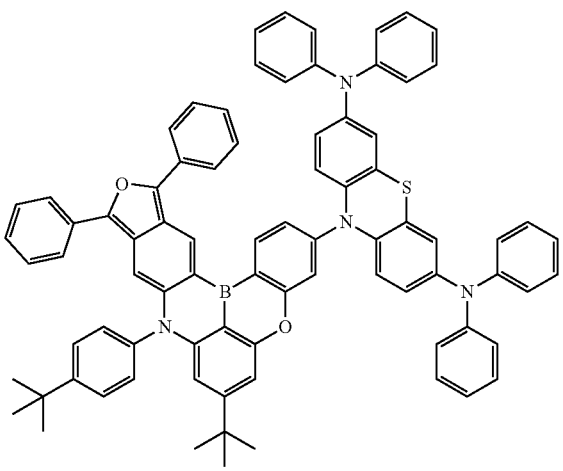
66
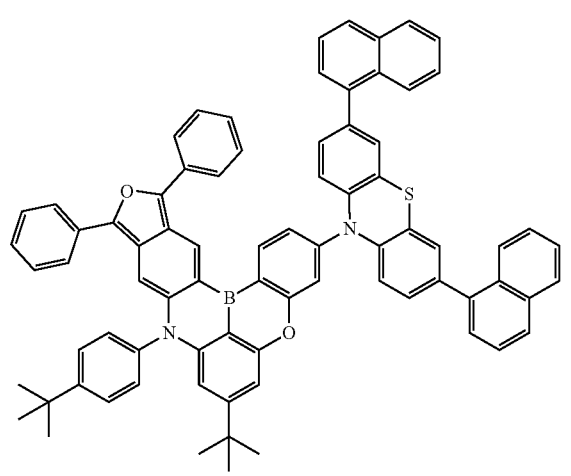
64
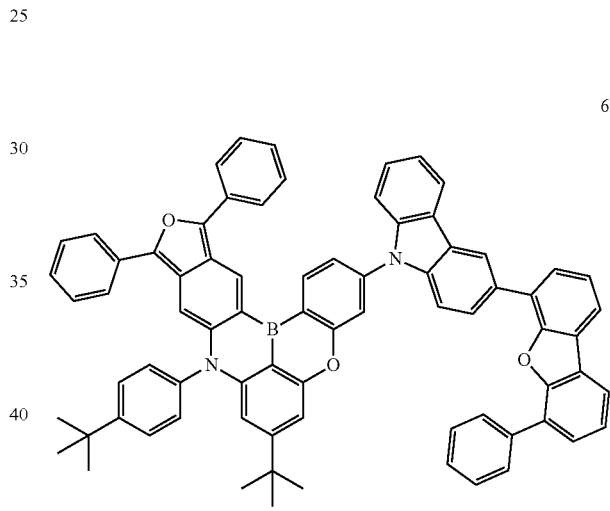
67
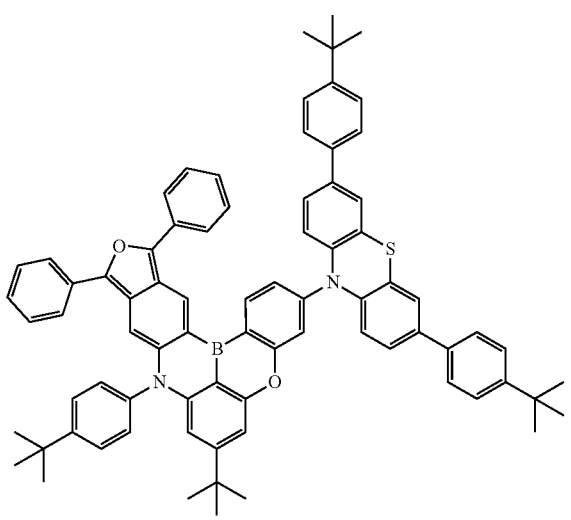
65
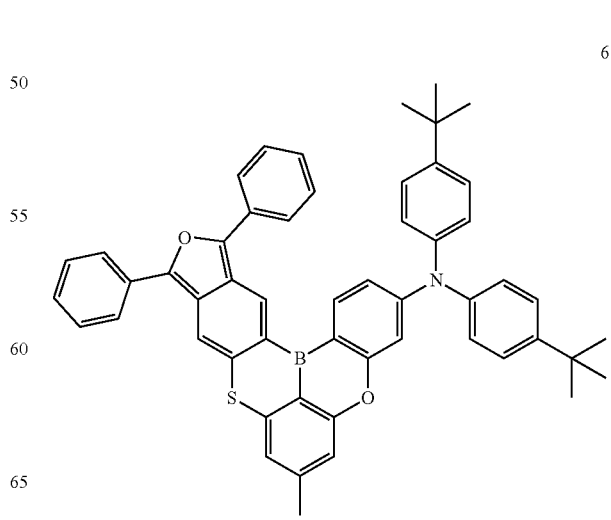
68

125
-continued
69
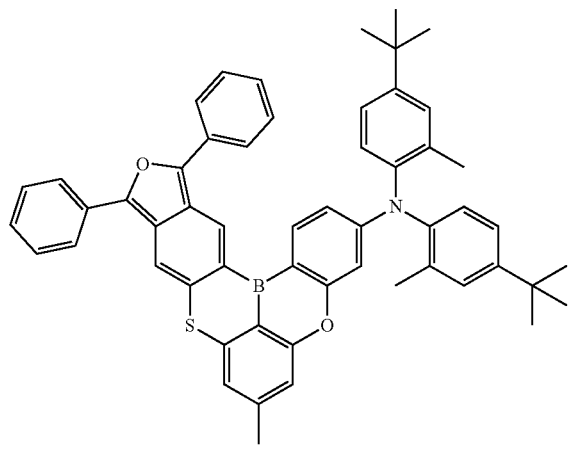
70
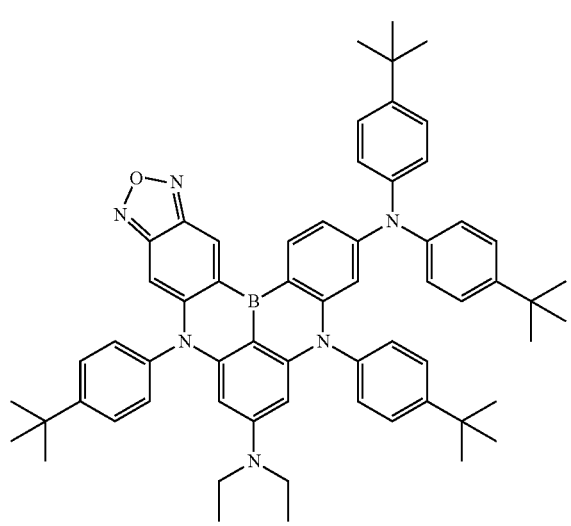
71
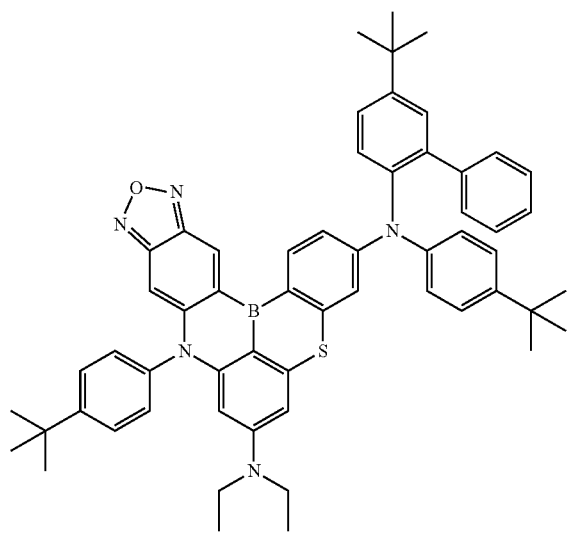
126
-continued
72
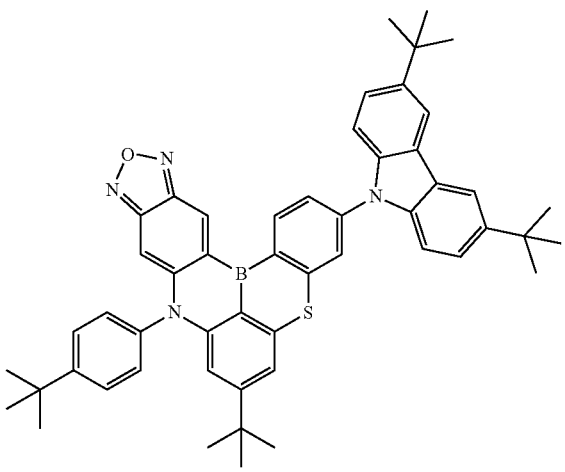
73
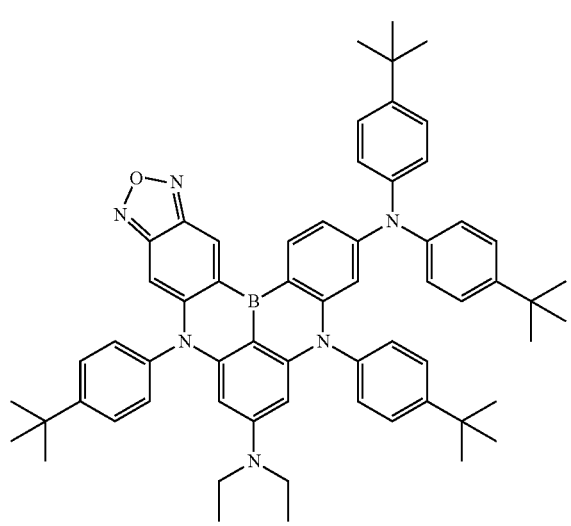
74
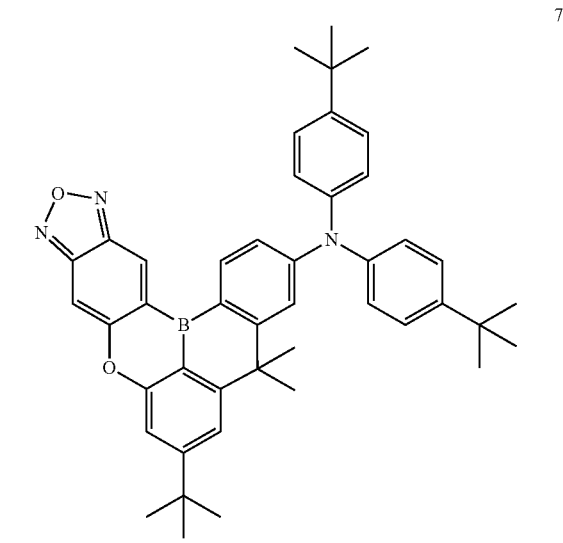

127
-continued
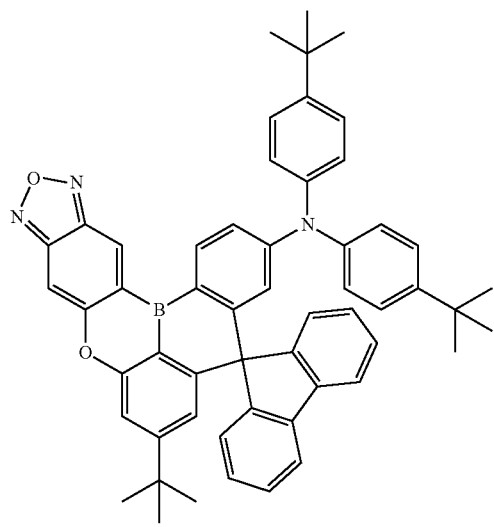
75
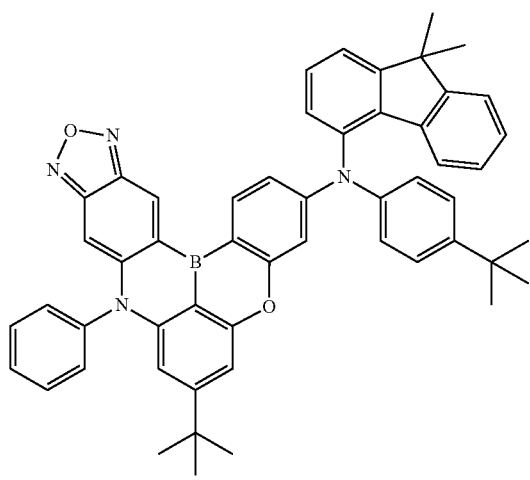
76
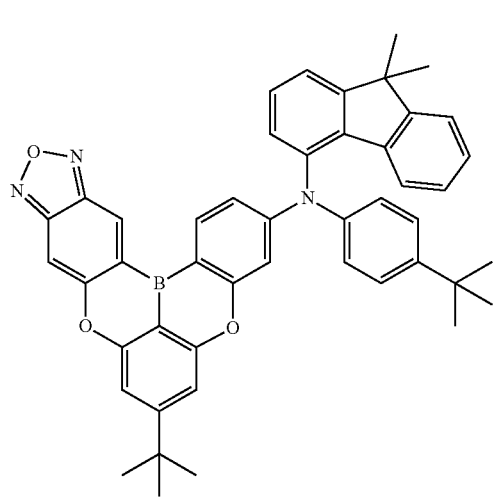
77
128
-continued
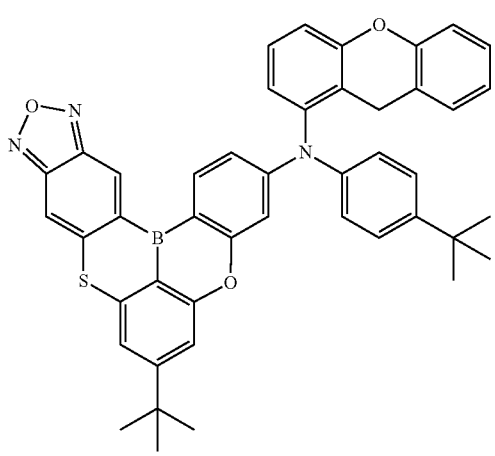
78
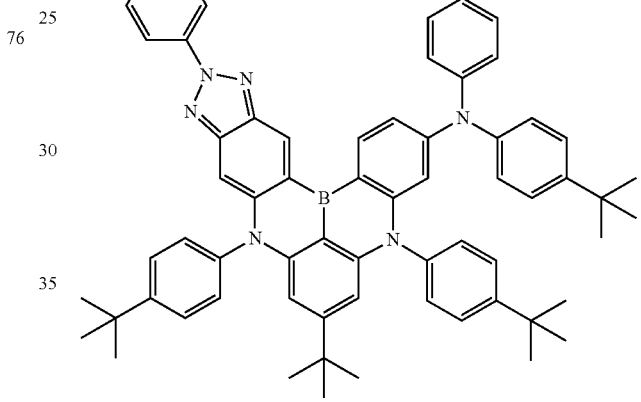
79
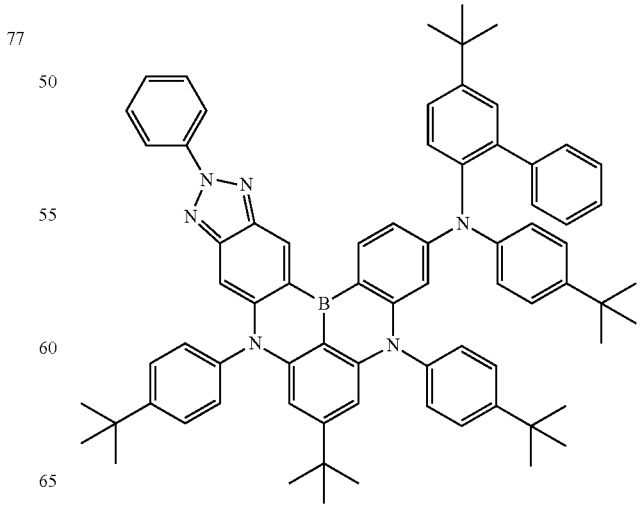
80

129
-continued
81
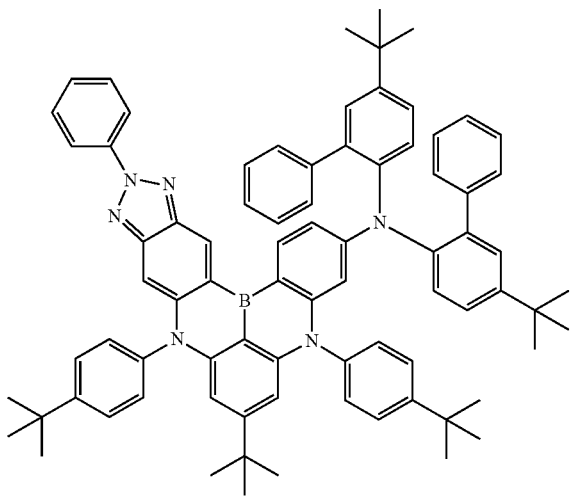
82
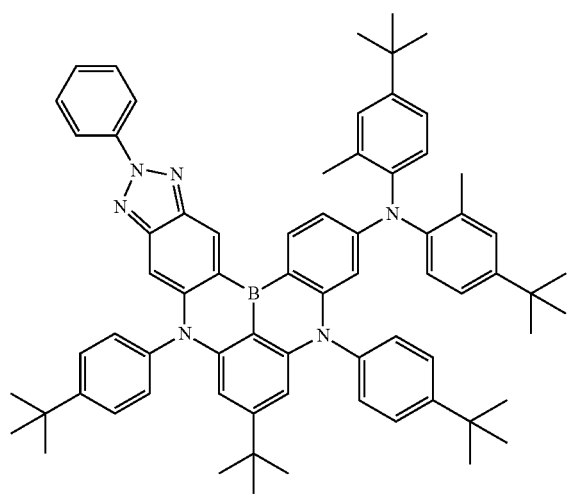
83
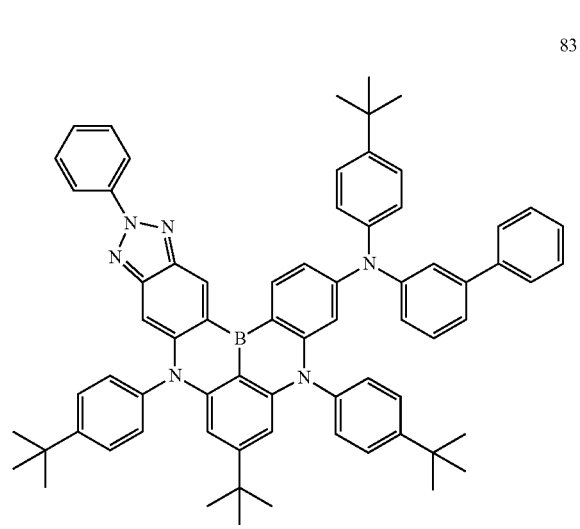
130
-continued
84
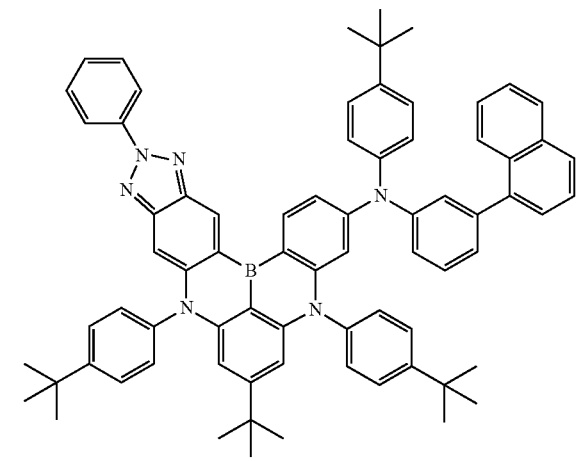
85
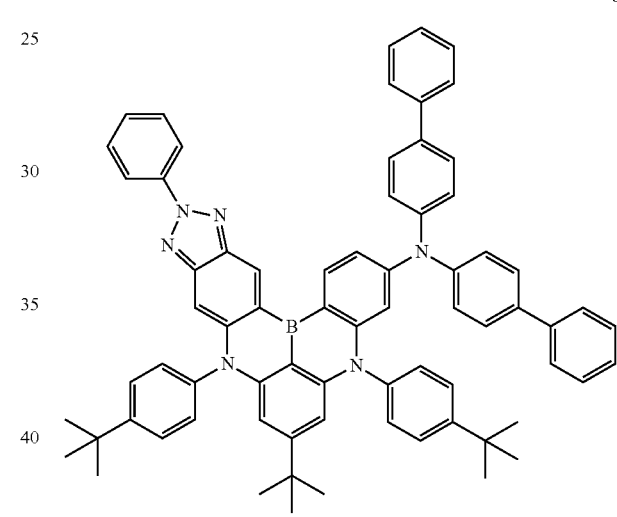
86
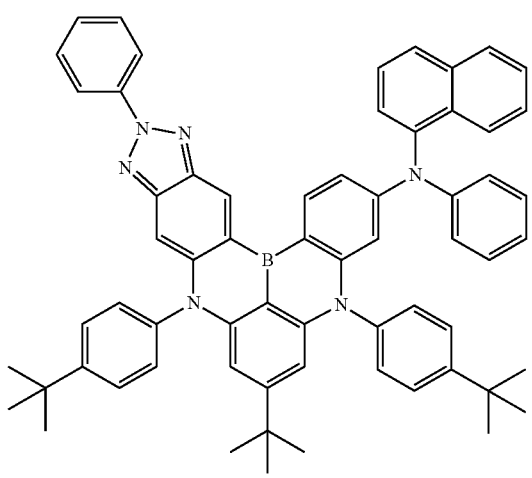

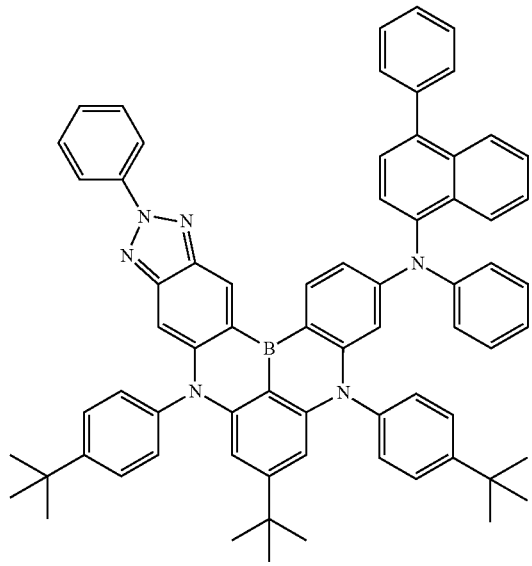
87
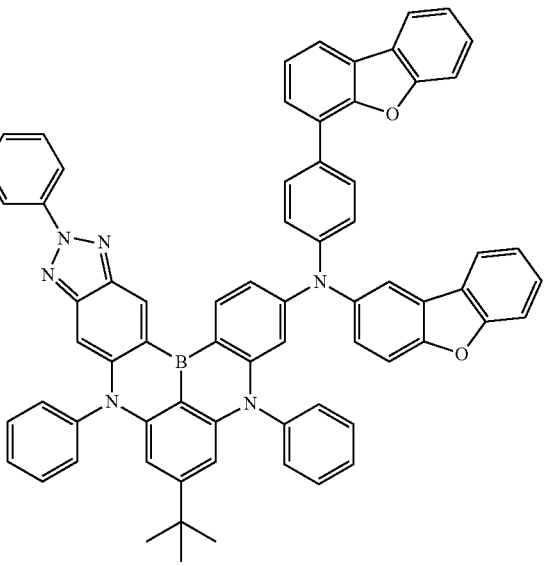
89
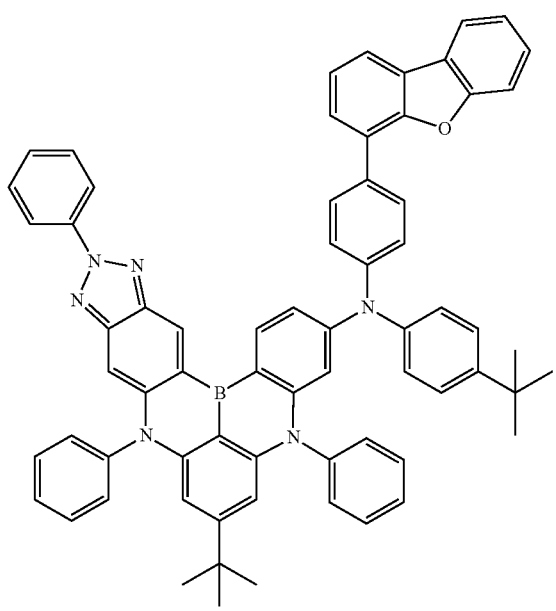
88
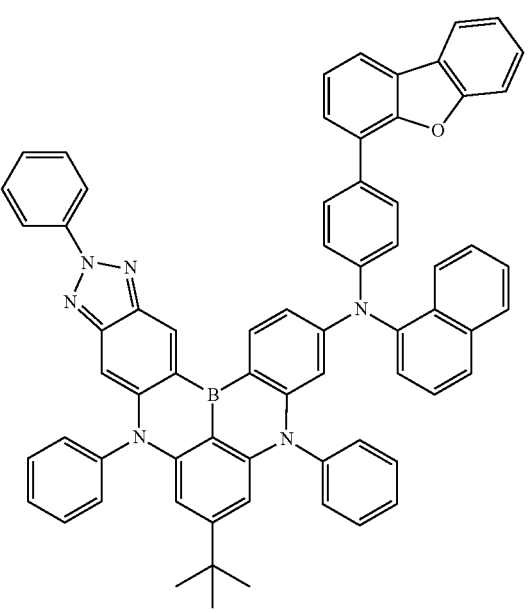
90
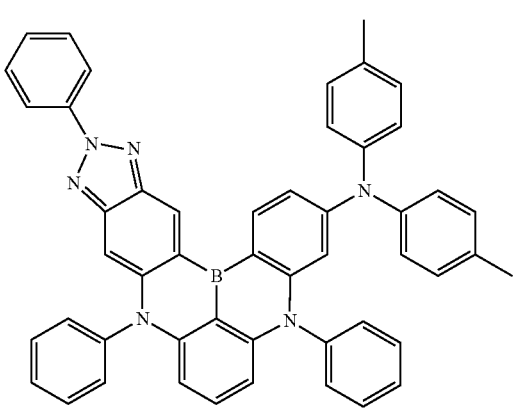
91

133
-continued
92
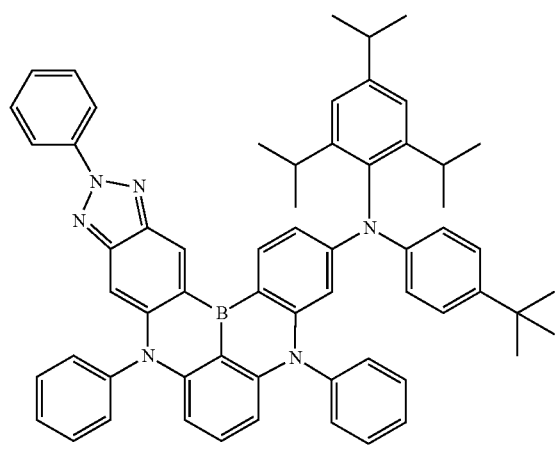
93
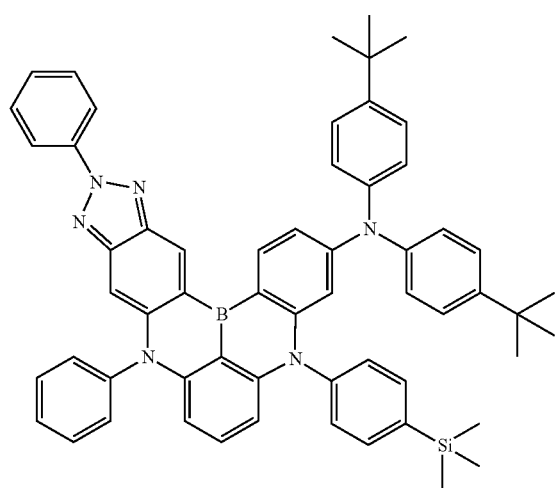
94
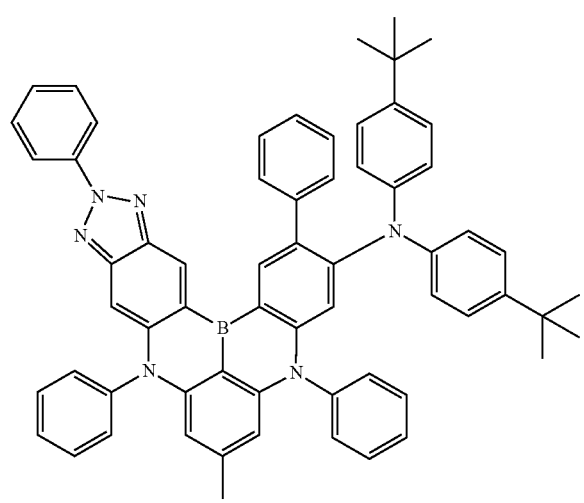
134
-continued
95
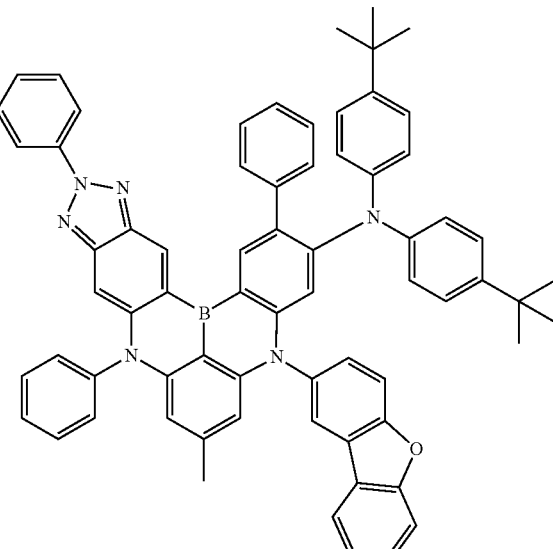
96
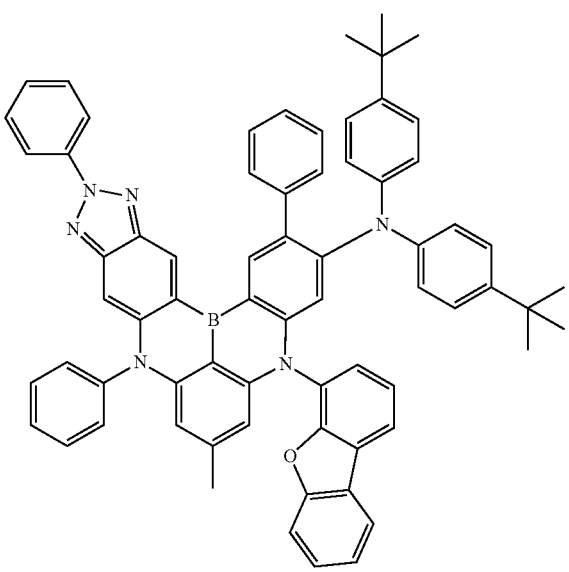
97
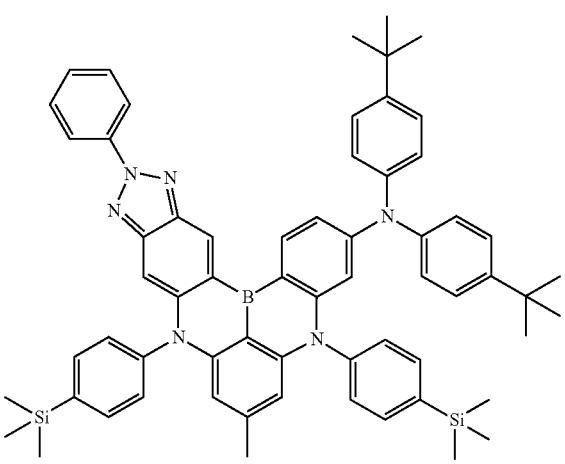

135
-continued
98
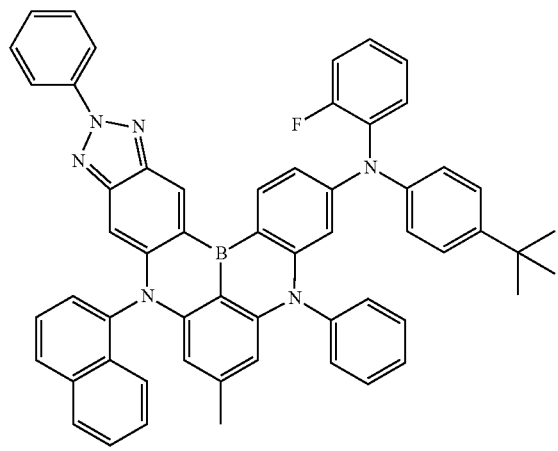
99
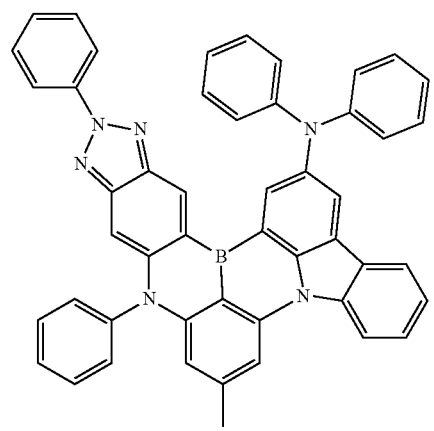
100
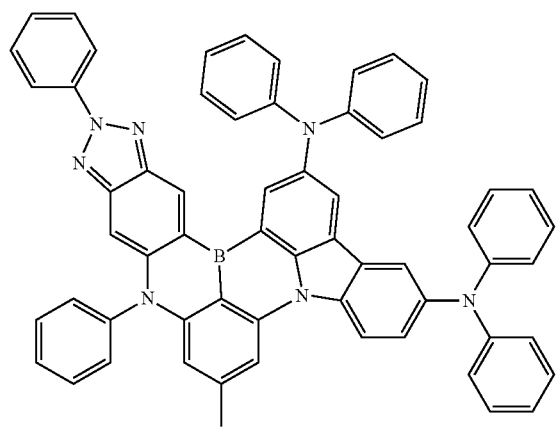
136
-continued
101
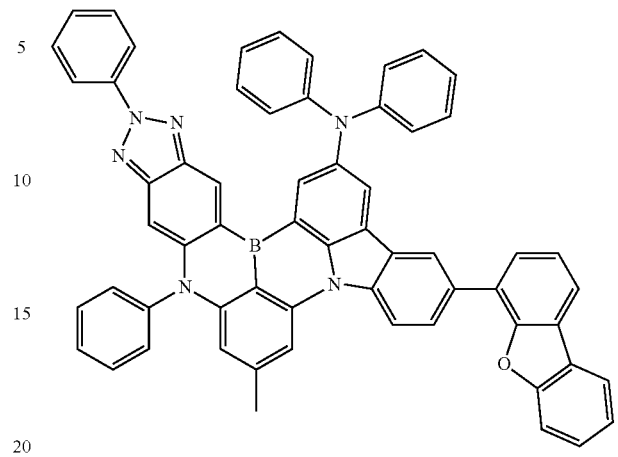
102
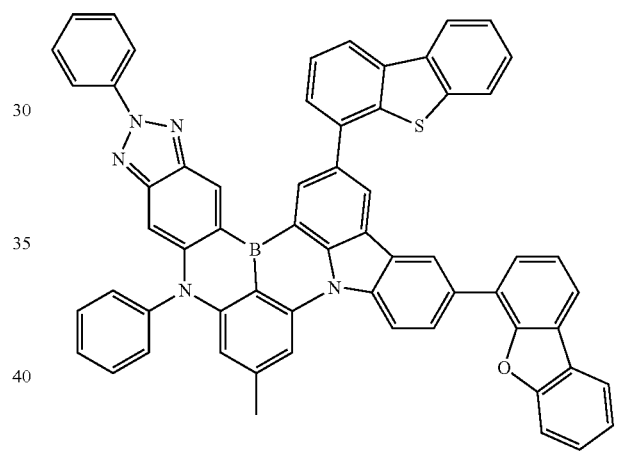
103
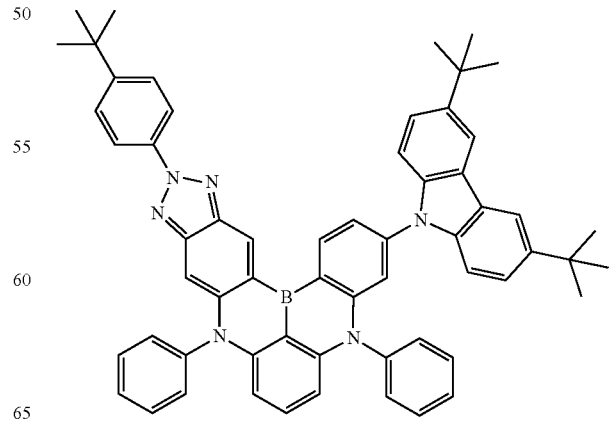

137
-continued
104
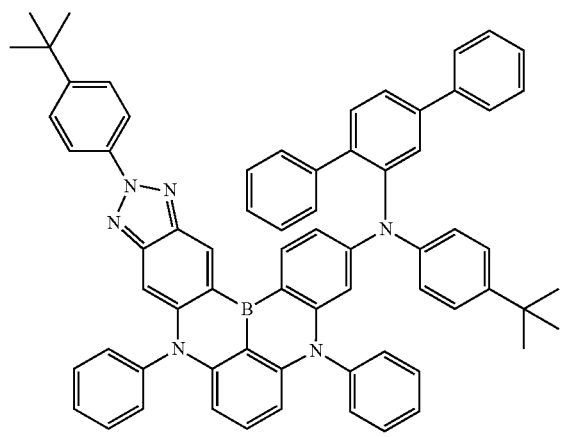
105
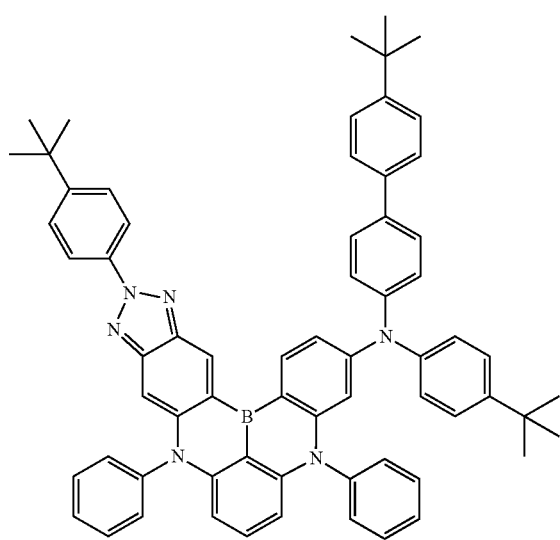
106
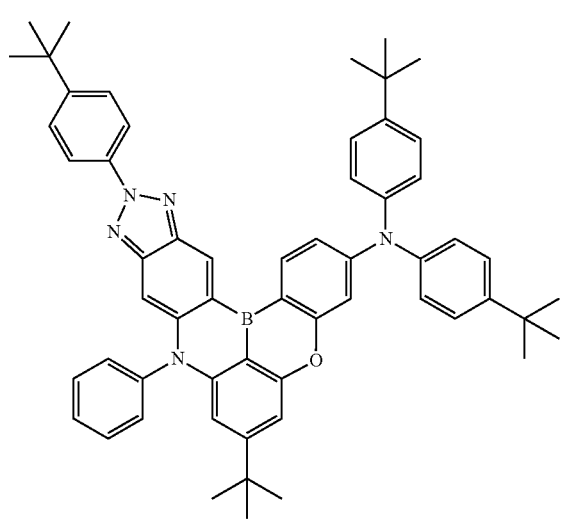
138
-continued
107
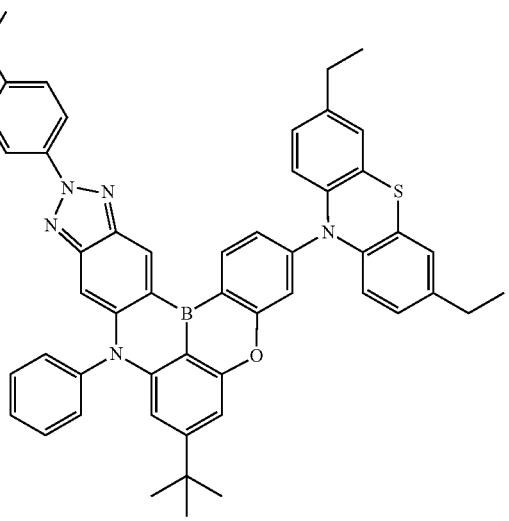
108
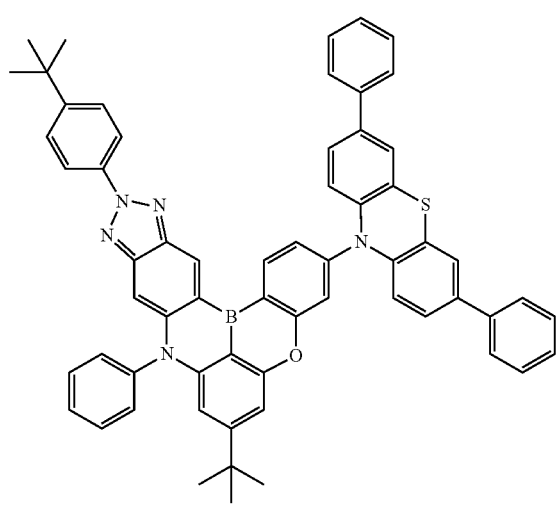
109
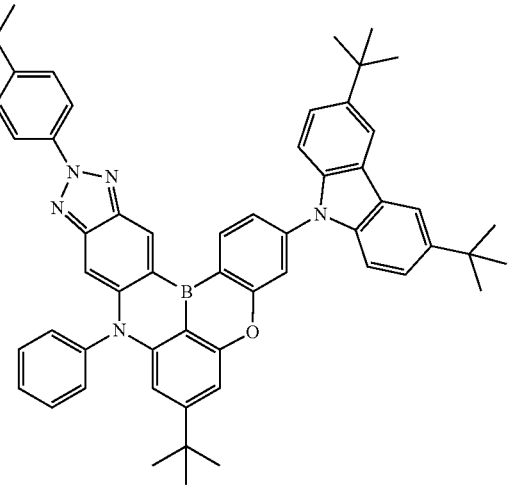

139
-continued
110
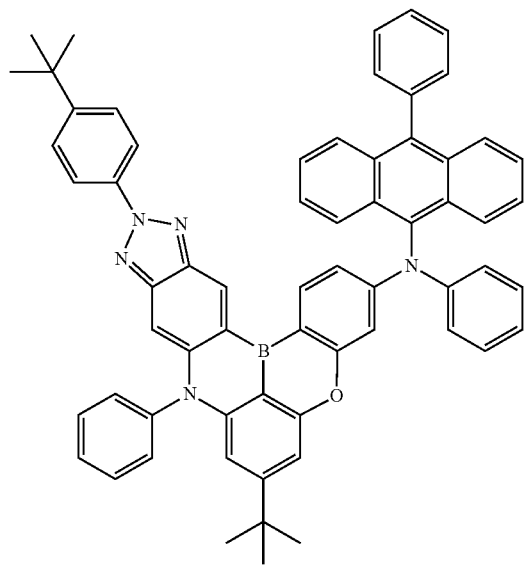
111
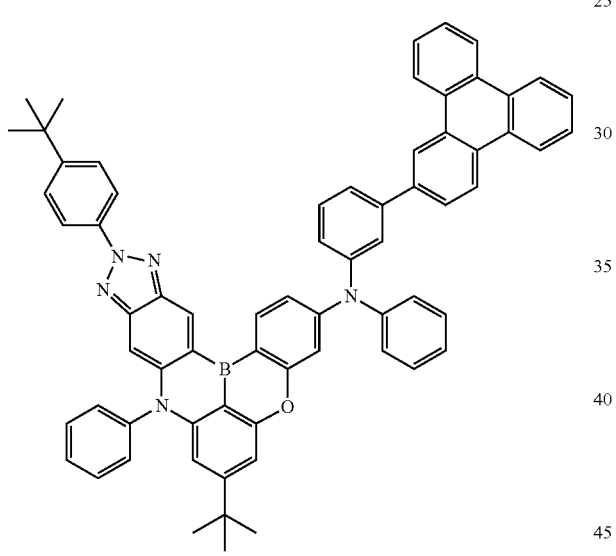
112
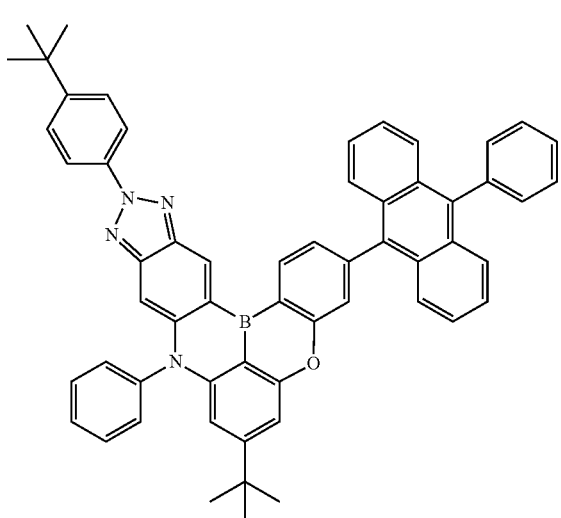
140
-continued
113
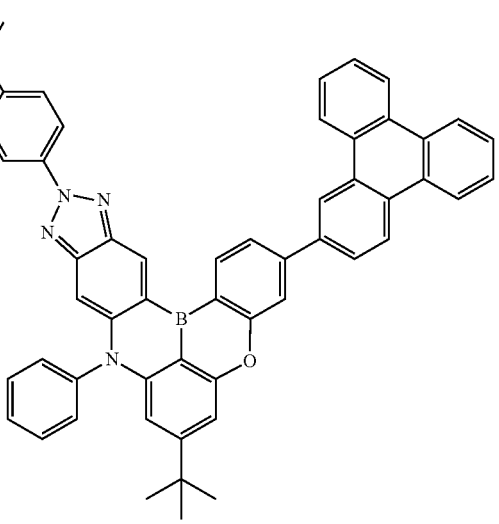
114
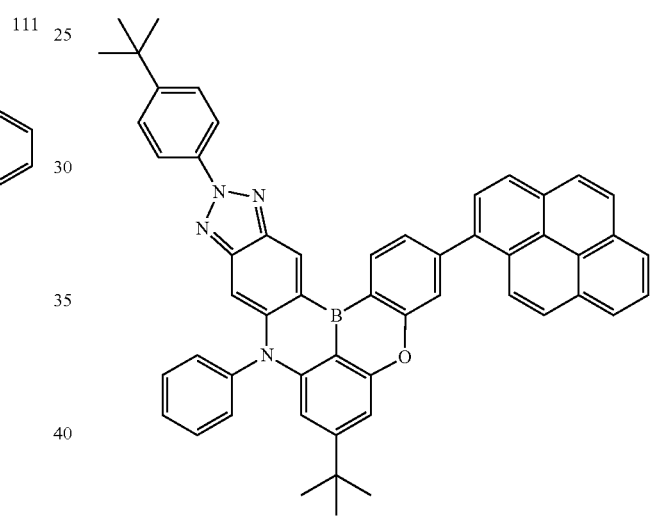
115
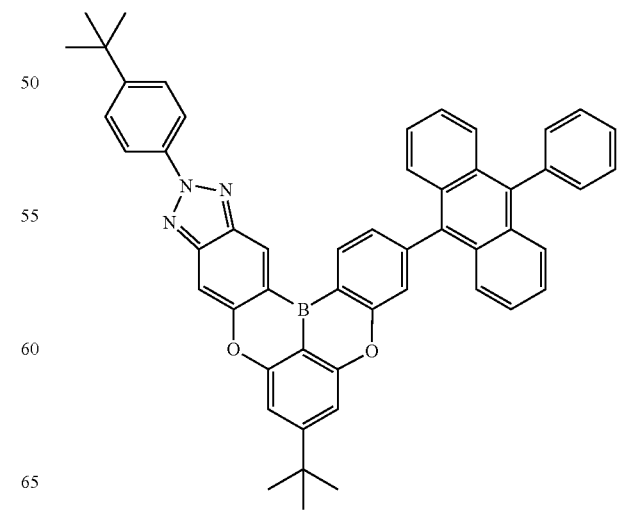

141
-continued

116
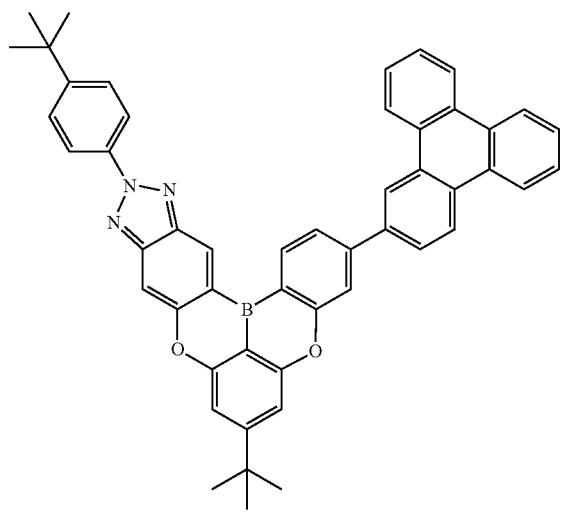

117
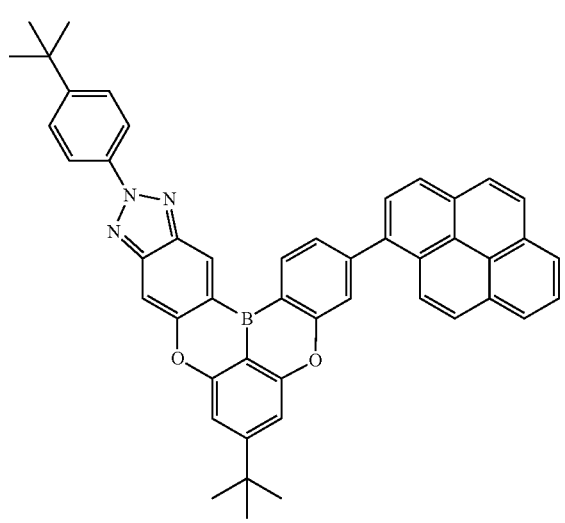

118
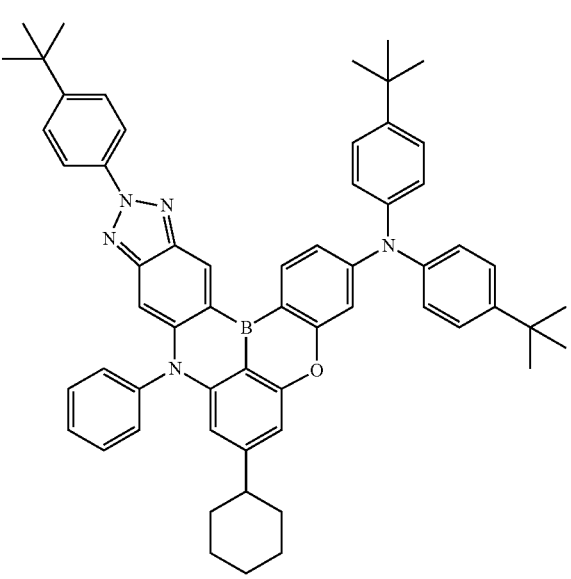

142
-continued

119
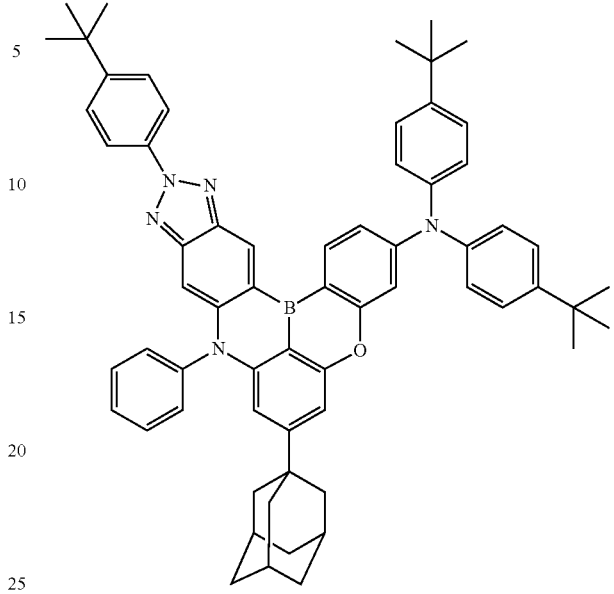

120
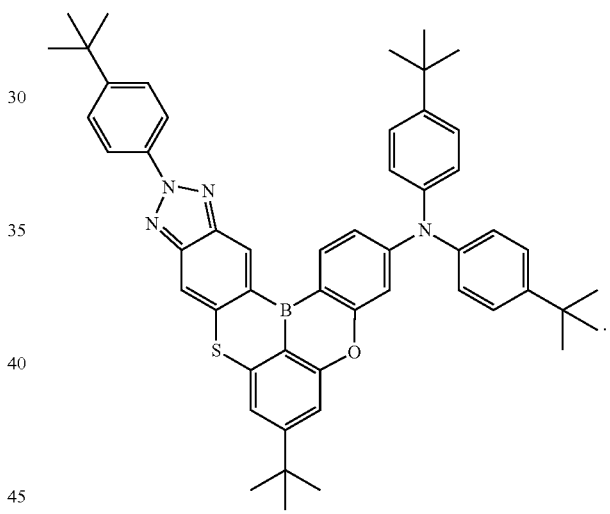

7. An organic electroluminescent device comprising a first electrode, a second electrode opposite to the first electrode, and one or more organic layers interposed between the first and second electrodes wherein at least one of the organic layers comprises the organic electroluminescent compound represented by Formula A according to claim 1 and optionally another organic electroluminescent compound represented by Formula A.

8. The organic electroluminescent device according to claim 7, wherein the organic layers comprise an electron injecting layer, an electron transport layer, a hole injecting layer, a hole transport layer, an electron blocking layer, a hole blocking layer, and a light emitting layer and at least one of the organic layers comprises the organic electroluminescent compound represented by Formula A.

9. The organic electroluminescent device according to claim 8, wherein the light emitting layer comprises, as a host compound, an anthracene derivative represented by Formula C:

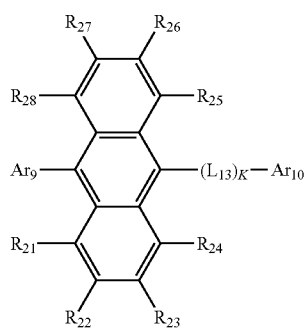

(C)

wherein $R_{21}$ to $R_{28}$ are identical to or different from each other and are as defined for $R_1$ to $R_{13}$ in Formula A representing the organic electroluminescent compound according to claim 1, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

10. The organic electroluminescent device according to claim 9, wherein $Ar_9$ in Formula C is represented by Formula C-1:

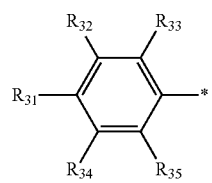

(C-1)

wherein $R_{31}$ to $R_{35}$ are identical to or different from each other and are as defined for $R_1$ to $R_{13}$ in Formula A representing the organic electroluminescent compound according to claim 1 and each of $R_{31}$ to $R_{35}$ is optionally bonded to an adjacent substituent to form a saturated or unsaturated ring.

11. The organic electroluminescent device according to claim 9, wherein the compound of Formula C is selected from the compounds of Formulae C1 to C57:

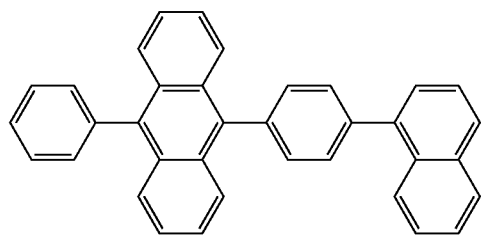

C1

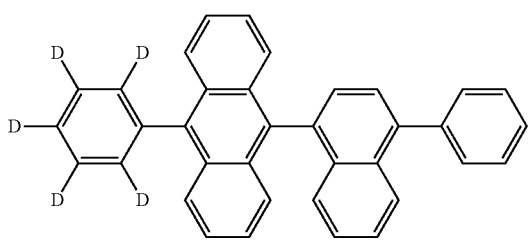

C2

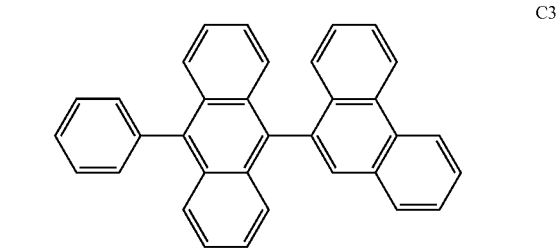

C3

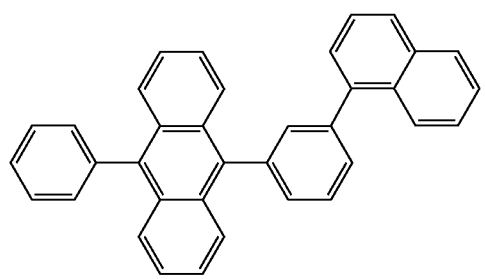

C4

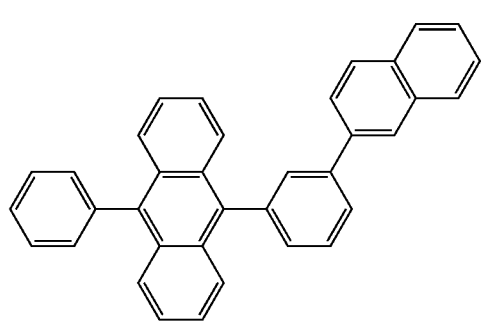

C5

C6
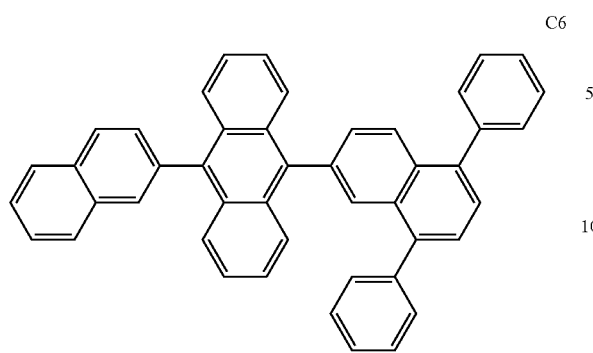
C7
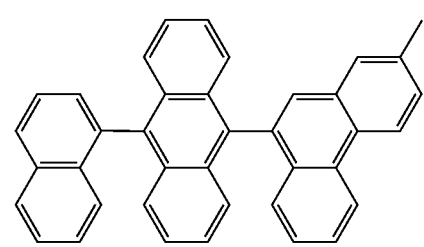
C8
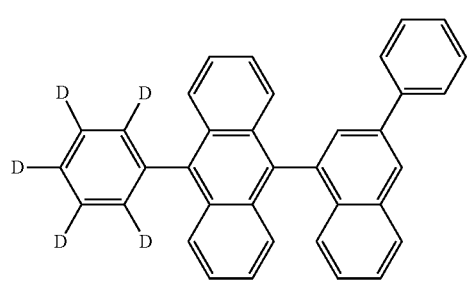
C9
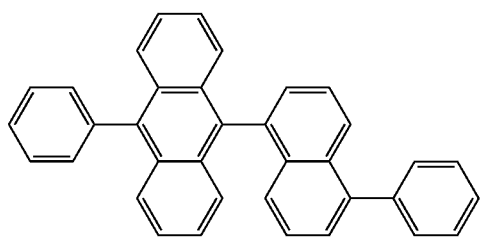
C10
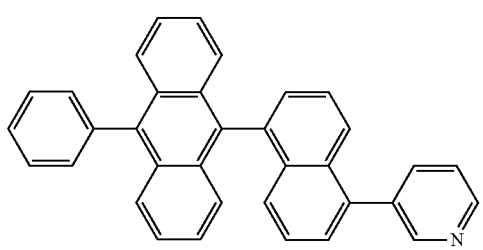
C11
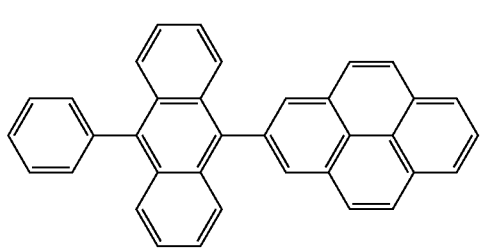
C12
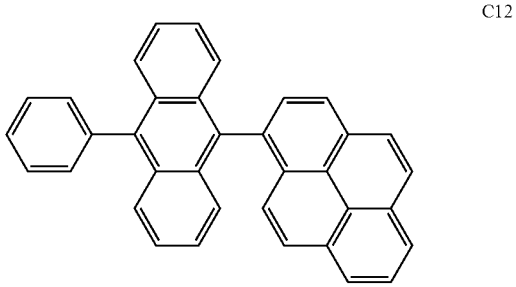
C13
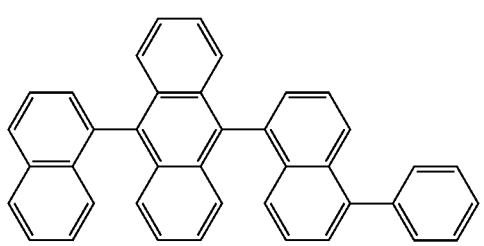
C14
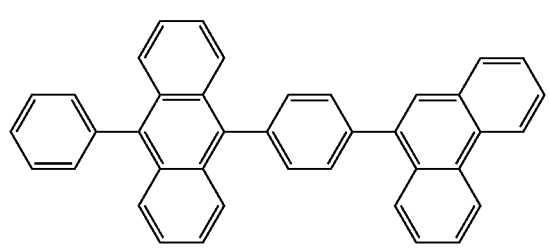
C15
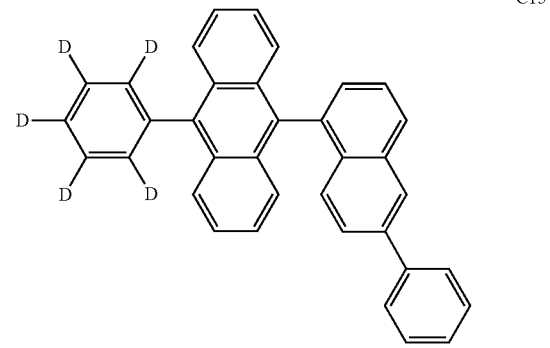
C16
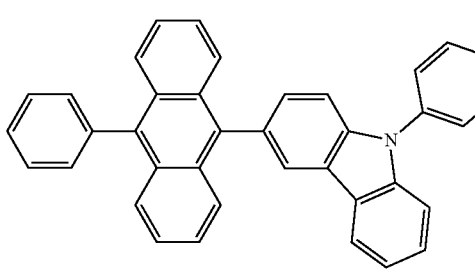

C17
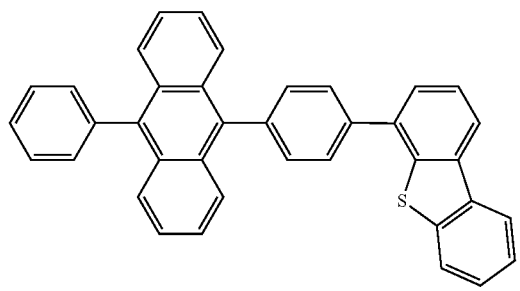
C18
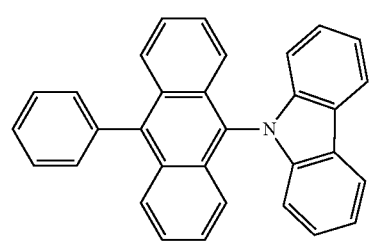
C19
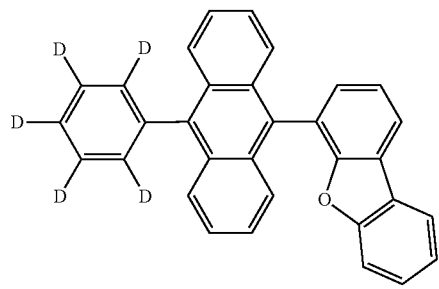
C20
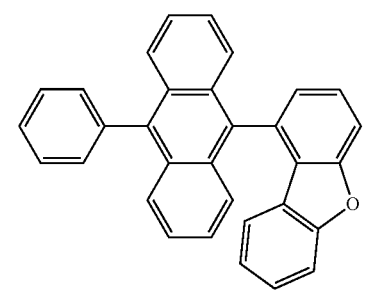
C21
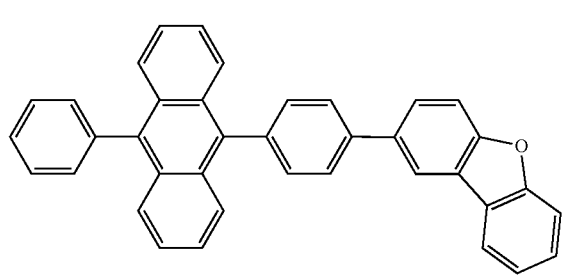
C22
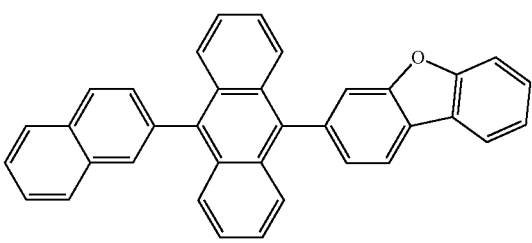
C23
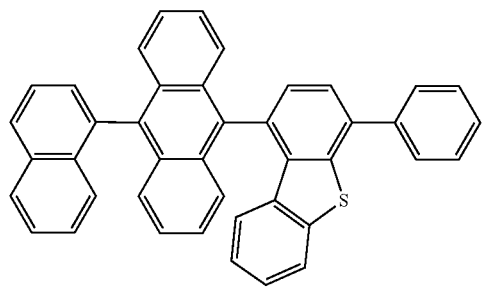
C24
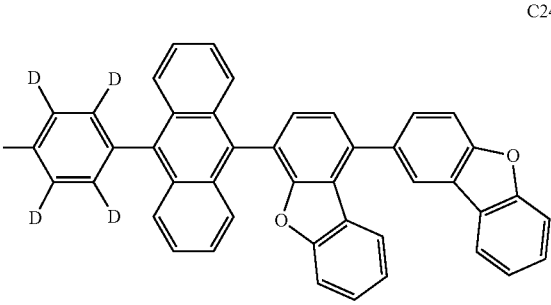
C25
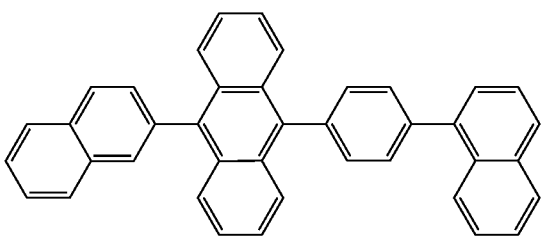
C26
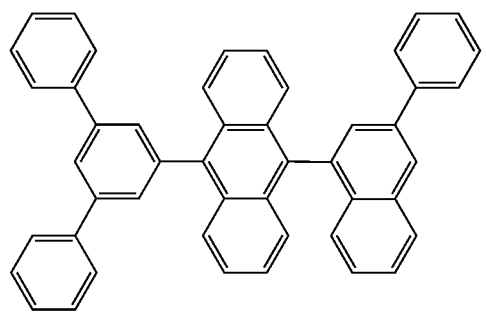

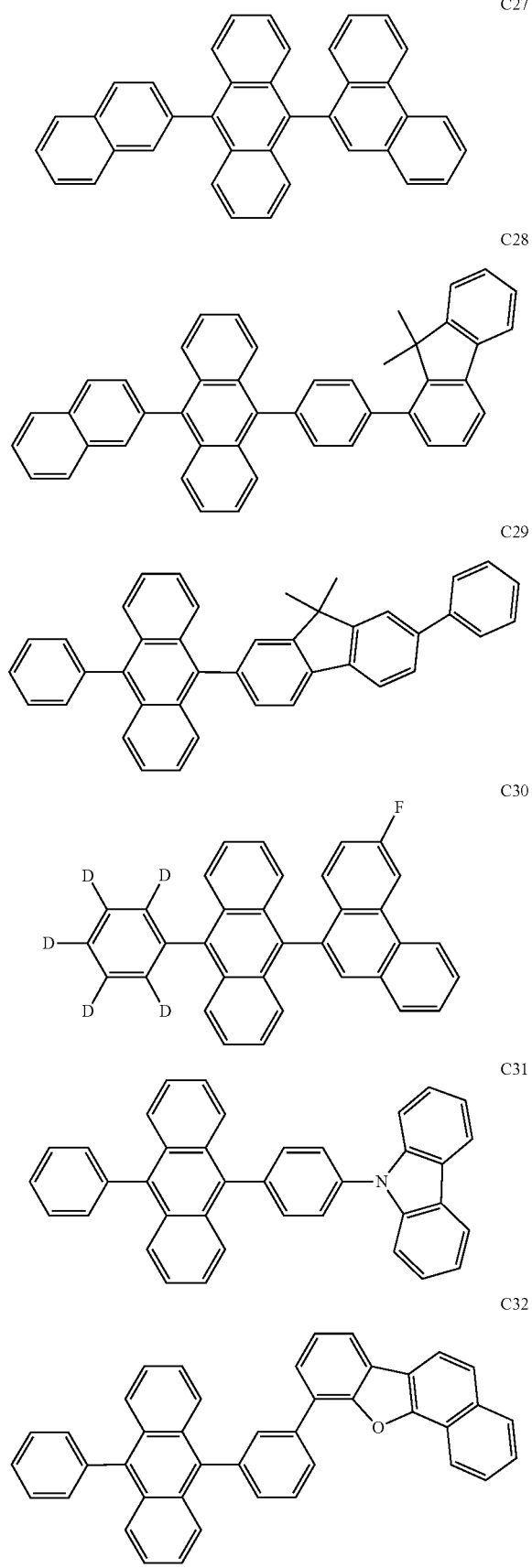
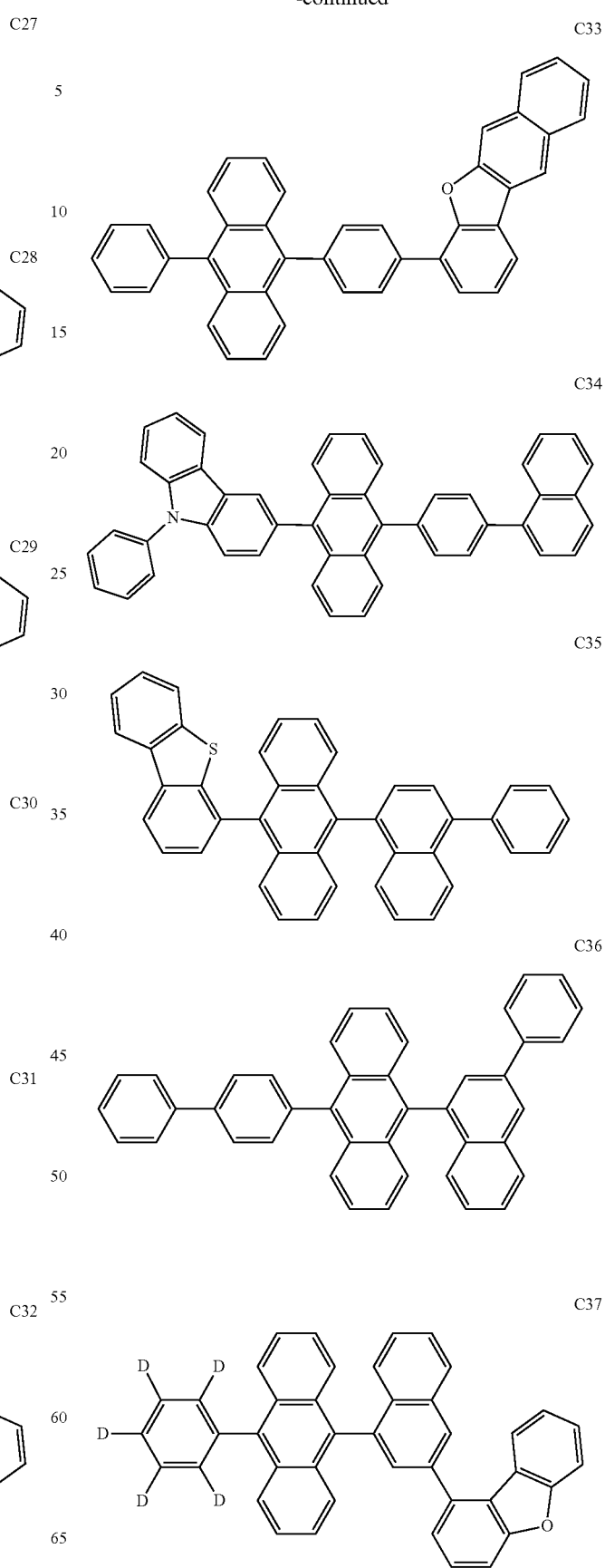

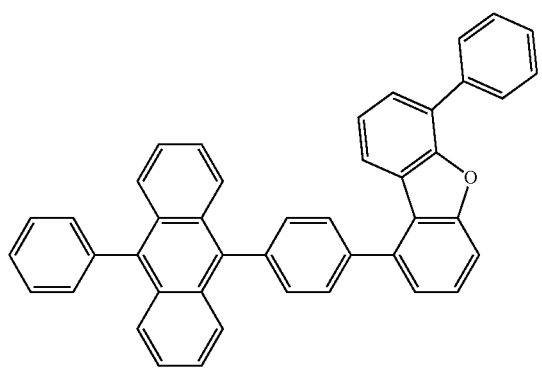
C39
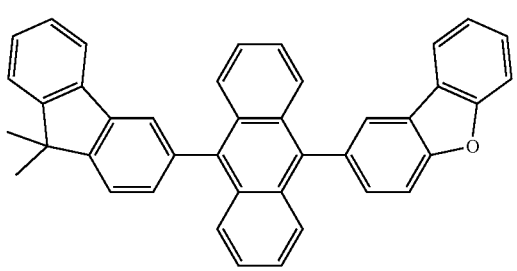
C42
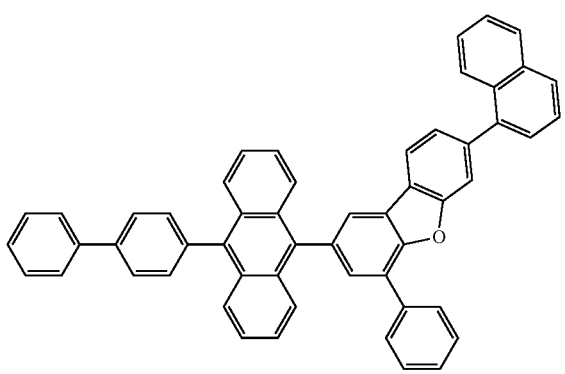
C43
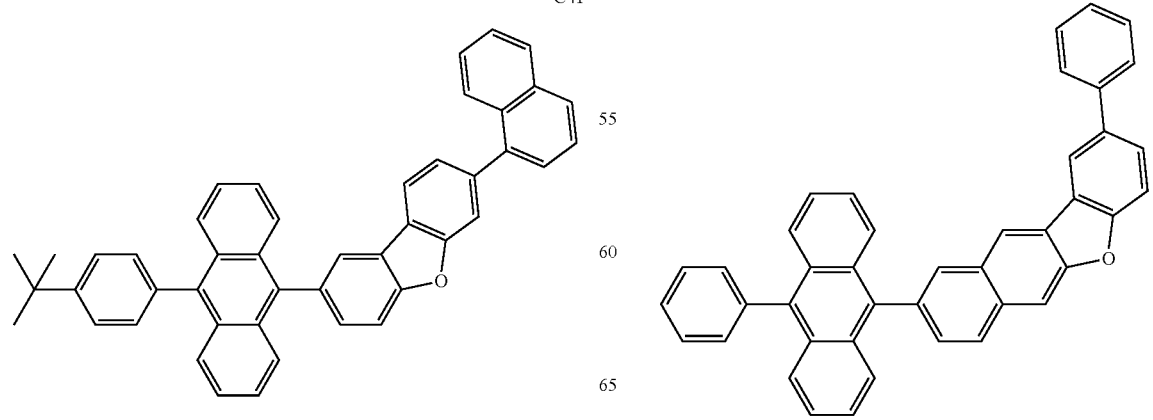

C46
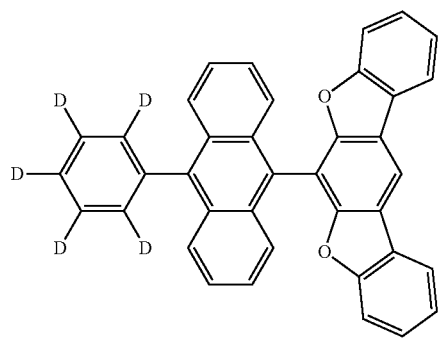
C47
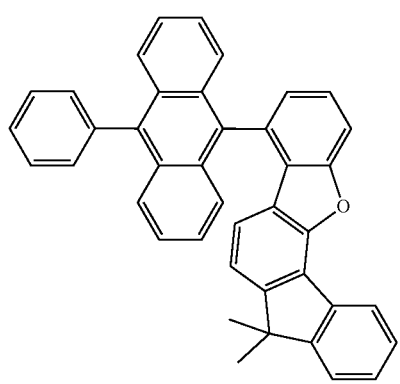
C48
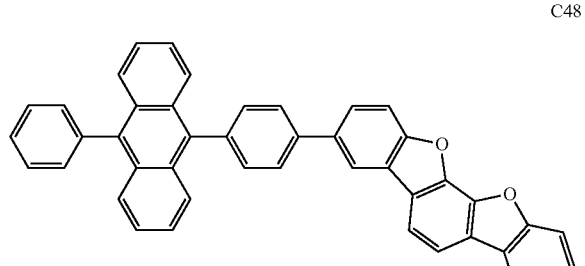
C49
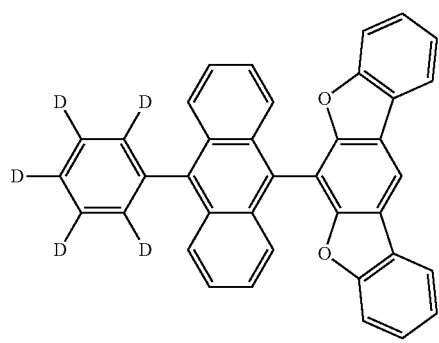
C50
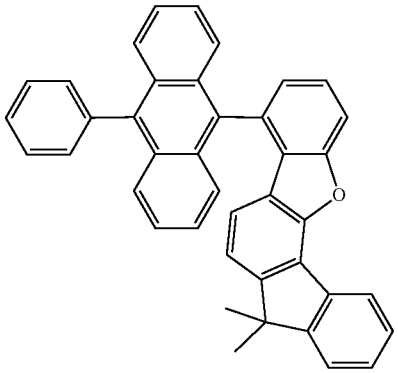
C51
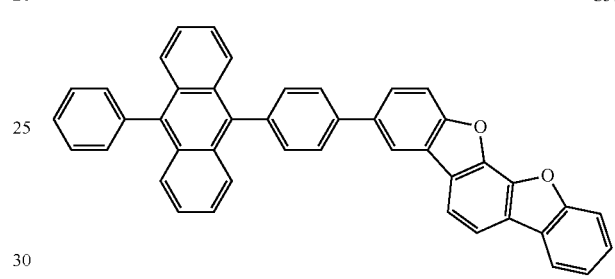
C52
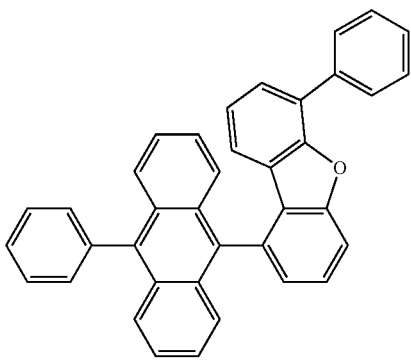
C53
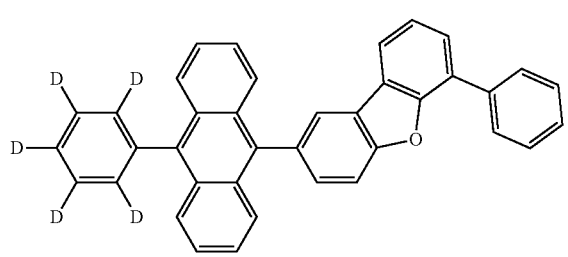

-continued

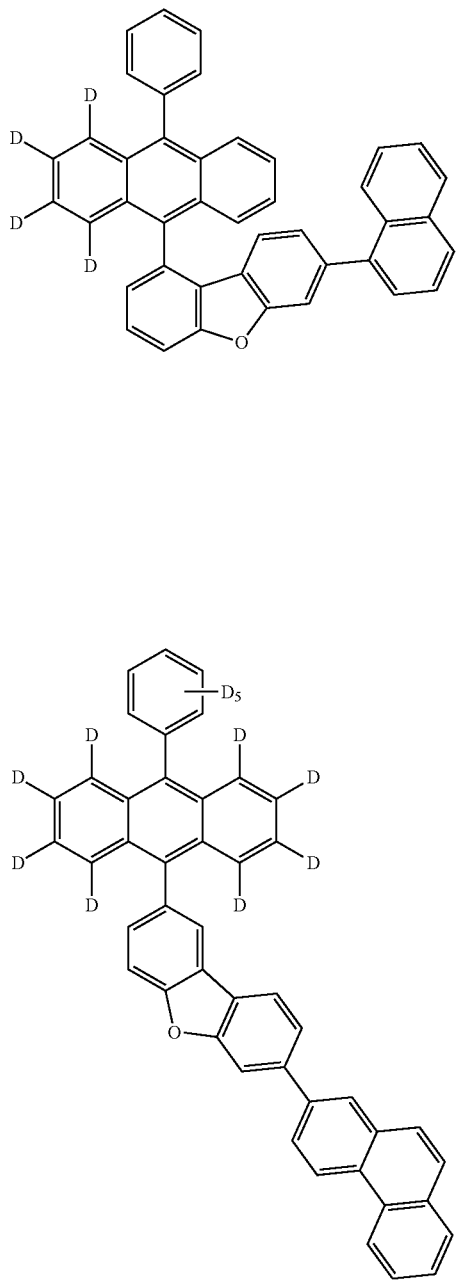

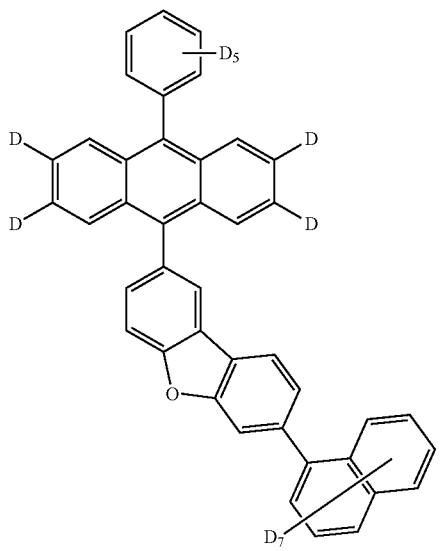

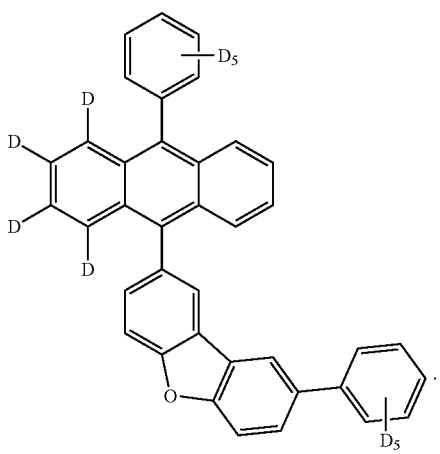

12. The organic electroluminescent device according to claim 8, wherein each of the layers is formed by a deposition or solution process.

13. The organic electroluminescent device according to claim 7, wherein the organic electroluminescent device is used in a display or lighting system selected from flat panel displays, flexible displays, monochromatic flat panel lighting systems, white flat panel lighting systems, flexible monochromatic lighting systems, and flexible white lighting systems.

* * * * *